United States Patent
Schwab et al.

(10) Patent No.: US 10,527,832 B2
(45) Date of Patent: Jan. 7, 2020

(54) IMAGING OPTICAL UNIT AND PROJECTION EXPOSURE APPARATUS INCLUDING SAME

(71) Applicant: Carl Zeiss SMT GmbH, Oberkochen (DE)

(72) Inventors: Markus Schwab, Aalen (DE); Hans-Juergen Rostalski, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/816,325

(22) Filed: Nov. 17, 2017

(65) Prior Publication Data
US 2018/0088303 A1    Mar. 29, 2018

Related U.S. Application Data

(63) Continuation of application No. PCT/EP2016/061516, filed on May 23, 2016.

(30) Foreign Application Priority Data

May 28, 2015  (DE) .................. 10 2015 209 827
Nov. 9, 2015   (DE) .................. 10 2015 221 985

(51) Int. Cl.
*G02B 5/10* (2006.01)
*G02B 17/06* (2006.01)
(Continued)

(52) U.S. Cl.
CPC ......... *G02B 17/0663* (2013.01); *G02B 5/005* (2013.01); *G02B 13/143* (2013.01); *G03F 7/7025* (2013.01); *G03F 7/70233* (2013.01)

(58) Field of Classification Search
CPC .. G02B 17/0663; G02B 5/005; G02B 13/143; G03F 7/70233; G03F 7/7025
(Continued)

(56) References Cited

U.S. PATENT DOCUMENTS 4,964,706  A    10/1990  Cook
2010/0149509 A1  6/2010  Shiraishi
(Continued)

FOREIGN PATENT DOCUMENTS

DE    10 2012 212 753 A1    1/2014
DE    10 2015 209 827 A1    9/2015
(Continued)

OTHER PUBLICATIONS

German Examination Report, with translation thereof, for corresponding Appl No. 10 2015 209 827.3, dated Jan. 26, 2016.
(Continued)

*Primary Examiner* — William Choi
(74) *Attorney, Agent, or Firm* — Fish & Richardson P.C.

(57) ABSTRACT

An imaging optical unit for projection lithography has a plurality of mirrors for imaging an object field into an image field with imaging light guided along a path from the object field to the image field. The penultimate mirror in the path has no passage opening to pass the imaging light. The imaging optical unit has a stop to predefine an outer marginal contour of a pupil of the imaging optical unit. The stop is between the penultimate and last mirrors in the path. The imaging optical unit can have exactly one stop for predefining at least one section of the outer pupil marginal contour. An entrance pupil of the imaging optical unit can be upstream of the object field. The imaging optical unit can be well defined regarding its pupil and exhibit desirable properties for projection lithography.

20 Claims, 20 Drawing Sheets

(51) Int. Cl.
   *G02B 13/14*     (2006.01)
   *G02B 5/00*      (2006.01)
   *G03F 7/20*      (2006.01)
(58) Field of Classification Search
   USPC .................. 359/798, 850, 857–859, 861
   See application file for complete search history.

(56) References Cited

U.S. PATENT DOCUMENTS

| | | |
|---|---|---|
| 2011/0090559 A1 | 4/2011 | Rennon et al. |
| 2015/0293457 A1* | 10/2015 | Epple ................. G02B 17/0663 355/67 |

FOREIGN PATENT DOCUMENTS

| | | |
|---|---|---|
| JP | 2001-185480 A | 7/2006 |
| WO | WO 2006/069725 | 7/2006 |
| WO | WO 2009/010213 A1 | 1/2009 |
| WO | WO 2010/115500 A1 | 10/2010 |
| WO | WO 2012/034995 A2 | 3/2012 |

OTHER PUBLICATIONS

International Search Report of corresponding Appl No. PCT/EP2016/061516, dated Oct. 11, 2016.

German examination report, with translation thereof, for corresponding Appl No. DE 10 2015 221 985.2, dated Jul. 29, 2017.

* cited by examiner

IMAGING OPTICAL UNIT AND PROJECTION EXPOSURE APPARATUS INCLUDING SAME

CROSS-REFERENCE TO RELATED APPLICATIONS

The present application is a continuation of, and claims benefit under 35 U.S.C. 120 to, international application PCT/EP2016/061516, filed May 23, 2016, which claims benefit under 35 U.S.C. 119 of German Application Nos. 10 2015 209 827.3, filed May 28, 2015 and 10 2015 221 985.2, filed Nov. 9, 2015, the contents of which are incorporated herein by reference.

FIELD

The disclosure relates to an imaging optical unit for imaging an object field into an image field. Furthermore, the disclosure relates to an optical system including such an imaging optical unit, a projection exposure apparatus including such an optical system, a method for producing a micro- or nanostructured component using such a projection exposure apparatus, and a micro- or nanostructured component produced by the method.

BACKGROUND

Projection optical units of the type set forth at the outset are known from DE 10 2015 209 827 A1, from DE 10 2012 212 753 A1, from US 2010/0149509 A1 and from U.S. Pat. No. 4,964,706.

SUMMARY

The disclosure seeks to develop an imaging optical unit of the type mentioned in the introduction in such a way that an imaging optical unit that is well defined with regard to its pupil and is optimized for projection lithography results.

In one aspect, the disclosure provides an imaging optical unit for projection lithography. The imaging optical unit includes a plurality of mirrors for imaging an object field in an object plane into an image field in an image plane with imaging light guided along an imaging beam path between the object field and the image field. The plurality of mirrors includes a penultimate mirror in the beam path without a passage opening for passage of the imaging light. The imaging optical unit also includes a stop for predefining at least one section of an outer marginal contour of a pupil of the imaging optical unit. The stop is arranged spatially between the penultimate mirror in the beam path and a last mirror in the beam path.

In another aspect, the disclosure provides an imaging optical unit for projection lithography that includes a plurality of mirrors for imaging an object field in an object plane into an image field in an image plane with imaging light guided along an imaging beam path between the object field and the image field. The plurality of mirrors includes a penultimate mirror in the beam path without a passage opening for pas-sage of the imaging light. The imaging optical system includes a stop for predefining at least one section of an outer marginal contour of a pupil of the imaging optical unit. The stop is arranged spatially between the penultimate mirror in the beam path and a last mirror in the beam path. An entrance pupil of the imaging optical unit is arranged in the beam path of the imaging light upstream of the object field It has been recognized according to the disclosure that a structural space between the penultimate mirror in the beam path and the last mirror in the beam path, despite the fact that a plurality of imaging light partial beams penetrate through there, is suitable for arranging a pupil-defining stop. This makes use of the circumstance that one of the imaging light partial beams penetrating through in the structural space between the penultimate and last mirrors is generally significantly larger than the other imaging light partial beams with regard to its diameter, such that a marginal delimitation at any rate of an outer marginal contour section of the pupil of the imaging optical unit is possible there. The imaging optical unit can have exactly one object field and can have exactly one image field. The imaging optical unit can have an entrance pupil arranged in the beam path of illumination and imaging light upstream of the object field. The imaging optical unit can correspondingly have a negative front focal length or a negative input pupil position. In the case of such imaging optical units, the arrangement of a stop spatially between the last two mirrors in the beam path has been found to be particularly suitable. It is then possible to realize a well corrected imaging optical unit having a high image-side numerical aperture. The stop can have a bent profile. The imaging optical unit can have at least one GI mirror, that is to say a grazing incidence mirror having an angle of incidence that is greater than 45°. The angle of incidence on the GI mirror can be greater than 50°, can be greater than 55°, can be greater than 60°, can be greater than 65°, can be greater than 70°, can be greater than 75° and can be greater than 80°. The effect of the stop as an aperture stop can be brought about by the shading of the beam path between the penultimate mirror in the beam path and the last mirror in the beam path in the imaging optical unit. The imaging optical unit can have exactly one stop for predefining at least one section of an outer marginal contour of a pupil of the imaging optical unit. Alternatively, provision can be made of a plurality of such stops for predefining sections of the outer marginal contour of the pupil of the imaging optical unit that supplement one another in particular complementarily. In addition to the stop predefining the outer marginal contour of the pupil, provision can be made of an obscuration stop for predefining an inner marginal contour of an obscuration of the pupil.

The last mirror in the beam path can have a passage opening for passage of the imaging light. In such an imaging optical unit, the stop arrangement according to the disclosure is likewise manifested particularly well. The stop can then additionally serve as an obscuration stop, that is to say predefine an obscuration of the pupil. An obscuration effect of the stop can be brought about by the shading of the imaging light in the imaging beam path between an antepenultimate mirror in the beam path and the penultimate mirror in the beam path.

The stop can cover the outer marginal contour of the pupil in an azimuth range around a center of the pupil that is greater than 180°. Such an azimuthal covering has the consequence that, if at all, only a small pupil azimuth range not predefined by the stop remains. The azimuth range predefined by the stop can be 200°, 220°, 240° or even greater. In the extreme case, the azimuth range is 360°. In this case, the stop delimits the pupil marginal contour fully circumferentially.

The imaging optical unit can have exactly one stop for predefining the complete outer marginal contour of the pupil of the imaging optical unit. This leads to a compact construction. The exactly one stop can be embodied in a plane fashion, that is to say in a manner lying in exactly one plane.

The stop can be embodied in a plane fashion at least in sections. Such a stop has little structural complexity. The stop can be embodied in a plane fashion in its entirety. An arrangement plane of the stop, which is predefined by the plane stop profile at least in sections, can be tilted relative to the object plane and/or relative to the image plane.

A marginal contour of the stop can have a three-dimensional profile. This allows a particularly precise pupil pre-definition. The attention devoted to the stop in the design of the imaging optical unit then need not be all that great.

The stop can delimit the marginal contour of the pupil in more than one plane. Such a marginal contour delimitation increases the degrees of freedom in the stop design. The stop can have a bent and/or kinked profile and/or topography and thereby define for example two, three or even more delimitation planes.

A pupil azimuth range—possibly present—that is not predefined by the stop arranged spatially between the penultimate mirror in the beam path and the last mirror in the beam path can be corrected with the aid of further stops. Insofar as at least one further stop is provided, the latter can be arranged for example on the last mirror in the beam path or on the penultimate mirror in the beam path. It is also possible to arrange the at least one further stop at a different location, for example in the beam path upstream of the penultimate mirror, for example on another of the mirrors or in the region of other imaging light partial beams.

The features of the imaging optical unit in accordance with the two aspects can be combined with one another.

The advantages of an optical system including an imaging optical unit described above correspond to those which have already been explained above with reference to the imaging optical unit according to the disclosure.

The advantages of a projection exposure apparatus, of a production method and of a micro- or nanostructured component can correspond to those which have already been explained above with reference to the projection optical unit and the optical system and the projection exposure apparatus.

In particular, a semiconductor component, for example a memory chip, may be produced using the projection exposure apparatus.

BRIEF DESCRIPTION OF THE DRAWINGS

Exemplary embodiments of the disclosure are explained in greater detail below with reference to the drawings, in which.

DETAILED DESCRIPTION

Figure 1:
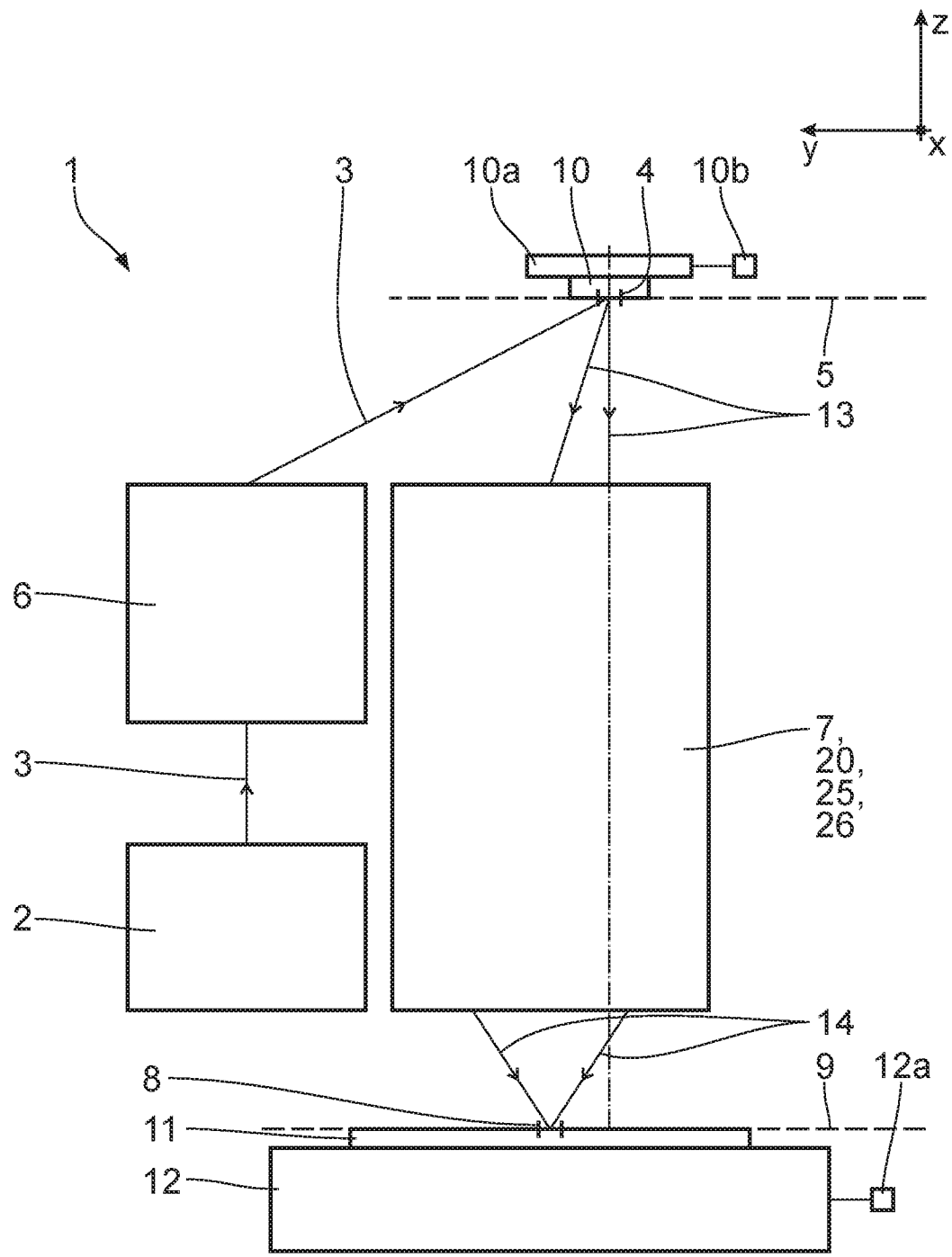
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. In particular, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale. The projection optical unit 7 has exactly one object field 4. The projection optical unit 7 has exactly one image field 8.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs toward the left, and the z-direction runs upward.

The object field 4 and the image field 8 are rectangular. Alternatively, it is also possible for the object field 4 and the image field 8 to have a bent or curved embodiment, that is to say, in particular, a partial ring shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

Figure 2:
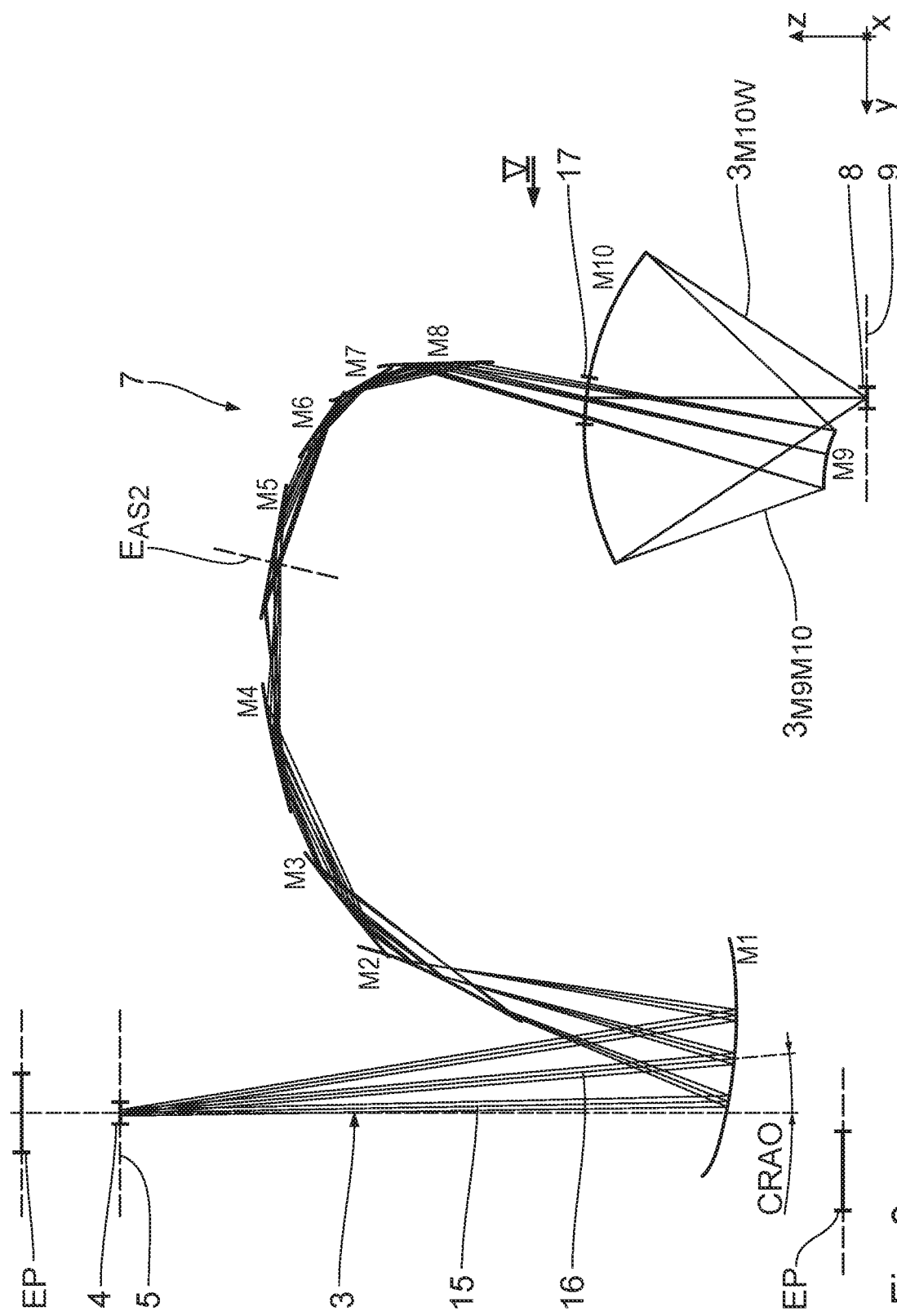
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of a plurality of selected field points is depicted.

One of the exemplary embodiments depicted in FIG. 2 et seq. can be used for the projection optical unit 7. The projection optical unit 7 is anamorphic, i.e. it has a different reduction scale in the x-direction (reduction scale in the xz-plane) than in the y-direction (reduction scale in the yz-plane). The projection optical unit 7 has a reduction scale of 4 in the x-direction. The projection optical unit 7 has a reduction scale of 8 in the y-direction. Other reduction scales for the reduction in the x-direction and/or for the reduction in the y-direction are also possible, for example 4×, 5× or even reduction scales that are greater than 8×. An embodiment of the projection optical unit 7 with the same reduction scales as these in, firstly, the xz-plane and, secondly, in the yz-plane is also possible.

The image plane 9 is arranged parallel to the object plane 5 in the case of the projection optical unit 7. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

FIG. 2 shows the optical design of a first embodiment of the projection optical unit 7. FIG. 2 depicts the beam path of in each case three individual rays 15 emanating from a plurality of object field points which are spaced apart from one another in the y-direction in FIG. 2. What is depicted are chief rays 16, i.e. individual rays 15 which pass through the center of a pupil in a pupil plane of the projection optical unit 7, and in each case an upper coma ray and a lower coma ray of these two object field points. Proceeding from the object field 4, the chief ray 16 of a central object field point includes an angle CRAO of 5.5° with a normal of the object plane 5.

The projection optical unit 7 has an image-side numerical aperture of 0.55.

An entrance pupil EP is arranged in the beam path of the imaging light 3 upstream of the object field 4. Possible positions of the entrance pupil EP above the object plane 5 with the use of a reticle 10 that transmits the imaging light 3 and below the object plane 5 with the use of a reflective reticle 10 are indicated in each case in FIG. 2. This results in a divergent course of the chief rays 16 between the object field 4 and the mirror M1.

The projection optical unit 7 according to FIG. 2 has a total of ten mirrors, which are numbered consecutively by M1 to M10 in the order of the beam path of the individual rays 15, proceeding from the object field 4. The projection optical unit 7 is a purely catoptric optical unit. The imaging optical unit 7 can also have a different number of mirrors, for example four mirrors, six mirrors or eight mirrors. An odd number of mirrors is also possible in the projection optical unit 7.

FIG. 2 illustrates the calculated reflection surfaces of the mirrors M1 to M10. What can be identified in the illustration according to FIG. 2 is that only a portion of these calculated reflection surfaces is used. Only this actually used region of the reflection surfaces is actually present in the real mirrors M1 to M10. These used reflection surfaces are carried in a known manner by mirror bodies (not shown).

In the case of the projection optical unit 7 according to FIG. 2, the mirrors M1, M9 and M10 are embodied as normal incidence mirrors, that is to say as mirrors on which the imaging light 3 is incident with an angle of incidence that is less than 45°. Overall, the projection optical unit 7 according to FIG. 2 thus has three normal incidence mirrors M1, M9 and M10. Below, these mirrors are also referred to as NI mirrors.

The mirrors M2 to M8 are mirrors for grazing incidence of the illumination light 3, that is to say mirrors onto which the illumination light 3 impinges with angles of incidence that are greater than 45°. A typical angle of incidence of the individual rays 15 of the imaging light 3 on the mirrors M2 to M8 for grazing incidence lies in the region of 80°. Overall, the projection optical unit 7 according to FIG. 2 has exactly seven mirrors M2 to M8 for grazing incidence. Below, these mirrors are also referred to as GI mirrors.

The mirrors M2 to M8 reflect the imaging light 3 such that the angles of reflection of the individual rays 15 on the respective mirrors M2 to M8 add up.

The mirrors M1 to M10 carry a coating optimizing the reflectivity of the mirrors M1 to M10 for the imaging light 3. The coating can be, in particular for the GI mirrors, a ruthenium coating, a molybdenum coating or a molybdenum coating with a topmost layer of ruthenium. Other coating materials can also be used. A coating including for example a layer of molybdenum or ruthenium can be used in the case of the grazing incidence mirrors M2 to M8. The highly reflecting layers, in particular of the mirrors M1, M9 and M10 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon.

Information concerning reflection at a GI mirror (grazing incidence mirror) can be found in WO 2012/126867 A. Further information concerning the reflectivity of NI mirrors (normal incidence mirrors) can be found in DE 101 55 711 A.

An overall reflectivity or system transmission of the projection optical unit 7, emerging as a product of the reflectivities of all mirrors M1 to M10 of the projection optical unit 7, is approximately R=8.49%.

The mirror M10, that is to say the last mirror upstream of the image field 8 in the imaging beam path, has a passage opening 17 for the passage of the imaging light 3 which is reflected from the antepenultimate mirror M8 toward the penultimate mirror M9. The mirror M10 is used in a reflective manner around the passage opening 17. None of the other mirrors M1 to M9 have passage openings and the mirrors are used in a reflective manner in a continuous region without gaps.

The mirrors M1 to M10 are embodied as free-form surfaces which cannot be described by a rotationally symmetric function. Other embodiments of the projection optical unit 7, in which at least one of the mirrors M1 to M10 is embodied as a rotationally symmetric asphere, are also possible. It is also possible for all mirrors M1 to M10 to be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} + C_1 x + C_2 y + C_3 x^2 + \quad (1)$$

$$C_4 xy + C_5 y^2 + C_6 x^3 + C_9 y^3 + C_{10} x^4 + \ldots + C_{12} x^2 y^2 + \ldots C_{14} y^4 +$$

$$C_{15} x^5 + \ldots + C_{20} y^5 + C_{21} x^6 + \ldots + C_{24} x^3 y^3 + \ldots + C_{27} y^6 + \ldots$$

The following applies to the parameters of this equation (1):

Z is the sag of the free-form surface at the point x, y, where $x^2+y^2=r^2$. Here, r is the distance from the reference axis of the free-form equation (x=0; y=0).

In the free-form surface equation (1), $C_1$, $C_2$, $C_3$ ... denote the coefficients of the free-form surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. Here, $k_x$ and $k_y$ each correspond to a conical constant of a corresponding asphere. Thus, equation (1) describes a biconical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007 0 058 269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

Figure 5:
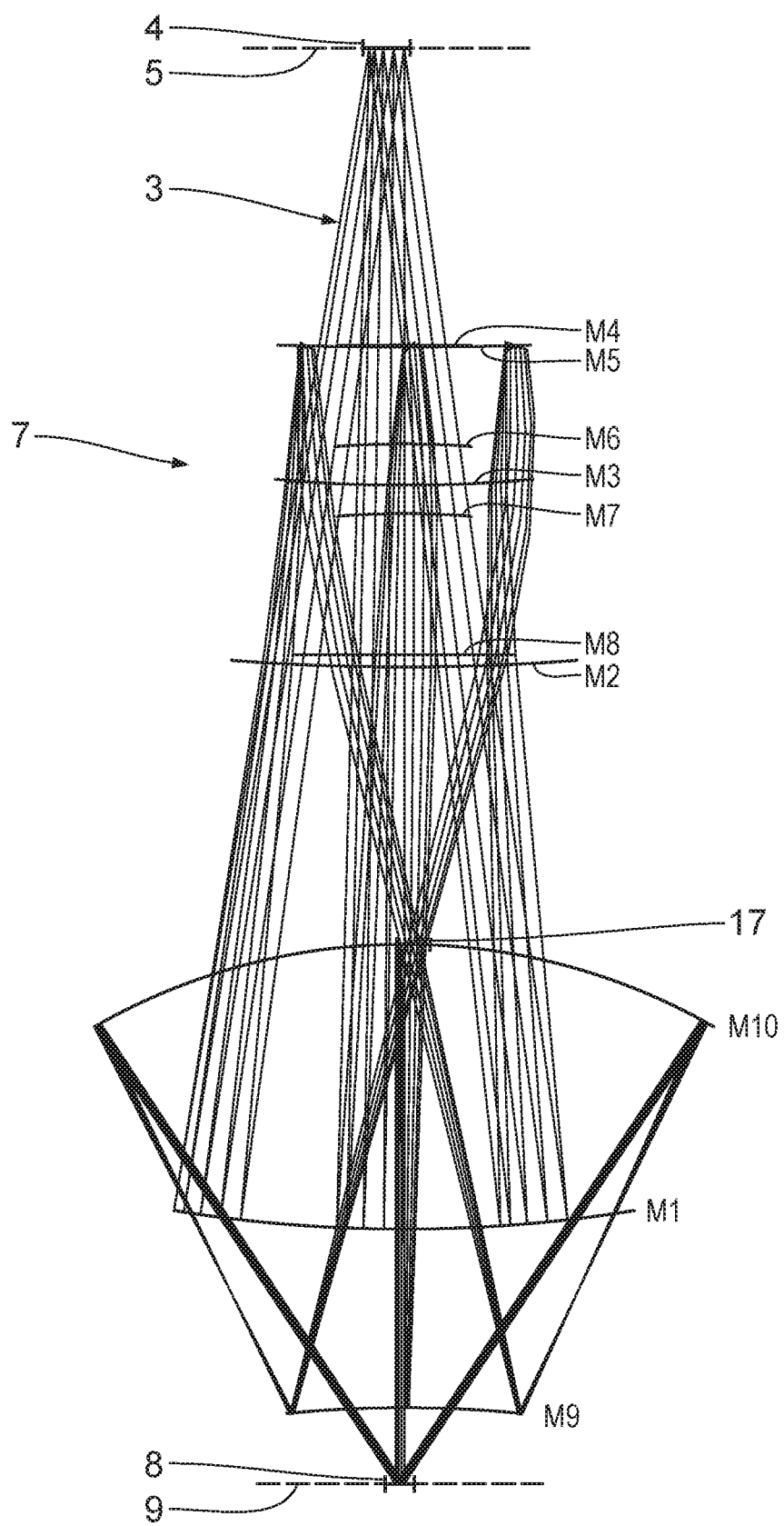
FIG. 5 shows a view of the imaging optical unit according to FIG. 2, as seen from viewing direction V in FIG. 2.
Figure 5A:
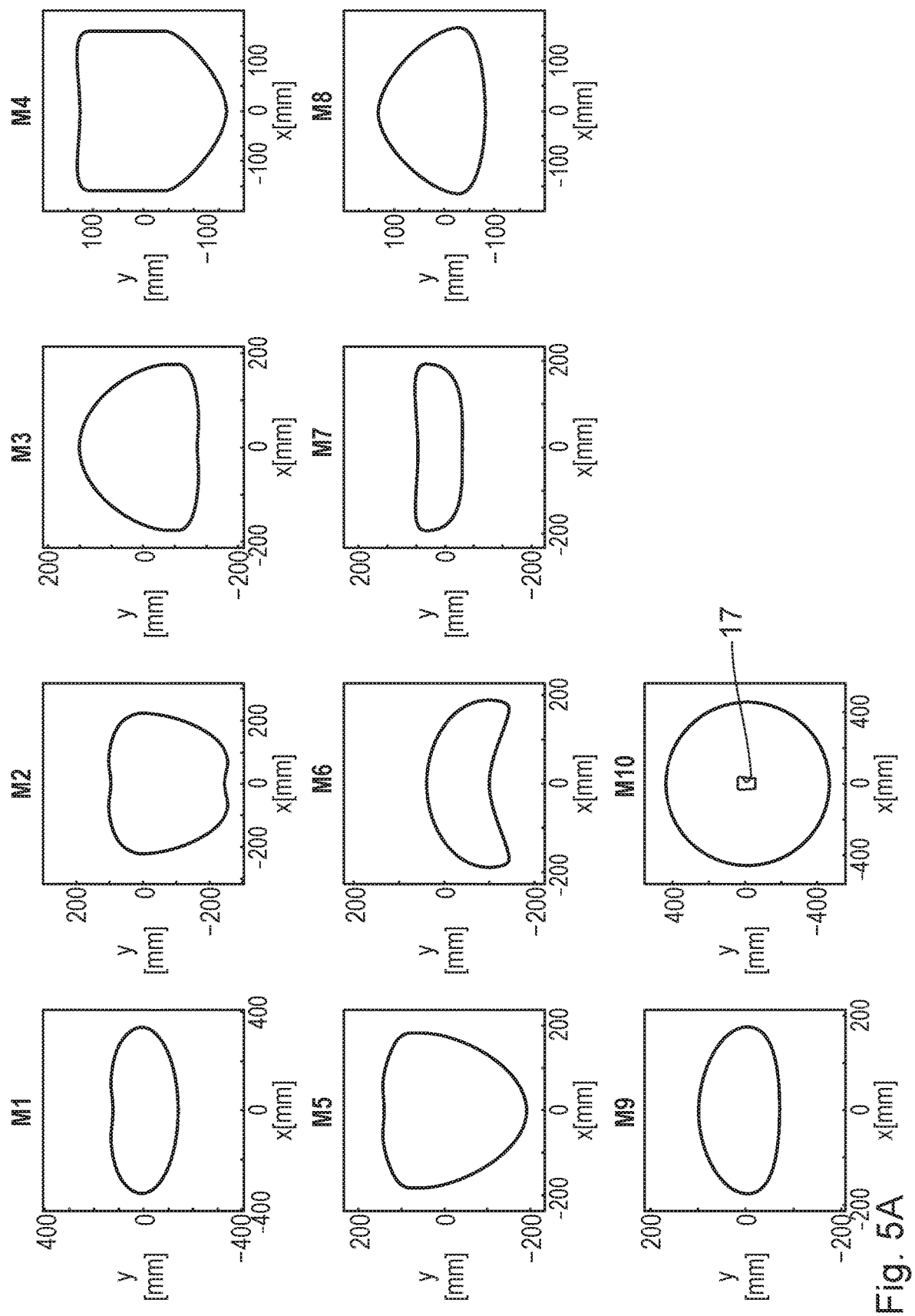
FIG. 5A shows in a plan view marginal contours of reflection surfaces impinged on in each case by the imaging light on the mirrors of the imaging optical unit according to FIG. 2.

FIG. 5A shows marginal contours of the reflection surfaces impinged on in each case by the imaging light 3 on the mirrors M1 to M10 of the projection optical unit 7, that is to say the so-called footprints of the mirrors M1 to M10. These marginal contours are in each case depicted in an x/y-diagram, which corresponds to the local x- and y-coordinates of the respective mirror M1 to M10. The illustrations are to scale in millimeters. Moreover, the form of the passage opening 17 is depicted in the illustration relating to the mirror M10.

The two tables below summarize the parameters "Maximum angle of incidence", "Extent of the reflection surface in the x-direction", "Extent of the reflection surface in the y-direction" and "Maximum mirror diameter" for the mirrors M1 to M10.

|  | M1 | M2 | M3 | M4 | M5 |
|---|---|---|---|---|---|
| Maximum angle of incidence [°] | 12.0 | 83.3 | 78.4 | 81.9 | 81.0 |
| Extent of the reflection surface in the x-direction [mm] | 684.0 | 419.4 | 360.4 | 310.9 | 369.2 |
| Extent of the reflection surface in the y-direction [mm] | 278.6 | 353.5 | 256.2 | 289.9 | 340.8 |
| Maximum mirror diameter [mm] | 684.3 | 437.3 | 364.4 | 359.4 | 398.8 |

|  | M6 | M7 | M8 | M9 | M10 |
|---|---|---|---|---|---|
| Maximum angle of incidence [°] | 81.7 | 80.8 | 78.8 | 21.2 | 8.1 |
| Extent of the reflection surface in the x-direction [mm] | 387.2 | 372.1 | 322.2 | 350.8 | 924.0 |
| Extent of the reflection surface in the y-direction [mm] | 195.6 | 107.2 | 208.7 | 170.7 | 897.6 |
| Maximum mirror diameter [mm] | 388.2 | 372.1 | 322.3 | 350.9 | 924.2 |

The mirror M10 that predefines the image-side numerical aperture has the largest maximum mirror diameter, with a diameter of 924.2 mm. None of the other mirrors M1 to M9 has a maximum diameter that is greater than 700 mm. Eight of the ten mirrors, namely the mirrors M2 to M9, have a maximum mirror diameter that is less than 450 mm. Seven of the ten mirrors, namely the mirrors M3 to M9, have a maximum mirror diameter that is less than 400 mm.

The optical design data of the reflection surfaces of the mirrors M1 to M10 of the projection optical unit 7 can be gathered from the following tables. These optical design data in each case proceed from the image plane 9, i.e. describe the respective projection optical unit in the reverse propagation direction of the imaging light 3 between the image plane 9 and the object plane 5.

The first of these tables provides an overview of the design data of the projection optical unit 7 and summarizes the numerical aperture NA, the calculated design wavelength for the imaging light, the dimensions of the image field in the x-direction and y-direction, image field curvature and stop locations. This curvature is defined as the inverse radius of curvature of the field.

The image field 8 has an x-extent of two-times 13 mm and a y-extent of 1 mm. The projection optical unit 7 is optimized for an operating wavelength of the illumination light 3 of 13.5 nm.

The second of these tables indicates vertex point radii (Radius_x=$R_x$, Radius_y=$R_y$) and refractive power values (Power_x, Power_y) for the optical surfaces of the optical components. Negative radii values denote curves that are concave toward the incident illumination light 3 at the intersection of the respective surface with the considered plane (xz, yz) that is spanned by a surface normal at the vertex point with the respective direction of curvature (x, y). The two radii Radius_x, Radius_y may explicitly have different signs.

The vertex points at each optical surface are defined as points of incidence of a guide ray which travels from an object field center to the image field 8 along a plane of symmetry x=0, i.e. the plane of the drawing of FIG. 2 (meridional plane).

The refractive powers Power_x ($P_x$), Power_y ($P_y$) at the vertex points are defined as:

$$P_x = -\frac{2\cos AOI}{R_x}$$

$$P_y = -\frac{2}{R_y \cos AOI}$$

Here, AOI denotes an angle of incidence of the guide ray with respect to the surface normal.

The third table indicates for the mirrors M1 to M10 in mm the conic constants $k_x$ and $k_y$, the vertex point radius $R_x$ (=Radius_x) and the free-form surface coefficients $C_n$. Coefficients $C_n$ that are not tabulated have the value 0 in each case.

The fourth table also indicates the magnitude along which the respective mirror, proceeding from a reference surface, was decentred (DCY) in the y-direction, and displaced (DCZ) and tilted (TLA, TLB, TLC) in the z-direction. This corresponds to a parallel shift and a tilting in the case of the freeform surface design method. Here, a displacement is carried out in the y-direction and in the z-direction in mm, and tilting is carried out about the x-axis, about the y-axis and about the z-axis. In this case, the angle of rotation is specified in degrees. Decentering is carried out first, followed by tilting. The reference surface during decentering is in each case the first surface of the specified optical design data. Decentring in the y-direction and in the z-direction in the object plane 5 is also specified for the object field 4. Besides the surfaces assigned to the individual mirrors, the image plane as first surface, the object plane as last surface and a plurality of stop surfaces (having the stop designation "AS") are also tabulated in the fourth table.

Figure 3:
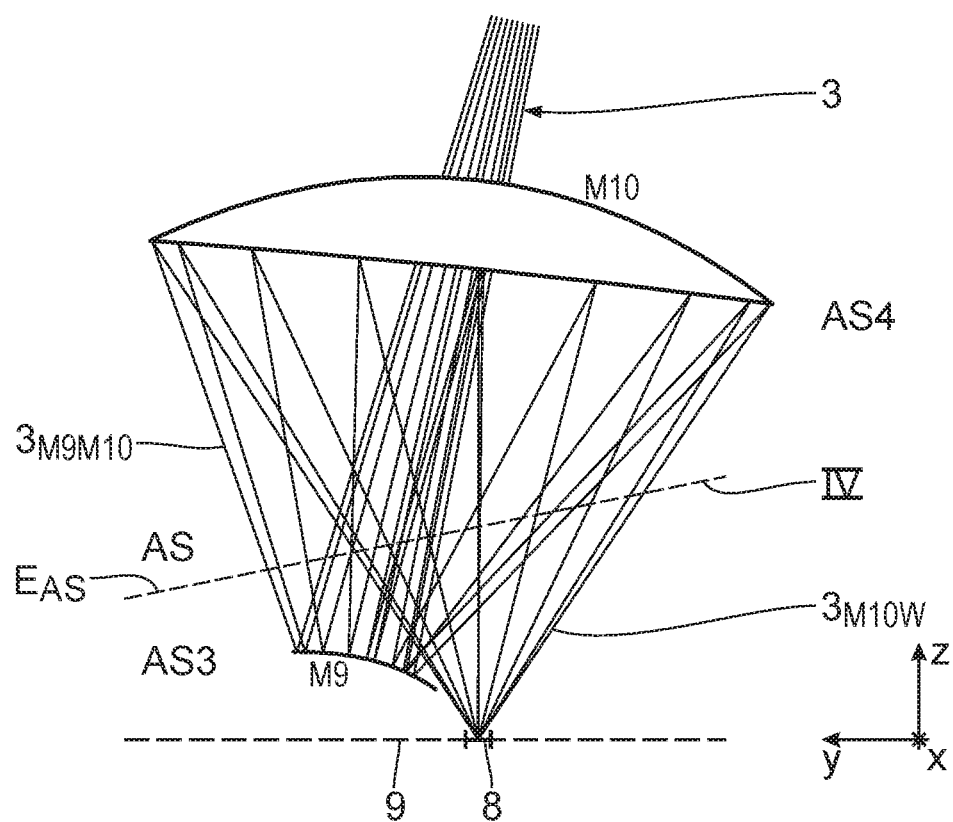
FIG. 3 shows in perspective view an excerpt from the imaging optical unit according to FIG. 2, with illustration of the imaging beam path with additional individual rays of the imaging light, in the region of a penultimate and a last mirror in the imaging beam path upstream of an image field.

A first stop AS2 is arranged in a plane $E_{AS2}$ in the imaging light beam path between the mirrors M4 and M5. A further stop AS (cf. FIG. 3) is arranged in the imaging light beam path between the mirrors M9 and M10 in a plane $E_{AS}$. Further steps AS3 and AS4 are arranged on the mirrors M9 and M10. Alternatively, the stops AS3 and AS4 can also be arranged adjacent to and at a distance from the mirrors.

The fifth table specifies the transmission data of the mirrors M10 to M1, namely the reflectivity thereof for the angle of incidence of an illumination light ray incident centrally on the respective mirror. The overall transmission is specified as a proportional factor remaining from an incident intensity after reflection at all mirrors in the projection optical unit.

The sixth table indicates a boundary of the stop AS4 (surface M10) as a polygon progression in local coordinates xyz. The stop is arranged at the location of the mirror M10. As described above, the stop is decentred and tilted. The respective stop type of the polygon progression indicated is also mentioned in the last column of table 6. "CLA" here denotes a stop boundary that is transparent inward, that is to say toward a stop center, and is blocking outward (type aperture stop). The stop type "OBS" indicates a stop boundary that is blocking inward, that is to say toward a stop center, and is transparent outward (type obscuration stop). An aperture stop boundary serves to define an outer delimitation of a pupil of the projection optical unit 7. An obscuration stop serves to define an obscured region situated in the interior of the pupil. The stops AS to AS4 serve jointly both for predefining the outer boundary of the system pupil and for predefining the inner boundary of the obscuration region of the system pupil. In the embodiment of the projection optical unit 7 according to FIGS. 2 to 5, all the stops AS, AS2, AS3 and AS4 are of the type aperture stop. The stop AS4 is additionally of the type obscuration stop. A different distribution of the types "aperture stop" and "obscuration stop" among the stops of the projection optical unit is also possible.

The seventh table correspondingly indicates the boundary of the stop AS3 (surface M9) as polygon progression data corresponding to table 6.

The eighth table correspondingly indicates the boundary of the stop AS2 in the imaging light beam path between the mirrors M4 and M5 as polygon progression data corresponding to table 6.

The ninth table correspondingly indicates the boundary of the stop AS in the imaging light beam path between the mirrors M9 and M10 as polygon progression data corresponding to table 6.

A boundary of a stop surface of the stops AS to AS4 (also cf. table 6 et seq. concerning FIG. 2) results from intersection points on the stop surface of all rays of the illumination light 3 which, on the image side, propagate at selected field points in the direction of the stop surface with a complete image-side telecentric aperture. To predetermine the edge of the stop surface of the stop AS, use is made of the intersection points on the stop surface of all rays of the illumination light 3 which, on the image side, propagate from the field centre point in the direction of the stop surface with a complete image-side telecentric aperture. In the case of the other stops AS2, AS3 and AS4, the intersection points result from the use of all rays of the illumination light 3 which, on the image side, propagate from all field points of the image field 8 in the direction of the stop surface with a complete image-side telecentric aperture. In principle, there may also be a different selection of the employed image-side field points when defining the stop. The "field centre point" and "overall field" selections, specified above, are the possible extreme situations in this case.

When the stop is embodied as an aperture stop, the boundary is an inner boundary. In the case of an embodiment as an obscuration stop, the boundary is an outer boundary.

The respective stop AS to AS4 can lie in a plane or else be embodied three-dimensionally. The extent of the stop 18 can be smaller in the scanning direction (y) than in the cross scanning direction (x).

The non-illuminated obscuration region in the system pupil can be round, elliptical, square or rectangular. Moreover, this surface in the system pupil which cannot be illuminated can be decentered in the x-direction and/or in the y-direction in relation to a center of the system pupil.

TABLE 1 for FIG. 2

| Exemplary embodiment | FIG. 2 |
|---|---|
| NA | 0.55 |
| Wavelength | 13.5 nm |
| Field dimension x | 26.0 mm |
| Field dimension y | 1.0 mm |
| Field curvature | −0.012345 1/mm |
| Stops | AS, AS2, AS3 (on M9), AS4 (on M10) |

TABLE 2 for FIG. 2

| Surface | Radius_x [mm] | Power_x [1/mm] | Radius_y [mm] | Power_y [mm] | Operating mode |
|---|---|---|---|---|---|
| M10 | −924.4981198 | 0.0021492 | −841.5674623 | 0.0023921 | REFL |
| M9 | 1845.8313982 | −0.0010835 | 356.4114777 | −0.0056115 | REFL |
| M8 | −807.7853011 | 0.0006289 | −16794.6817783 | 0.0004689 | REFL |
| M7 | −633.7019549 | 0.0007380 | 20332.8433550 | −0.0004206 | REFL |
| M6 | −1159.7877847 | 0.0003528 | −7078.0588424 | 0.0013813 | REFL |
| M5 | −7911.6202298 | 0.0000533 | −2197.1749958 | 0.0043148 | REFL |
| M4 | 6252.7176733 | −0.0000660 | −2753.7274849 | 0.0035212 | REFL |
| M3 | 1718.6984546 | −0.0002678 | −10060.7554809 | 0.0008638 | REFL |
| M2 | 1592.6268445 | −0.0002500 | 2592.5626309 | −0.0038746 | REFL |
| M1 | −2135.9876330 | 0.0009216 | −1377.1202039 | 0.0014756 | REFL |

TABLE 3a for FIG. 2

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −924.49811980 | 1845.83139800 | −807.78530110 |
| C7 | 5.32161644e−09 | −7.17957299e−07 | 3.61958396e−07 |
| C9 | 1.2051462e−08 | 1.48021766e−06 | 4.61852728e−08 |
| C10 | −4.28738318e−12 | 3.94779844e−10 | 1.36275822e−10 |
| C12 | −3.49709402e−11 | 2.67402017e−09 | 4.92199166e−11 |
| C14 | −9.81786584e−12 | 6.31481582e−09 | −4.23949539e−10 |
| C16 | −3.40219667e−15 | −2.74047503e−12 | 1.12548598e−12 |
| C18 | 1.60335869e−14 | 2.04228406e−14 | 3.71761249e−13 |
| C20 | 1.30399612e−14 | 3.2725238e−11 | −2.05971586e−12 |
| C21 | −1.15274335e−17 | 2.35879877e−15 | 1.09054091e−15 |
| C23 | −6.9260806e−17 | 1.00239611e−14 | 1.70911423e−15 |
| C25 | −7.13524377e−17 | 5.05529889e−14 | −3.62622238e−15 |
| C27 | −1.67322747e−17 | 1.78538542e−13 | −7.36849912e−15 |
| C29 | −7.92528578e−21 | −4.11347975e−18 | −2.59696939e−18 |
| C31 | 1.27834004e−20 | −5.83032641e−17 | 1.25679501e−17 |
| C33 | 3.27119661e−20 | 1.71591989e−16 | −1.04543394e−17 |
| C35 | 1.71377495e−20 | 1.22876874e−15 | −3.91086555e−17 |
| C36 | −1.89551894e−23 | −4.14843428e−22 | 5.26679107e−21 |
| C38 | −1.11996388e−22 | 1.06656248e−19 | 2.8502374e−20 |
| C40 | −1.96750203e−22 | 2.08419251e−19 | 6.3260457e−20 |
| C42 | −1.2392523e−22 | 8.95301505e−19 | 4.7233819e−21 |
| C44 | −2.47458966e−25 | 8.36809183e−18 | −2.27707911e−19 |
| C46 | −9.77909864e−27 | −1.02394711e−22 | 1.39450428e−23 |
| C48 | 5.19824336e−27 | −7.95041789e−23 | 1.68839235e−22 |
| C50 | 5.59498452e−26 | 8.75666056e−22 | 2.79254271e−22 |
| C52 | 6.43656264e−26 | 4.60087068e−21 | −9.11661464e−23 |
| C54 | 1.96031627e−26 | 4.50459082e−20 | 1.98458883e−22 |
| C55 | −1.9734083e−29 | 2.61667221e−26 | −4.54521391e−26 |
| C57 | −1.39192995e−28 | −1.48955085e−25 | 1.23387971e−24 |
| C59 | −3.49342237e−28 | 2.18616238e−24 | 4.57708029e−24 |
| C61 | −3.79015472e−28 | 8.50729665e−24 | 6.06052772e−24 |
| C63 | −1.77868817e−28 | 2.63725246e−23 | −9.61661588e−26 |
| C65 | −2.61320106e−29 | 1.37431086e−22 | 9.18355997e−24 |
| C67 | −1.75320584e−32 | 1.91491617e−28 | −2.00093096e−27 |
| C69 | −1.49695509e−32 | −5.27938029e−27 | 2.16982668e−27 |
| C71 | 6.84912486e−32 | −5.29216183e−27 | −7.30096104e−27 |
| C73 | 1.54586906e−31 | 4.04146338e−26 | −4.93769708e−27 |

TABLE 3a-continued for FIG. 2

| Coefficient | M10 | M9 | M8 |
|---|---|---|---|
| C75 | 1.15783975e−31 | 2.37812676e−25 | −4.16594376e−26 |
| C77 | 4.14587364e−32 | 1.20314674e−24 | −1.62235584e−25 |
| C78 | −5.34426777e−35 | 4.49836368e−31 | 6.13330316e−30 |
| C80 | −4.27488688e−34 | 1.29694668e−29 | −1.62333428e−29 |
| C82 | −1.25436413e−33 | 3.24280489e−29 | −1.68167617e−28 |
| C84 | −1.71502766e−33 | 3.00254831e−29 | −4.89454528e−28 |

TABLE 3a-continued for FIG. 2

| Coefficient | M10 | M9 | M8 |
|---|---|---|---|
| C86 | −1.25734127e−33 | 7.46446045e−28 | −6.5895393e−28 |
| C88 | −5.19929261e−34 | 5.84363659e−27 | −1.5416679e−27 |
| C90 | −9.42013117e−35 | 2.61240017e−26 | −3.38007496e−27 |
| C92 | 1.00872668e−38 | −4.95175891e−33 | 1.78435553e−32 |
| C94 | −1.45968234e−39 | 2.0913161e−33 | 1.10022934e−32 |
| C96 | 2.49294655e−38 | 9.54156933e−32 | 1.00044858e−30 |
| C98 | 1.25738947e−37 | −7.47916509e−33 | 1.98972461e−30 |
| C100 | 1.6844889e−37 | 7.35199153e−30 | −3.47483305e−30 |
| C102 | 7.66863005e−38 | 5.82871085e−29 | −1.47027148e−29 |
| C104 | −1.4887687e−38 | 2.15570834e−28 | −2.0886266e−29 |
| C105 | 3.84331333e−41 | −2.72151554e−36 | −1.09100622e−34 |
| C107 | 4.50330303e−40 | −6.8970507e−35 | 3.91399908e−34 |
| C109 | 1.60900752e−39 | −2.41557224e−34 | 4.01031765e−33 |
| C111 | 2.46751199e−39 | 1.07560857e−33 | 1.8289791e−32 |
| C113 | 1.94052198e−39 | 8.96263507e−33 | 2.87152163e−32 |
| C115 | 9.9606188e−40 | 4.77961552e−32 | −4.19223781e−33 |
| C117 | 4.55475999e−40 | 2.14647641e−31 | −4.42634085e−32 |
| C119 | 9.96424428e−41 | 6.08163641e−31 | −4.46533131e−32 |
| C121 | −6.67748909e−44 | 0 | 0 |
| C123 | −1.35652075e−43 | 0 | 0 |
| C125 | 1.98636308e−43 | 0 | 0 |
| C127 | 1.25607622e−42 | 0 | 0 |
| C129 | 2.10051386e−42 | 0 | 0 |
| C131 | 1.77289428e−42 | 0 | 0 |
| C133 | 7.94693346e−43 | 0 | 0 |
| C135 | 1.74862061e−43 | 0 | 0 |
| C136 | −1.77390976e−46 | 0 | 0 |
| C138 | −2.00142247e−45 | 0 | 0 |
| C140 | −8.6258998e−45 | 0 | 0 |
| C142 | −1.91465627e−44 | 0 | 0 |
| C144 | −2.50271596e−44 | 0 | 0 |
| C146 | −2.03958823e−44 | 0 | 0 |
| C148 | −1.04613962e−44 | 0 | 0 |
| C150 | −3.18867421e−45 | 0 | 0 |
| C152 | −4.17582475e−46 | 0 | 0 |

TABLE 3b for FIG. 2

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | −633.70195490 | −1159.78778500 | −7911.62023000 |
| C7 | −3.6838108e−08 | 8.9762673e−08 | 1.29208819e−08 |
| C9 | 1.66051547e−07 | 5.4606184e−08 | −4.52621083e−08 |
| C10 | 2.70786958e−11 | −4.84436976e−10 | −5.84676904e−10 |
| C12 | −4.05365907e−10 | 4.4034394e−11 | 3.29353371e−11 |
| C14 | 1.17570885e−09 | −8.49494866e−10 | 3.27657845e−11 |
| C16 | 5.32058235e−13 | −1.22366579e−12 | −4.06185258e−13 |
| C18 | −2.33907349e−12 | 3.31495258e−12 | −3.05655881e−13 |
| C20 | 1.03622586e−11 | 4.74017946e−12 | −9.90515078e−14 |
| C21 | 1.84951658e−17 | 4.70815441e−16 | 6.8177486e−16 |
| C23 | 1.97362743e−16 | −5.63918759e−15 | 1.78311332e−16 |
| C25 | −4.50645748e−14 | −2.04438614e−14 | 1.92769745e−15 |
| C27 | 1.22197136e−13 | −4.46320586e−14 | 1.11134948e−15 |
| C29 | −8.3397015e−19 | 3.12037967e−18 | 1.20925734e−18 |
| C31 | 5.73336291e−17 | 2.52930984e−17 | −2.68755339e−18 |
| C33 | −4.26965471e−16 | 2.57659349e−16 | −5.94759876e−18 |
| C35 | 1.12309508e−15 | 3.62043368e−16 | −4.78247891e−18 |
| C36 | −2.54002154e−21 | −2.33285817e−21 | 8.64176325e−21 |
| C38 | 6.58698589e−22 | 6.78093367e−21 | 2.69603122e−21 |
| C40 | 9.19834216e−19 | −6.09316184e−19 | 1.90190625e−20 |
| C42 | −5.20603364e−18 | −2.48560476e−18 | 2.06136053e−20 |
| C44 | 1.95177251e−17 | −3.71987432e−18 | 1.52178482e−20 |
| C46 | 5.11031274e−23 | −2.36475219e−24 | 1.40723013e−23 |
| C48 | −5.22351362e−22 | 1.08955249e−21 | −1.74886691e−23 |
| C50 | 1.29955621e−20 | 6.28062297e−21 | −1.31280422e−22 |
| C52 | −7.19352591e−20 | 2.83502526e−20 | −1.33189978e−22 |
| C54 | 3.01583882e−19 | 4.05968238e−20 | −5.11578136e−23 |
| C55 | −3.2378259e−26 | 5.04920803e−26 | −9.74226056e−26 |
| C57 | 2.56114803e−26 | −1.66126857e−24 | 1.25073538e−25 |
| C59 | −2.15568526e−23 | −1.21962666e−23 | 3.61644254e−25 |
| C61 | 7.54597503e−23 | −7.85294647e−23 | 6.17670028e−25 |
| C63 | −1.37768633e−21 | −2.60819335e−22 | 3.1972004e−25 |
| C65 | −9.91159698e−22 | −3.82043453e−22 | 5.14604952e−26 |
| C67 | 8.86143266e−29 | 1.38719494e−27 | −4.85096213e−29 |
| C69 | 2.95926995e−28 | 1.1409927e−26 | −1.52883817e−29 |
| C71 | −4.08946521e−25 | 1.70193798e−25 | −2.99192047e−28 |
| C73 | 1.1764e−24 | 5.79647838e−25 | 1.27326956e−27 |
| C75 | −1.82271068e−23 | 1.8185183e−24 | 2.14215183e−27 |
| C77 | −6.0476105e−23 | 2.47496013e−24 | −2.43586456e−28 |
| C78 | −1.46974123e−31 | −2.48880617e−30 | 2.2910216e−30 |
| C80 | −1.62035317e−29 | −3.63910799e−30 | −2.10355105e−30 |
| C82 | 2.64119709e−28 | −1.39124488e−28 | −3.56165247e−30 |
| C84 | −2.75435112e−27 | −9.92371827e−28 | −1.25073816e−29 |
| C86 | 6.06493358e−26 | −2.9562807e−27 | −1.02346615e−29 |
| C88 | −1.82794269e−25 | −7.99387324e−27 | 1.25693216e−30 |
| C90 | 8.10897778e−25 | −1.01333935e−26 | 6.64972771e−30 |
| C92 | −5.94852836e−33 | −2.20554773e−33 | 1.22259104e−33 |
| C94 | 7.23973112e−32 | 1.10525284e−31 | −1.24849687e−32 |
| C96 | 7.40539289e−30 | −4.613537e−32 | −3.29652704e−32 |
| C98 | 4.88216265e−30 | 4.80483016e−30 | −8.41705133e−32 |
| C100 | 9.65449531e−28 | 6.23756899e−30 | −1.57134898e−31 |
| C102 | −1.70876067e−27 | 2.1445453e−29 | −1.2032548e−31 |
| C104 | 2.67082934e−26 | 2.28654521e−29 | −3.36577402e−32 |
| C105 | 2.35094421e−36 | 2.08468354e−35 | −1.08251776e−35 |
| C107 | 3.37747137e−34 | −1.04397603e−34 | 3.142163e−35 |
| C109 | 7.70896596e−34 | 2.85146997e−34 | 8.01180965e−35 |
| C111 | 6.84579774e−32 | −8.80664689e−35 | 3.89769754e−34 |
| C113 | −9.31004972e−32 | −9.19882787e−33 | 7.80016296e−34 |
| C115 | 5.48180337e−30 | −1.39857273e−33 | 7.27970094e−34 |
| C117 | −9.40923091e−30 | −2.85191959e−32 | 3.44660803e−34 |
| C119 | 1.58250782e−28 | −2.04899764e−32 | 5.28320959e−35 |

TABLE 3c for FIG. 2

| Coefficient | M4 | M3 | M2 |
|---|---|---|---|
| KY | 0.00000000 | 0.00000000 | 0.00000000 |
| KX | 0.00000000 | 0.00000000 | 0.00000000 |
| RX | 6252.71767300 | 1718.69845500 | 1592.62684400 |
| C7 | 2.02039657e−07 | −7.72442186e−08 | −2.81200257e−07 |
| C9 | 6.26194854e−08 | −6.39011454e−08 | −4.33420894e−07 |
| C10 | −1.17096485e−10 | 5.38504965e−10 | 2.16914992e−10 |
| C12 | 1.65918593e−10 | 1.54474735e−10 | −2.43233271e−10 |
| C14 | 2.6047855e−11 | −5.67012949e−11 | 1.0908048e−09 |
| C16 | 1.53352973e−13 | −1.28128634e−12 | −1.3249687e−12 |
| C18 | 6.85280998e−14 | 3.29016521e−13 | 2.3245033e−12 |
| C20 | 1.33134745e−14 | −7.9135182e−14 | −2.74288101e−12 |
| C21 | 9.63392843e−16 | −2.23006179e−16 | −3.54173468e−16 |
| C23 | −2.56356327e−16 | 8.08610012e−16 | 5.15456653e−15 |
| C25 | −4.93143601e−16 | −1.64061139e−16 | −1.06774698e−14 |
| C27 | −3.50827102e−17 | −8.3638218e−18 | 5.96789915e−15 |
| C29 | −1.32470314e−18 | 2.06883208e−18 | 1.70541615e−18 |
| C31 | −1.08456401e−18 | −3.75046097e−18 | −2.42446489e−17 |
| C33 | −3.23480928e−19 | 1.52741866e−18 | 4.43191025e−17 |
| C35 | −3.72075346e−19 | 1.62584985e−18 | −1.05861269e−17 |
| C36 | −3.85707039e−21 | −2.85425871e−21 | 1.53834046e−21 |
| C38 | 7.16357253e−21 | 4.79674043e−21 | −1.1251108e−20 |
| C40 | −1.76766744e−21 | 6.62315222e−22 | 1.18315789e−19 |
| C42 | −5.70159933e−21 | −2.6546097e−21 | −1.77703731e−19 |
| C44 | −3.65158025e−21 | 1.5355861e−20 | 1.37862764e−20 |
| C46 | −2.99726604e−23 | −7.26058549e−23 | −2.55922076e−23 |
| C48 | −4.17503344e−23 | −9.21476496e−23 | 1.00193833e−22 |
| C50 | −4.7884568e−23 | −2.35567601e−22 | −5.31735424e−22 |
| C52 | −6.91516977e−24 | −1.35526865e−22 | 6.79507546e−22 |
| C54 | 1.98546253e−23 | 9.61975988e−23 | 4.01660209e−23 |
| C55 | −1.94031018e−26 | 1.56888015e−25 | −1.38213528e−26 |
| C57 | −3.42382432e−25 | 2.2750218e−25 | 1.79376182e−25 |
| C59 | −2.2756817e−25 | −1.23549695e−25 | −5.94897934e−25 |
| C61 | 2.01539859e−25 | 2.29974662e−25 | 2.27901415e−24 |
| C63 | 4.95631548e−25 | 8.59833428e−25 | −2.22922414e−24 |
| C65 | 1.12176727e−25 | 1.26876311e−24 | −7.70058057e−25 |
| C67 | 9.06942404e−28 | 9.3079309e−28 | 3.74223228e−28 |
| C69 | 1.9957938e−27 | 4.99157193e−27 | −9.62902214e−28 |
| C71 | 3.12476201e−27 | 1.58761398e−26 | 2.15189986e−27 |
| C73 | 4.54981924e−27 | 1.53821757e−26 | −8.59545995e−27 |
| C75 | 6.59335485e−28 | 3.62238546e−27 | 5.36715829e−27 |
| C77 | −1.58015986e−27 | −1.19949042e−27 | 5.14863315e−27 |
| C78 | 4.37655985e−30 | −2.15256015e−30 | −6.68041182e−32 |
| C80 | 8.62343063e−30 | −8.27474872e−30 | −2.88698633e−30 |
| C82 | 1.3965552e−29 | −1.85964202e−29 | 2.97808799e−30 |
| C84 | 1.2610299e−29 | −5.63075807e−29 | −9.25513518e−30 |
| C86 | −4.82567841e−30 | −7.58802797e−30 | 2.1567675e−29 |
| C88 | −1.35566233e−29 | −6.2816052e−29 | −8.2378632e−30 |
| C90 | 8.35698293e−31 | −2.48292667e−29 | −1.8363031e−29 |
| C92 | −6.20912191e−33 | −1.53848466e−33 | −2.72722676e−33 |
| C94 | −3.03339233e−32 | −5.56751434e−32 | 9.35668771e−33 |
| C96 | −4.15846221e−32 | −2.81174802e−31 | 1.01318148e−32 |
| C98 | −1.20240425e−31 | −5.69729421e−31 | 4.31201041e−32 |
| C100 | −1.23999978e−31 | −3.40400557e−31 | −2.58821352e−32 |
| C102 | 1.77507014e−33 | −9.97858945e−32 | 6.91936623e−33 |
| C104 | 3.83557979e−32 | 1.09580074e−31 | 3.45333625e−32 |
| C105 | −1.52261212e−35 | 5.38313447e−37 | 2.4018539e−36 |
| C107 | −7.96360046e−35 | 8.5583118e−35 | 1.94949839e−35 |
| C109 | −2.50162343e−34 | 3.84351739e−34 | −2.7269109e−35 |
| C111 | −2.81541874e−34 | 1.85492006e−33 | −5.57867255e−35 |
| C113 | −6.28531061e−34 | 2.60940268e−33 | −8.0628501e−35 |
| C115 | 2.25293161e−35 | 2.55655776e−33 | 6.48059264e−36 |
| C117 | 7.79107372e−35 | 1.01920129e−33 | −2.46632816e−36 |
| C119 | −1.12500845e−34 | 7.43677377e−34 | −2.70846382e−35 |

TABLE 3d for FIG. 2

| Coefficient | M1 |
|---|---|
| KY | 0.00000000 |
| KX | 0.00000000 |

TABLE 3d-continued for FIG. 2

| Coefficient | M1 |
|---|---|
| RX | −2135.98763300 |
| C7 | −3.62667214e−08 |
| C9 | −8.77001096e−09 |
| C10 | −7.9878408e−12 |
| C12 | 3.57622422e−11 |
| C14 | 5.67666306e−11 |
| C16 | −1.00670933e−14 |
| C18 | −6.43363507e−14 |
| C20 | 3.49263438e−14 |
| C21 | −1.83622059e−18 |
| C23 | 1.63146414e−17 |
| C25 | 2.33281554e−16 |
| C27 | −2.13403252e−16 |
| C29 | −7.17734463e−22 |
| C31 | −7.76916167e−20 |
| C33 | −2.45391831e−19 |
| C35 | 9.06895125e−19 |
| C36 | −2.87240432e−24 |
| C38 | −5.67479156e−24 |
| C40 | 2.53075334e−22 |
| C42 | 2.33441297e−22 |
| C44 | −4.90816027e−21 |
| C46 | −1.82993123e−26 |
| C48 | 1.40735408e−25 |
| C50 | −1.62994831e−25 |
| C52 | 4.12295522e−24 |
| C54 | 2.26175423e−23 |
| C55 | 6.84620783e−30 |
| C57 | −8.9211373e−29 |
| C59 | 3.99552919e−28 |
| C61 | 2.87701829e−26 |
| C63 | 7.90515964e−26 |
| C65 | 4.93963599e−26 |
| C67 | 8.37008672e−32 |
| C69 | −9.8548077e−31 |
| C71 | −7.50758997e−30 |
| C73 | −6.72582496e−30 |
| C75 | 2.5702957e−28 |
| C77 | −1.08487883e−27 |
| C78 | 4.88158898e−36 |
| C80 | 1.55182242e−33 |
| C82 | 1.52095525e−32 |
| C84 | −1.27781492e−31 |
| C86 | −1.81913568e−30 |
| C88 | −5.89459163e−30 |
| C90 | 2.69055495e−30 |
| C92 | −4.03243187e−38 |
| C94 | 3.64827588e−36 |
| C96 | 3.2629352e−35 |
| C98 | 1.58289449e−34 |
| C100 | −1.41502554e−34 |
| C102 | −7.52721979e−33 |
| C104 | 1.42550505e−32 |
| C105 | −9.85463233e−41 |
| C107 | −4.7133732e−39 |
| C109 | −9.62905307e−38 |
| C111 | −4.88592887e−38 |
| C113 | 5.89605443e−36 |
| C115 | 4.37586765e−35 |
| C117 | 1.2944388e−34 |
| C119 | −5.79847892e−35 |

TABLE 4a for FIG. 2

| Surface | DCX | DCY | DCZ |
|---|---|---|---|
| Image | 0.00000000 | 0.00000000 | 0.00000000 |
| M10 (AS4) | 0.00000000 | 0.00000000 | 805.12545493 |
| AS | 0.00000000 | 121.91685762 | 283.85220626 |
| M9 (AS3) | −0.00000000 | 161.70815863 | 113.71871405 |
| M8 | 0.00000000 | −95.26534725 | 1237.21684296 |

TABLE 4a-continued for FIG. 2

| Surface | DCX | DCY | DCZ |
|---|---|---|---|
| M7 | −0.00000000 | −33.77425023 | 1447.75579022 |
| M6 | 0.00000000 | 65.18321239 | 1551.64751609 |
| M5 | 0.00000000 | 416.29245364 | 1699.16961083 |
| AS2 | −0.00000000 | 446.29210651 | 1699.02529226 |
| M4 | −0.00000000 | 1004.20719186 | 1696.34134424 |
| M3 | −0.00000000 | 1452.13094016 | 1490.08513977 |
| M2 | 0.00000000 | 1660.63260708 | 1219.01552868 |
| M1 | −0.00000000 | 1898.51696847 | 380.25896967 |
| Object | −0.00000000 | 2052.66210418 | 2142.14593325 |

TABLE 4b for FIG. 2

| Surface | TLA[deg] | TLB[deg] | TLC[de2] |
|---|---|---|---|
| Image | −0.00000000 | 0.00000000 | −0.00000000 |
| M10 (AS4) | 6.58193819 | 0.00000000 | −0.00000000 |
| AS | −11.93243779 | 180.00000000 | 0.00000000 |
| M9 (AS3) | 193.02365372 | −0.00000000 | 0.00000000 |
| M8 | 88.30109261 | −0.00000000 | 0.00000000 |
| M7 | 60.05609350 | 0.00000000 | 0.00000000 |
| M6 | 34.59181790 | −0.00000000 | −0.00000000 |
| M5 | 11.25728686 | −0.00000000 | −0.00000000 |
| AS2 | 269.72437077 | 0.00000000 | 0.00000000 |
| M4 | −12.50018064 | 0.00000000 | −0.00000000 |
| M3 | −38.57896098 | 0.00000000 | 0.00000000 |
| M2 | −63.29951574 | −0.00000000 | 0.00000000 |
| M1 | 185.41707922 | 0.00000000 | −0.00000000 |
| Object | 0.00000000 | 0.00000000 | 0.00000000 |

TABLE 5 for FIG. 2

| Surface | Angle of incidence [deg] | Reflectivity |
|---|---|---|
| M10 | 6.54595976 | 0.66117442 |
| M9 | 0.00927824 | 0.66565898 |
| M8 | 75.28640231 | 0.80872358 |
| M7 | 76.47602867 | 0.82797480 |
| M6 | 78.19600462 | 0.85363243 |
| M5 | 77.82112299 | 0.84823720 |
| M4 | 78.09659958 | 0.85221174 |
| M3 | 76.69475350 | 0.83137235 |
| M2 | 78.51548223 | 0.85815147 |
| M1 | 10.19566395 | 0.65421760 |
| Overall transmis- | | 0.0849 |

TABLE 6

Stop polygon AS4 on M10

| X[mm] | Y[mm] | Z[mm] | Type |
|---|---|---|---|
| −461.17630000 | −10.30450000 | −123.68161700 | CLA |
| −461.14370000 | −10.80690000 | −123.67061100 | CLA |
| −461.11090000 | −11.30930000 | −123.65984400 | CLA |
| −458.94680000 | −34.79650000 | −123.19019500 | CLA |
| −455.54960000 | −58.06020000 | −122.77715600 | CLA |
| −450.94270000 | −81.03510000 | −122.42063900 | CLA |
| −445.15300000 | −103.65790000 | −122.11947100 | CLA |
| −438.21120000 | −125.86830000 | −121.87186800 | CLA |
| −430.15080000 | −147.60870000 | −121.67507300 | CLA |
| −421.00830000 | −168.82430000 | −121.52571100 | CLA |
| −410.82240000 | −189.46380000 | −121.41976700 | CLA |
| −399.63390000 | −209.47900000 | −121.35274200 | CLA |
| −387.48550000 | −228.82490000 | −121.31983600 | CLA |

TABLE 6-continued

Stop polygon AS4 on M10

| X[mm] | Y[mm] | Z[mm] | Type |
|---|---|---|---|
| −374.42100000 | −247.45960000 | −121.31578700 | CLA |
| −360.48530000 | −265.34480000 | −121.33532100 | CLA |
| −345.72420000 | −282.44490000 | −121.37301600 | CLA |
| −330.18380000 | −298.72750000 | −121.42343900 | CLA |
| −313.91070000 | −314.16310000 | −121.48136900 | CLA |
| −296.95130000 | −328.72480000 | −121.54158300 | CLA |
| −279.35240000 | −342.38840000 | −121.59932900 | CLA |
| −261.16010000 | −355.13180000 | −121.64979700 | CLA |
| −242.42050000 | −366.93550000 | −121.68877800 | CLA |
| −223.17950000 | −377.78180000 | −121.71231900 | CLA |
| −203.48240000 | −387.65510000 | −121.71685900 | CLA |
| −183.37420000 | −396.54150000 | −121.69922200 | CLA |
| −162.89950000 | −404.42860000 | −121.65654300 | CLA |
| −142.10260000 | −411.30570000 | −121.58649000 | CLA |
| −121.02740000 | −417.16350000 | −121.48711600 | CLA |
| −99.71750000 | −421.99390000 | −121.35681900 | CLA |
| −78.21660000 | −425.79020000 | −121.19454200 | CLA |
| −56.56780000 | −428.54670000 | −120.99947300 | CLA |
| −34.81460000 | −430.25900000 | −120.77135000 | CLA |
| −13.00000000 | −430.92370000 | −120.51021500 | CLA |
| 13.00000000 | −430.92370000 | −120.51021500 | CLA |
| 34.81460000 | −430.25900000 | −120.77135000 | CLA |
| 56.56780000 | −428.54670000 | −120.99947300 | CLA |
| 78.21660000 | −425.79020000 | −121.19454200 | CLA |
| 99.71750000 | −421.99390000 | −121.35681900 | CLA |
| 121.02740000 | −417.16350000 | −121.48711600 | CLA |
| 142.10260000 | −411.30570000 | −121.58649000 | CLA |
| 162.89950000 | −404.42860000 | −121.65654300 | CLA |
| 183.37420000 | −396.54150000 | −121.69922200 | CLA |
| 203.48240000 | −387.65510000 | −121.71685900 | CLA |
| 223.17950000 | −377.78180000 | −121.71231900 | CLA |
| 242.42050000 | −366.93550000 | −121.68877800 | CLA |
| 261.16010000 | −355.13180000 | −121.64979700 | CLA |
| 279.35240000 | −342.38840000 | −121.59932900 | CLA |
| 296.95130000 | −328.72480000 | −121.54158300 | CLA |
| 313.91070000 | −314.16310000 | −121.48136900 | CLA |
| 330.18380000 | −298.72750000 | −121.42343900 | CLA |
| 345.72420000 | −282.44490000 | −121.37301600 | CLA |
| 360.48530000 | −265.34480000 | −121.33532100 | CLA |
| 374.42100000 | −247.45960000 | −121.31578700 | CLA |
| 387.48550000 | −228.82490000 | −121.31983600 | CLA |
| 399.47900000 | −209.47900000 | −121.35274200 | CLA |
| 410.82240000 | −189.46380000 | −121.41976700 | CLA |
| 421.00830000 | −168.82430000 | −121.52571100 | CLA |
| 430.15080000 | −147.60870000 | −121.67507300 | CLA |
| 438.21120000 | −125.86830000 | −121.87186800 | CLA |
| 445.15300000 | −103.65790000 | −122.11947100 | CLA |
| 450.94270000 | −81.03510000 | −122.42063900 | CLA |
| 455.54960000 | −58.06020000 | −122.77715600 | CLA |
| 458.94680000 | −34.79650000 | −123.19019500 | CLA |
| 461.11090000 | −11.30930000 | −123.65984400 | CLA |
| 461.14370000 | −10.80690000 | −123.67061100 | CLA |
| 461.17630000 | −10.30450000 | −123.68161700 | CLA |
| 462.07200000 | 13.33840000 | −124.23127700 | CLA |
| 461.70020000 | 37.06640000 | −124.83493200 | CLA |
| 460.05040000 | 60.80860000 | −125.48977700 | CLA |
| 457.11670000 | 84.49360000 | −126.19215400 | CLA |
| 452.89790000 | 108.04900000 | −126.93756000 | CLA |
| 447.39740000 | 131.40220000 | −127.72066800 | CLA |
| 440.62340000 | 154.48080000 | −128.53554800 | CLA |
| 432.58870000 | 177.21270000 | −129.37563400 | CLA |
| 423.31070000 | 199.52670000 | −130.23393200 | CLA |
| 412.81130000 | 221.35250000 | −131.10306200 | CLA |
| 401.11660000 | 242.62130000 | −131.97536300 | CLA |
| 388.25720000 | 263.26580000 | −132.84316100 | CLA |
| 374.26750000 | 283.22060000 | −133.69864500 | CLA |
| 359.18570000 | 302.42230000 | −134.53401400 | CLA |
| 343.05410000 | 320.81000000 | −135.34191300 | CLA |
| 325.91810000 | 338.32500000 | −136.11492000 | CLA |
| 307.82680000 | 354.91130000 | −136.84610300 | CLA |
| 288.83230000 | 370.51600000 | −137.52897300 | CLA |
| 268.98990000 | 385.08880000 | −138.15736000 | CLA |
| 248.35740000 | 398.58260000 | −138.72547500 | CLA |
| 226.99570000 | 410.95380000 | −139.22831200 | CLA |
| 204.96780000 | 422.16200000 | −139.66114600 | CLA |
| 182.33920000 | 432.17040000 | −140.01989100 | CLA |

TABLE 6-continued

Stop polygon AS4 on M10

| X[mm] | Y[mm] | Z[mm] | Type |
|---|---|---|---|
| 159.17740000 | 440.94580000 | −140.30093200 | CLA |
| 135.55190000 | 448.45910000 | −140.50142200 | CLA |
| 111.53350000 | 454.68480000 | −140.61880600 | CLA |
| 87.19500000 | 459.60160000 | −140.65130300 | CLA |
| 85.03370000 | 459.95990000 | −140.64206700 | CLA |
| 82.87420000 | 460.27350000 | −140.61012400 | CLA |
| 60.44340000 | 463.51260000 | −140.63406900 | CLA |
| 58.27810000 | 463.78840000 | −140.64763800 | CLA |
| 56.11400000 | 464.01970000 | −140.63824200 | CLA |
| 31.35000000 | 466.15680000 | −140.63405600 | CLA |
| 29.18360000 | 466.30570000 | −140.64689700 | CLA |
| 27.01770000 | 466.41010000 | −140.63648800 | CLA |
| 2.16670000 | 467.12350000 | −140.63527200 | CLA |
| 0.00000000 | 467.14560000 | −140.64684300 | CLA |
| −2.16670000 | 467.12350000 | −140.63527200 | CLA |
| −27.01770000 | 466.41010000 | −140.63648800 | CLA |
| −29.18360000 | 466.30570000 | −140.64689700 | CLA |
| −31.35000000 | 466.15680000 | −140.63405600 | CLA |
| −56.11400000 | 464.01970000 | −140.63824200 | CLA |
| −58.27810000 | 463.78840000 | −140.64763800 | CLA |
| −60.44340000 | 463.51260000 | −140.63406900 | CLA |
| −82.87420000 | 460.27350000 | −140.61012400 | CLA |
| −85.03370000 | 459.95990000 | −140.64206700 | CLA |
| −87.19500000 | 459.60160000 | −140.65130300 | CLA |
| −111.53350000 | 454.68480000 | −140.61880600 | CLA |
| −135.55190000 | 448.45910000 | −140.50142200 | CLA |
| −159.17740000 | 440.94580000 | −140.30093200 | CLA |
| −182.33920000 | 432.17040000 | −140.01989100 | CLA |
| −204.96780000 | 422.16200000 | −139.66114600 | CLA |
| −226.99570000 | 410.95380000 | −139.22831200 | CLA |
| −248.35740000 | 398.58260000 | −138.72547500 | CLA |
| −268.98990000 | 385.08880000 | −138.15736000 | CLA |
| −288.83230000 | 370.51600000 | −137.52897300 | CLA |
| −307.82680000 | 354.91130000 | −136.84610300 | CLA |
| −325.91810000 | 338.32500000 | −136.11492000 | CLA |
| −343.05410000 | 320.81000000 | −135.34191300 | CLA |
| −359.18570000 | 302.42230000 | −134.53401400 | CLA |
| −374.26750000 | 283.22060000 | −133.69864500 | CLA |
| −388.25720000 | 263.26580000 | −132.84316100 | CLA |
| −401.11660000 | 242.62130000 | −131.97536300 | CLA |
| −412.81130000 | 221.35250000 | −131.10306200 | CLA |
| −423.31070000 | 199.52670000 | −130.23393200 | CLA |
| −432.58870000 | 177.21270000 | −129.37563400 | CLA |
| −440.62340000 | 154.48080000 | −128.53554800 | CLA |
| −447.39740000 | 131.40220000 | −127.72066800 | CLA |
| −452.89790000 | 108.04900000 | −126.93756000 | CLA |
| −457.11670000 | 84.49360000 | −126.19215400 | CLA |
| −460.05040000 | 60.80860000 | −125.48977700 | CLA |
| −461.70020000 | 37.06640000 | −124.83493200 | CLA |
| −462.07200000 | 13.33840000 | −124.23127700 | CLA |
| −80.22010000 | −4.03830000 | −3.49703600 | OBS |
| −79.85040000 | −8.24600000 | −3.49589700 | OBS |
| −79.26240000 | −12.42650000 | −3.49682100 | OBS |
| −78.45800000 | −16.56850000 | −3.49976000 | OBS |
| −77.43970000 | −20.66080000 | −3.50464600 | OBS |
| −76.21070000 | −24.69220000 | −3.51139700 | OBS |
| −74.77460000 | −28.65180000 | −3.51989700 | OBS |
| −73.13550000 | −32.52900000 | −3.53001100 | OBS |
| −71.29830000 | −36.31350000 | −3.54161400 | OBS |
| −69.26820000 | −39.99490000 | −3.55452900 | OBS |
| −67.05090000 | −43.56360000 | −3.56858700 | OBS |
| −64.65270000 | −47.01010000 | −3.58360900 | OBS |
| −62.08040000 | −50.32510000 | −3.59939800 | OBS |
| −59.34100000 | −53.49990000 | −3.61574600 | OBS |
| −56.44210000 | −56.52620000 | −3.63245400 | OBS |
| −53.39170000 | −59.39590000 | −3.64930800 | OBS |
| −50.19820000 | −62.10160000 | −3.66610900 | OBS |
| −46.87020000 | −64.63610000 | −3.68263800 | OBS |
| −43.41690000 | −66.99280000 | −3.69870200 | OBS |
| −39.84750000 | −69.16560000 | −3.71410300 | OBS |
| −36.17180000 | −71.14880000 | −3.72865900 | OBS |
| −32.39950000 | −72.93730000 | −3.74219000 | OBS |
| −28.54080000 | −74.52650000 | −3.75454100 | OBS |
| −24.60620000 | −75.91210000 | −3.76555400 | OBS |
| −20.60600000 | −77.09070000 | −3.77510700 | OBS |
| −16.55090000 | −78.05910000 | −3.78307400 | OBS |

TABLE 6-continued

Stop polygon AS4 on M10

| X[mm] | Y[mm] | Z[mm] | Type |
|---|---|---|---|
| −12.45190000 | −78.81500000 | −3.78938100 | OBS |
| −8.31970000 | −79.35630000 | −3.79393700 | OBS |
| −4.16540000 | −79.68160000 | −3.79668900 | OBS |
| 0.00000000 | −79.79010000 | −3.79760700 | OBS |
| 4.16540000 | −79.68160000 | −3.79668900 | OBS |
| 8.31970000 | −79.35630000 | −3.79393700 | OBS |
| 12.45190000 | −78.81500000 | −3.78938100 | OBS |
| 16.55090000 | −78.05910000 | −3.78307400 | OBS |
| 20.60600000 | −77.09070000 | −3.77510700 | OBS |
| 24.60620000 | −75.91210000 | −3.76555400 | OBS |
| 28.54080000 | −74.52650000 | −3.75454100 | OBS |
| 32.39950000 | −72.93730000 | −3.74219000 | OBS |
| 36.17180000 | −71.14880000 | −3.72865900 | OBS |
| 39.84750000 | −69.16560000 | −3.71410300 | OBS |
| 43.41690000 | −66.99280000 | −3.69870200 | OBS |
| 46.87020000 | −64.63610000 | −3.68263800 | OBS |
| 50.19820000 | −62.10160000 | −3.66610900 | OBS |
| 53.39170000 | −59.39590000 | −3.64930800 | OBS |
| 56.44210000 | −56.52620000 | −3.63245400 | OBS |
| 59.34100000 | −53.49990000 | −3.61574600 | OBS |
| 62.08040000 | −50.32510000 | −3.59939800 | OBS |
| 64.65270000 | −47.01010000 | −3.58360900 | OBS |
| 67.05090000 | −43.56360000 | −3.56858700 | OBS |
| 69.26820000 | −39.99490000 | −3.55452900 | OBS |
| 71.29830000 | −36.31350000 | −3.54161400 | OBS |
| 73.13550000 | −32.52900000 | −3.53001100 | OBS |
| 74.77460000 | −28.65180000 | −3.51989700 | OBS |
| 76.21070000 | −24.69220000 | −3.51139700 | OBS |
| 77.43970000 | −20.66080000 | −3.50464600 | OBS |
| 78.45800000 | −16.56850000 | −3.49976000 | OBS |
| 79.26240000 | −12.42650000 | −3.49682100 | OBS |
| 79.85040000 | −8.24600000 | −3.49589700 | OBS |
| 80.22010000 | −4.03830000 | −3.49703600 | OBS |
| 80.37020000 | 0.18500000 | −3.50026800 | OBS |
| 80.29980000 | 4.41230000 | −3.50557800 | OBS |
| 80.00890000 | 8.63210000 | −3.51295600 | OBS |
| 79.49790000 | 12.83260000 | −3.52234900 | OBS |
| 78.76800000 | 17.00240000 | −3.53370200 | OBS |
| 77.82080000 | 21.12970000 | −3.54691100 | OBS |
| 76.65870000 | 25.20320000 | −3.56187600 | OBS |
| 75.28450000 | 29.21160000 | −3.57845900 | OBS |
| 73.70190000 | 33.14350000 | −3.59652000 | OBS |
| 71.91490000 | 36.98800000 | −3.61588400 | OBS |
| 69.92820000 | 40.73430000 | −3.63637100 | OBS |
| 67.74710000 | 44.37190000 | −3.65778900 | OBS |
| 65.37750000 | 47.89050000 | −3.67993500 | OBS |
| 62.82570000 | 51.28020000 | −3.70259000 | OBS |
| 60.09880000 | 54.53140000 | −3.72554400 | OBS |
| 57.20400000 | 57.63490000 | −3.74855800 | OBS |
| 54.14950000 | 60.58180000 | −3.77141500 | OBS |
| 50.94340000 | 63.36380000 | −3.79387700 | OBS |
| 47.59480000 | 65.97300000 | −3.81573800 | OBS |
| 44.11290000 | 68.40190000 | −3.83677000 | OBS |
| 40.50730000 | 70.64350000 | −3.85675400 | OBS |
| 36.78810000 | 72.69160000 | −3.87551000 | OBS |
| 32.96560000 | 74.54010000 | −3.89282800 | OBS |
| 29.05060000 | 76.18390000 | −3.90855500 | OBS |
| 25.05390000 | 77.61810000 | −3.92250900 | OBS |
| 20.98680000 | 78.83880000 | −3.93457400 | OBS |
| 16.86070000 | 79.84230000 | −3.94461000 | OBS |
| 12.68720000 | 80.62590000 | −3.95253200 | OBS |
| 8.47800000 | 81.18720000 | −3.95824500 | OBS |
| 4.24500000 | 81.52460000 | −3.96169400 | OBS |
| 0.00000000 | 81.63720000 | −3.96285000 | OBS |
| −4.24500000 | 81.52460000 | −3.96169400 | OBS |
| −8.47800000 | 81.18720000 | −3.95824500 | OBS |
| −12.68720000 | 80.62590000 | −3.95253200 | OBS |
| −16.86070000 | 79.84230000 | −3.94461000 | OBS |
| −20.98680000 | 78.83880000 | −3.93457400 | OBS |
| −25.05390000 | 77.61810000 | −3.92250900 | OBS |
| −29.05060000 | 76.18390000 | −3.90855500 | OBS |
| −32.96560000 | 74.54010000 | −3.89282800 | OBS |
| −36.78810000 | 72.69160000 | −3.87551000 | OBS |
| −40.50730000 | 70.64350000 | −3.85675400 | OBS |
| −44.11290000 | 68.40190000 | −3.83677000 | OBS |
| −47.59480000 | 65.97300000 | −3.81573800 | OBS |
| −50.94340000 | 63.36380000 | −3.79387700 | OBS |
| −54.14950000 | 60.58180000 | −3.77141500 | OBS |
| −57.20400000 | 57.63490000 | −3.74855800 | OBS |
| −60.09880000 | 54.53140000 | −3.72554400 | OBS |
| −62.82570000 | 51.28020000 | −3.70259000 | OBS |
| −65.37750000 | 47.89050000 | −3.67993500 | OBS |
| −67.74710000 | 44.37190000 | −3.65778900 | OBS |
| −69.92820000 | 40.73430000 | −3.63637100 | OBS |
| −71.91490000 | 36.98800000 | −3.61588400 | OBS |
| −73.70190000 | 33.14350000 | −3.59652000 | OBS |
| −75.28450000 | 29.21160000 | −3.57845900 | OBS |
| −76.65870000 | 25.20320000 | −3.56187600 | OBS |
| −77.82080000 | 21.12970000 | −3.54691100 | OBS |
| −78.76800000 | 17.00240000 | −3.53370200 | OBS |
| −79.49790000 | 12.83260000 | −3.52234900 | OBS |
| −80.00890000 | 8.63210000 | −3.51295600 | OBS |
| −80.29980000 | 4.41230000 | −3.50557800 | OBS |
| −80.37020000 | 0.18500000 | −3.50026800 | OBS |

TABLE 7

Stop polygon AS3 on M9

| X[mm] | Y[mm] | Z[mm] | Type |
|---|---|---|---|
| 4.84286400 | −99.11799200 | 13.02505600 | CLA |
| 7.85158500 | −99.08636500 | 13.03128500 | CLA |
| 10.85934400 | −99.01479100 | 13.03396300 | CLA |
| 13.86529000 | −98.90330900 | 13.03309700 | CLA |
| 16.86857600 | −98.75198300 | 13.02870000 | CLA |
| 19.86835400 | −98.56090100 | 13.02079000 | CLA |
| 22.86377600 | −98.33017600 | 13.00939400 | CLA |
| 25.85399400 | −98.05994200 | 12.99454200 | CLA |
| 28.83816300 | −97.75035900 | 12.97627200 | CLA |
| 31.81543500 | −97.40160900 | 12.95462800 | CLA |
| 34.78496400 | −97.01390100 | 12.92965900 | CLA |
| 37.74559040 | −96.58746300 | 12.90142000 | CLA |
| 40.69741000 | −96.12254800 | 12.86997200 | CLA |
| 43.63863800 | −95.61943400 | 12.83538200 | CLA |
| 46.56874100 | −95.07841700 | 12.79772100 | CLA |
| 49.48687600 | −94.49982100 | 12.75706600 | CLA |
| 52.39220000 | −93.88398800 | 12.71349900 | CLA |
| 55.28386700 | −93.23128500 | 12.66710800 | CLA |
| 58.16103600 | −92.54210000 | 12.61798300 | CLA |
| 61.02286300 | −91.81684200 | 12.56622100 | CLA |
| 63.86850500 | −91.05594200 | 12.51192300 | CLA |
| 66.69712100 | −90.25985100 | 12.45519300 | CLA |
| 69.50786800 | −89.42904300 | 12.39613800 | CLA |
| 72.29990300 | −88.56401000 | 12.33487100 | CLA |
| 75.07238700 | −87.66526400 | 12.27150700 | CLA |
| 77.82447700 | −86.73333900 | 12.20616400 | CLA |
| 80.55532300 | −85.76878700 | 12.13896300 | CLA |
| 83.26411300 | −84.77217700 | 12.07002700 | CLA |
| 85.94997800 | −83.74410000 | 11.99948200 | CLA |
| 88.61208700 | −82.68516400 | 11.92745500 | CLA |
| 91.24962000 | −81.59599200 | 11.85407600 | CLA |
| 93.86168200 | −80.47722800 | 11.77947400 | CLA |
| 96.44749000 | −79.32953100 | 11.70378200 | CLA |
| 99.00618600 | −78.15357600 | 11.62713100 | CLA |
| 101.53693500 | −76.95005500 | 11.54965500 | CLA |
| 104.03889900 | −75.71967300 | 11.47148400 | CLA |
| 106.51124400 | −74.46315300 | 11.39275200 | CLA |
| 108.95313400 | −73.18123000 | 11.31359000 | CLA |
| 111.36373800 | −71.87465300 | 11.23412900 | CLA |
| 113.74222400 | −70.54418400 | 11.15449900 | CLA |
| 116.08776400 | −69.19059800 | 11.07482700 | CLA |
| 118.39952900 | −67.81468200 | 10.99523900 | CLA |
| 120.67669700 | −66.41723400 | 10.91585800 | CLA |
| 122.91844500 | −64.99906200 | 10.83680800 | CLA |
| 125.12395600 | −63.56098300 | 10.75820500 | CLA |
| 127.29241500 | −62.10382700 | 10.68016600 | CLA |
| 129.42301300 | −60.62842900 | 10.60280200 | CLA |
| 131.51494400 | −59.13563200 | 10.52622100 | CLA |

TABLE 7-continued

Stop polygon AS3 on M9

| X[mm] | Y[mm] | Z[mm] | Type |
|---|---|---|---|
| 133.56740800 | −57.62628900 | 10.45052900 | CLA |
| 135.57961200 | −56.10125500 | 10.37582600 | CLA |
| 137.55076900 | −54.56139500 | 10.30220800 | CLA |
| 139.48009800 | −53.00757600 | 10.22976600 | CLA |
| 141.36682700 | −51.44067000 | 10.15858700 | CLA |
| 143.21019400 | −49.86155100 | 10.08875200 | CLA |
| 145.00944500 | −48.27109700 | 10.02033800 | CLA |
| 146.76383500 | −46.67018700 | 9.95341600 | CLA |
| 148.47263400 | −45.05970100 | 9.88805200 | CLA |
| 150.13511900 | −43.44051700 | 9.82430600 | CLA |
| 151.75058600 | −41.81351600 | 9.76223200 | CLA |
| 153.31833900 | −40.17957300 | 9.70188000 | CLA |
| 154.83770000 | −38.53956200 | 9.64329100 | CLA |
| 156.30800600 | −36.89435500 | 9.58650400 | CLA |
| 157.72861100 | −35.24481700 | 9.53154900 | CLA |
| 159.09888600 | −33.59180900 | 9.47845200 | CLA |
| 160.41822100 | −31.93618600 | 9.42723300 | CLA |
| 161.68602700 | −30.27879900 | 9.37790600 | CLA |
| 162.90173400 | −28.62047800 | 9.33047800 | CLA |
| 164.06479400 | −26.96206400 | 9.28495300 | CLA |
| 165.17468100 | −25.30437400 | 9.24132800 | CLA |
| 166.23089600 | −23.64822000 | 9.19959500 | CLA |
| 167.23296000 | −21.99440100 | 9.15974000 | CLA |
| 168.18042200 | −20.34370400 | 9.12174400 | CLA |
| 169.07285800 | −18.69690500 | 9.08558600 | CLA |
| 169.90987000 | −17.05476300 | 9.05123700 | CLA |
| 170.69108900 | −15.41802500 | 9.01866400 | CLA |
| 171.41617600 | −13.78742200 | 8.98783100 | CLA |
| 172.08482000 | −12.16366800 | 8.95869900 | CLA |
| 172.69674200 | −10.54746200 | 8.93122200 | CLA |
| 173.25169300 | −8.93948200 | 8.90535300 | CLA |
| 173.74945900 | −7.34039300 | 8.88104200 | CLA |
| 174.18985600 | −5.75083700 | 8.85823500 | CLA |
| 174.57273400 | −4.17143900 | 8.83687700 | CLA |
| 174.89797700 | −2.60280200 | 8.81690800 | CLA |
| 175.16550300 | −1.04551200 | 8.79826900 | CLA |
| 175.37526600 | 0.49987000 | 8.78089700 | CLA |
| 175.52725300 | 2.03280900 | 8.76473000 | CLA |
| 175.62148800 | 3.55276000 | 8.74970400 | CLA |
| 175.65802900 | 5.05924900 | 8.73575300 | CLA |
| 175.63697200 | 6.55179200 | 8.72281100 | CLA |
| 175.55844600 | 8.02993500 | 8.71081500 | CLA |
| 175.42261700 | 9.49324500 | 8.69969700 | CLA |
| 175.38539800 | 9.80003000 | 8.69732700 | CLA |
| 175.34809200 | 10.10667300 | 8.69525000 | CLA |
| 175.15412300 | 11.55752300 | 8.68773500 | CLA |
| 174.90330200 | 12.99272200 | 8.68099300 | CLA |
| 174.59590200 | 14.41190500 | 8.67496000 | CLA |
| 174.23223100 | 15.81472800 | 8.66957100 | CLA |
| 173.81263200 | 17.20086900 | 8.66476500 | CLA |
| 173.33748100 | 18.57003000 | 8.66048000 | CLA |
| 172.80718800 | 19.92193100 | 8.65665800 | CLA |
| 172.22219700 | 21.25631700 | 8.65324100 | CLA |
| 171.58298300 | 22.57295200 | 8.65017400 | CLA |
| 170.89005200 | 23.87162200 | 8.64740500 | CLA |
| 170.14394200 | 25.15213000 | 8.64488200 | CLA |
| 169.34522100 | 26.41430400 | 8.64255700 | CLA |
| 168.49448300 | 27.65798500 | 8.64038500 | CLA |
| 167.59235100 | 28.88303600 | 8.63832200 | CLA |
| 166.63947600 | 30.08933900 | 8.63632700 | CLA |
| 165.63653300 | 31.27679100 | 8.63436300 | CLA |
| 164.58422100 | 32.44530500 | 8.63239300 | CLA |
| 163.48326100 | 33.59481300 | 8.63038500 | CLA |
| 162.33439800 | 34.72526000 | 8.62830800 | CLA |
| 161.13839400 | 35.83660600 | 8.62613300 | CLA |
| 159.89603300 | 36.92882800 | 8.62383600 | CLA |
| 158.60811400 | 38.00191100 | 8.62139200 | CLA |
| 157.27545200 | 39.05585700 | 8.61878100 | CLA |
| 155.89887800 | 40.09067900 | 8.61598400 | CLA |
| 154.47923500 | 41.10640100 | 8.61298400 | CLA |
| 153.01737700 | 42.10305600 | 8.60976600 | CLA |
| 151.51416800 | 43.08069100 | 8.60631800 | CLA |
| 149.97048100 | 44.03935900 | 8.60262700 | CLA |
| 148.38719700 | 44.97912400 | 8.59868500 | CLA |
| 146.76520100 | 45.90005600 | 8.59448400 | CLA |
| 145.10538200 | 46.80223400 | 8.59001600 | CLA |
| 143.40863300 | 47.68574500 | 8.58527800 | CLA |
| 141.67584700 | 48.55068000 | 8.58026500 | CLA |
| 139.90791900 | 49.39713900 | 8.57497400 | CLA |
| 138.10574000 | 50.22522400 | 8.56940300 | CLA |
| 136.27020000 | 51.03504600 | 8.56355300 | CLA |
| 134.40218600 | 51.82671600 | 8.55742300 | CLA |
| 132.50257900 | 52.60035400 | 8.55101300 | CLA |
| 130.57225300 | 53.35607900 | 8.54432600 | CLA |
| 128.61207800 | 54.09401600 | 8.53736300 | CLA |
| 126.62291300 | 54.81429200 | 8.53012900 | CLA |
| 124.60561000 | 55.51703600 | 8.52262400 | CLA |
| 122.56100900 | 56.20238000 | 8.51485500 | CLA |
| 120.48994200 | 56.87045700 | 8.50682400 | CLA |
| 118.39322700 | 57.52140200 | 8.49853600 | CLA |
| 116.27167300 | 58.15535000 | 8.48999600 | CLA |
| 114.12607300 | 58.77243800 | 8.48121000 | CLA |
| 111.95721000 | 59.37280200 | 8.47218200 | CLA |
| 109.76585200 | 59.95657900 | 8.46291800 | CLA |
| 107.55275100 | 60.52390700 | 8.45342400 | CLA |
| 105.31864900 | 61.07492200 | 8.44370700 | CLA |
| 103.06426900 | 61.60976000 | 8.43377100 | CLA |
| 100.79032200 | 62.12855600 | 8.42362400 | CLA |
| 98.49750200 | 62.63144500 | 8.41327300 | CLA |
| 96.18649100 | 63.11855800 | 8.40272300 | CLA |
| 93.85795200 | 63.59002800 | 8.39198300 | CLA |
| 91.51253500 | 64.04598500 | 8.38105800 | CLA |
| 89.15087400 | 64.48655600 | 8.36995600 | CLA |
| 86.77358900 | 64.91186800 | 8.35868400 | CLA |
| 84.38128500 | 65.32204300 | 8.34725000 | CLA |
| 81.97455100 | 65.71720500 | 8.33566100 | CLA |
| 78.45385800 | 66.27039900 | 8.31981800 | CLA |
| 76.01539200 | 66.63736900 | 8.30974800 | CLA |
| 73.56432400 | 66.98967000 | 8.29955700 | CLA |
| 71.10119300 | 67.32741100 | 8.28925400 | CLA |
| 67.51185900 | 67.79723300 | 8.27551900 | CLA |
| 65.02213500 | 68.10760200 | 8.26679900 | CLA |
| 62.52204800 | 68.40372000 | 8.25799800 | CLA |
| 60.01208900 | 68.68568400 | 8.24912300 | CLA |
| 57.49274100 | 68.95358600 | 8.24018000 | CLA |
| 56.36541400 | 69.07342900 | 8.23728900 | CLA |
| 53.83371600 | 69.32874400 | 8.23006100 | CLA |
| 51.29372900 | 69.57017000 | 8.22278900 | CLA |
| 48.74590700 | 69.79778900 | 8.21547800 | CLA |
| 46.19069200 | 70.01168000 | 8.20813500 | CLA |
| 45.05275500 | 70.10458800 | 8.20539400 | CLA |
| 42.48779600 | 70.30617100 | 8.19979100 | CLA |
| 39.91648700 | 70.49416600 | 8.19417400 | CLA |
| 37.33924700 | 70.66863900 | 8.18855000 | CLA |
| 34.75648600 | 70.82965300 | 8.18292200 | CLA |
| 31.02012900 | 71.04435900 | 8.17624900 | CLA |
| 28.42562400 | 71.17993400 | 8.17239700 | CLA |
| 25.82698800 | 71.30220600 | 8.16856000 | CLA |
| 23.22460800 | 71.41121700 | 8.16474300 | CLA |
| 20.61886600 | 71.50700800 | 8.16094900 | CLA |
| 19.46491600 | 71.54680200 | 8.15967700 | CLA |
| 16.85499600 | 71.63071000 | 8.15767300 | CLA |
| 14.24266800 | 71.70145500 | 8.15570100 | CLA |
| 11.62830600 | 71.75906800 | 8.15376400 | CLA |
| 9.01227700 | 71.80357000 | 8.15186200 | CLA |
| 6.39495000 | 71.83497800 | 8.14999800 | CLA |
| 5.23741300 | 71.84868600 | 8.15017200 | CLA |
| 2.61888900 | 71.86829900 | 8.15011200 | CLA |
| 0.00000000 | 71.87483500 | 8.15009100 | CLA |
| −2.61888900 | 71.86829900 | 8.15011200 | CLA |
| −5.23741300 | 71.84868600 | 8.15017200 | CLA |
| −6.39495000 | 71.83497800 | 8.14999800 | CLA |
| −9.01227700 | 71.80357000 | 8.15186200 | CLA |
| −11.62830600 | 71.75906800 | 8.15376400 | CLA |
| −14.24266800 | 71.70145500 | 8.15570100 | CLA |
| −16.85499600 | 71.63071000 | 8.15767300 | CLA |
| −19.46491600 | 71.54680200 | 8.15967700 | CLA |
| −20.61886600 | 71.50700800 | 8.16094900 | CLA |
| −23.22460800 | 71.41121700 | 8.16474300 | CLA |
| −25.82698800 | 71.30220600 | 8.16856000 | CLA |
| −28.42562400 | 71.17993400 | 8.17239700 | CLA |
| −31.02012900 | 71.04435900 | 8.17624900 | CLA |

TABLE 7-continued

Stop polygon AS3 on M9

| X[mm] | Y[mm] | Z[mm] | Type |
|---|---|---|---|
| −34.75648600 | 70.82965300 | 8.18292200 | CLA |
| −37.33924700 | 70.66863900 | 8.18855000 | CLA |
| −39.91648700 | 70.49416600 | 8.19417400 | CLA |
| −42.48779600 | 70.30617100 | 8.19979100 | CLA |
| −45.05275300 | 70.10458800 | 8.20539400 | CLA |
| −46.19069200 | 70.01168000 | 8.20813500 | CLA |
| −48.74590700 | 69.79778900 | 8.21547800 | CLA |
| −51.29372900 | 69.57017000 | 8.22278900 | CLA |
| −53.83371600 | 69.32874400 | 8.23006100 | CLA |
| −56.36541400 | 69.07342900 | 8.23728900 | CLA |
| −57.49274100 | 68.95358600 | 8.24018000 | CLA |
| −60.01208900 | 68.68568400 | 8.24912300 | CLA |
| −62.52204800 | 68.40372000 | 8.25799800 | CLA |
| −65.02213500 | 68.10760200 | 8.26679900 | CLA |
| −67.51185900 | 67.79723300 | 8.27551900 | CLA |
| −71.10119300 | 67.32741100 | 8.28925400 | CLA |
| −73.56432400 | 66.98967000 | 8.29955700 | CLA |
| −76.01539200 | 66.63736900 | 8.30974800 | CLA |
| −78.45385800 | 66.27039900 | 8.31981800 | CLA |
| −81.97455100 | 65.71720500 | 8.33566100 | CLA |
| −84.38128500 | 65.32204300 | 8.34725000 | CLA |
| −86.77358900 | 64.91186800 | 8.35868400 | CLA |
| −89.15087400 | 64.48655600 | 8.36995600 | CLA |
| −91.51253500 | 64.04598500 | 8.38105800 | CLA |
| −93.85795200 | 63.59002800 | 8.39198300 | CLA |
| −96.18649100 | 63.11855800 | 8.40272300 | CLA |
| −98.49750200 | 62.63144500 | 8.41327300 | CLA |
| −100.79032200 | 62.12855600 | 8.42362400 | CLA |
| −103.06426900 | 61.60976000 | 8.43377100 | CLA |
| −105.31864900 | 61.07492200 | 8.44370700 | CLA |
| −107.55275100 | 60.52390700 | 8.45342400 | CLA |
| −109.76585200 | 59.95657900 | 8.46291800 | CLA |
| −111.95721000 | 59.37280200 | 8.47218200 | CLA |
| −114.12607300 | 58.77243800 | 8.48121000 | CLA |
| −116.27167300 | 58.15535000 | 8.48999600 | CLA |
| −118.39322700 | 57.52140200 | 8.49853600 | CLA |
| −120.48994200 | 56.87045700 | 8.50682400 | CLA |
| −122.56100900 | 56.20238000 | 8.51485500 | CLA |
| −124.60561000 | 55.51703600 | 8.52262400 | CLA |
| −126.62291300 | 54.81429200 | 8.53012900 | CLA |
| −128.61207800 | 54.09401600 | 8.53736300 | CLA |
| −130.57225300 | 53.35607900 | 8.54432600 | CLA |
| −132.50257900 | 52.60035400 | 8.55101300 | CLA |
| −134.40218600 | 51.82671600 | 8.55742300 | CLA |
| −136.27020000 | 51.03504600 | 8.56355300 | CLA |
| −138.10574000 | 50.22522400 | 8.56940300 | CLA |
| −139.90791900 | 49.39713900 | 8.57497400 | CLA |
| −141.67584700 | 48.55068000 | 8.58026500 | CLA |
| −143.40863300 | 47.68574500 | 8.58527800 | CLA |
| −145.10538200 | 46.80223400 | 8.59001600 | CLA |
| −146.76520100 | 45.90005600 | 8.59448400 | CLA |
| −148.38719700 | 44.97912400 | 8.59868500 | CLA |
| −149.97048100 | 44.03935900 | 8.60262700 | CLA |
| −151.51416800 | 43.08069100 | 8.60631800 | CLA |
| −153.01737700 | 42.10305600 | 8.60976600 | CLA |
| −154.47923500 | 41.10640100 | 8.61298400 | CLA |
| −155.89887800 | 40.09067900 | 8.61598400 | CLA |
| −157.27545200 | 39.05585700 | 8.61878100 | CLA |
| −158.60811400 | 38.00191100 | 8.62139200 | CLA |
| −159.89603300 | 36.92882800 | 8.62383600 | CLA |
| −161.13839400 | 35.83660600 | 8.62613300 | CLA |
| −162.33439800 | 34.72526000 | 8.62830800 | CLA |
| −163.48326100 | 33.59481300 | 8.63038500 | CLA |
| −164.58422100 | 32.44530500 | 8.63239300 | CLA |
| −165.63653300 | 31.27679100 | 8.63436300 | CLA |
| −166.63947600 | 30.08933900 | 8.63632700 | CLA |
| −167.59235100 | 28.88303600 | 8.63832200 | CLA |
| −168.49448300 | 27.65798500 | 8.64038500 | CLA |
| −169.34522100 | 26.41430400 | 8.64255700 | CLA |
| −170.14394200 | 25.15213000 | 8.64488200 | CLA |
| −170.89005200 | 23.87162200 | 8.64740500 | CLA |
| −171.58298300 | 22.57295200 | 8.65017400 | CLA |
| −172.22219700 | 21.25631700 | 8.65324100 | CLA |
| −172.80718800 | 19.92193100 | 8.65665800 | CLA |
| −173.33748100 | 18.57003000 | 8.66048000 | CLA |
| −173.81263200 | 17.20086900 | 8.66476500 | CLA |
| −174.23223100 | 15.81472800 | 8.66957100 | CLA |
| −174.59590200 | 14.41190500 | 8.67496000 | CLA |
| −174.90330200 | 12.99272200 | 8.68099300 | CLA |
| −175.15412300 | 11.55752300 | 8.68773500 | CLA |
| −175.34809200 | 10.10667300 | 8.69525000 | CLA |
| −175.38539800 | 9.80003000 | 8.69732700 | CLA |
| −175.42261700 | 9.49324500 | 8.69969700 | CLA |
| −175.55844600 | 8.02993500 | 8.71081500 | CLA |
| −175.63697200 | 6.55179200 | 8.72281100 | CLA |
| −175.65802900 | 5.05924900 | 8.73575300 | CLA |
| −175.62148800 | 3.55276000 | 8.74970400 | CLA |
| −175.52725300 | 2.03280000 | 8.76473000 | CLA |
| −175.37526600 | 0.49987000 | 8.78089700 | CLA |
| −175.16550300 | −1.04551200 | 8.79826900 | CLA |
| −174.89797700 | −2.60280200 | 8.81690800 | CLA |
| −174.57273400 | −4.17143900 | 8.83687700 | CLA |
| −174.18985600 | −5.75083700 | 8.85823500 | CLA |
| −173.74945900 | −7.34039300 | 8.88104200 | CLA |
| −173.25169300 | −8.93948200 | 8.90535300 | CLA |
| −172.69674200 | −10.54746200 | 8.93122200 | CLA |
| −172.08482000 | −12.16366800 | 8.95869900 | CLA |
| −171.41617600 | −13.78742200 | 8.98783100 | CLA |
| −170.69108900 | −15.41802500 | 9.01866400 | CLA |
| −169.90987000 | −17.05476300 | 9.05123700 | CLA |
| −169.07285800 | −18.69690500 | 9.08558600 | CLA |
| −168.18042200 | −20.34370400 | 9.12174400 | CLA |
| −167.23296000 | −21.99440100 | 9.15974000 | CLA |
| −166.23089600 | −23.64822000 | 9.19959500 | CLA |
| −165.17468100 | −25.30437400 | 9.24132800 | CLA |
| −164.06479400 | −26.96206400 | 9.28495300 | CLA |
| −162.90173400 | −28.62047800 | 9.33047800 | CLA |
| −161.68602700 | −30.27879600 | 9.37790600 | CLA |
| −160.41822100 | −31.93618600 | 9.42723300 | CLA |
| −159.09888600 | −33.59180900 | 9.47845200 | CLA |
| −157.72861100 | −35.24481700 | 9.53154900 | CLA |
| −156.30800600 | −36.89435500 | 9.58650400 | CLA |
| −154.83770000 | −38.53956200 | 9.64329100 | CLA |
| −153.31833900 | −40.17957300 | 9.70188000 | CLA |
| −151.75058600 | −41.81351600 | 9.76223200 | CLA |
| −150.13511900 | −43.44051700 | 9.82430600 | CLA |
| −148.47263400 | −45.05970100 | 9.88805200 | CLA |
| −146.76383500 | −46.67018700 | 9.95341600 | CLA |
| −145.00944500 | −48.27109700 | 10.02033800 | CLA |
| −143.21019400 | −49.86155100 | 10.08875200 | CLA |
| −141.36682700 | −51.44067000 | 10.15858700 | CLA |
| −139.48009800 | −53.00757600 | 10.22976600 | CLA |
| −137.55076900 | −54.56139500 | 10.30220800 | CLA |
| −135.57961200 | −56.10125500 | 10.37582600 | CLA |
| −133.56740800 | −57.62628900 | 10.45052900 | CLA |
| −131.51494400 | −59.13563200 | 10.52622100 | CLA |
| −129.42301300 | −60.62842900 | 10.60280200 | CLA |
| −127.29241500 | −62.10382700 | 10.68016600 | CLA |
| −125.12395600 | −63.56098300 | 10.75820500 | CLA |
| −122.91844500 | −64.99906200 | 10.83680800 | CLA |
| −120.67669700 | −66.41723400 | 10.91585800 | CLA |
| −118.39952900 | −67.81468200 | 10.99523900 | CLA |
| −116.08776400 | −69.19059800 | 11.07482700 | CLA |
| −113.74222400 | −70.54418400 | 11.15449900 | CLA |
| −111.36373800 | −71.87465300 | 11.23412900 | CLA |
| −108.95313400 | −73.18123000 | 11.31359000 | CLA |
| −106.51124400 | −74.46315300 | 11.39275200 | CLA |
| −104.03889900 | −75.71967300 | 11.47148400 | CLA |
| −101.53693500 | −76.95005500 | 11.54965500 | CLA |
| −99.00618600 | −78.15357600 | 11.62713100 | CLA |
| −96.44749000 | −79.32953100 | 11.70378200 | CLA |
| −93.86168200 | −80.47722800 | 11.77947400 | CLA |
| −91.24960200 | −81.59599200 | 11.85407600 | CLA |
| −88.61208700 | −82.68516400 | 11.92745500 | CLA |
| −85.94997800 | −83.74410000 | 11.99948200 | CLA |
| −83.26411300 | −84.77217700 | 12.07002700 | CLA |
| −80.55533200 | −85.76878700 | 12.13896300 | CLA |
| −77.82447700 | −86.73333900 | 12.20616400 | CLA |
| −75.07238700 | −87.66526400 | 12.27150700 | CLA |
| −72.29990300 | −88.56401000 | 12.33487100 | CLA |
| −69.50786800 | −89.42904300 | 12.39613800 | CLA |
| −66.69712100 | −90.25985100 | 12.45519300 | CLA |

TABLE 7-continued

Stop polygon AS3 on M9

| X[mm] | Y[mm] | Z[mm] | Type |
|---|---|---|---|
| −63.86850500 | −91.05594200 | 12.51192300 | CLA |
| −61.02286300 | −91.81684200 | 12.56622100 | CLA |
| −58.16103600 | −92.54210000 | 12.61798300 | CLA |
| −55.28386700 | −93.23128500 | 12.66710800 | CLA |
| −52.39220000 | −93.88398800 | 12.71349900 | CLA |
| −49.48687600 | −94.49982100 | 12.75706600 | CLA |
| −46.56874100 | −95.07841700 | 12.79772100 | CLA |
| −43.63863800 | −95.61943400 | 12.83538200 | CLA |
| −40.69741000 | −96.12254800 | 12.86997200 | CLA |
| −37.74590400 | −96.58746300 | 12.90142000 | CLA |
| −34.78496400 | −97.01390100 | 12.92965900 | CLA |
| −31.81543500 | −97.40160900 | 12.95462800 | CLA |
| −28.83816300 | −97.75035900 | 12.97627200 | CLA |
| −25.85399400 | −98.05994200 | 12.99454200 | CLA |
| −22.86377600 | −98.33017600 | 13.00939400 | CLA |
| −19.86835400 | −98.56090100 | 13.02079000 | CLA |
| −16.86857600 | −98.75198300 | 13.02870000 | CLA |
| −13.86529000 | −98.90330900 | 13.03309700 | CLA |
| −10.85934400 | −99.01479100 | 13.03396300 | CLA |
| −7.85158500 | −99.08636500 | 13.03128500 | CLA |
| −4.84286400 | −99.11799200 | 13.02505600 | CLA |

TABLE 8

Stop polygon AS2

| X[mm] | Y[mm] | Z[mm] | Type |
|---|---|---|---|
| 0.00000000 | −51.07217300 | 0.00000000 | CLA |
| 2.66162300 | −51.05712900 | 0.00000000 | CLA |
| 5.32262300 | −51.01202200 | 0.00000000 | CLA |
| 7.98237900 | −50.93692400 | 0.00000000 | CLA |
| 10.64026700 | −50.83195500 | 0.00000000 | CLA |
| 13.29566300 | −50.69728600 | 0.00000000 | CLA |
| 16.66141500 | −50.51366500 | 0.00000000 | CLA |
| 19.31292800 | −50.34884700 | 0.00000000 | CLA |
| 21.96055600 | −50.15484900 | 0.00000000 | CLA |
| 24.60366900 | −49.93198400 | 0.00000000 | CLA |
| 27.24163700 | −49.68060900 | 0.00000000 | CLA |
| 29.87382300 | −49.40112300 | 0.00000000 | CLA |
| 32.49958900 | −49.09397300 | 0.00000000 | CLA |
| 35.11829400 | −48.75964300 | 0.00000000 | CLA |
| 37.72929300 | −48.39866000 | 0.00000000 | CLA |
| 40.33193200 | −48.01158900 | 0.00000000 | CLA |
| 42.92556700 | −47.59903300 | 0.00000000 | CLA |
| 46.28092200 | −47.05364500 | 0.00000000 | CLA |
| 48.86277100 | −46.61658100 | 0.00000000 | CLA |
| 51.43416400 | −46.15546400 | 0.00000000 | CLA |
| 53.99443400 | −45.67100300 | 0.00000000 | CLA |
| 56.54291400 | −45.16393500 | 0.00000000 | CLA |
| 59.07892900 | −44.63502300 | 0.00000000 | CLA |
| 61.60180100 | −44.08505900 | 0.00000000 | CLA |
| 64.11084700 | −43.51485800 | 0.00000000 | CLA |
| 66.60538000 | −42.92525600 | 0.00000000 | CLA |
| 69.08470900 | −42.31710800 | 0.00000000 | CLA |
| 71.54813700 | −41.69128700 | 0.00000000 | CLA |
| 73.99496400 | −41.04868100 | 0.00000000 | CLA |
| 77.32711100 | −40.16178300 | 0.00000000 | CLA |
| 79.75318800 | −39.50583000 | 0.00000000 | CLA |
| 82.16115000 | −38.83509200 | 0.00000000 | CLA |
| 84.55029100 | −38.15048500 | 0.00000000 | CLA |
| 86.91990000 | −37.45293200 | 0.00000000 | CLA |
| 89.26926400 | −36.74335900 | 0.00000000 | CLA |
| 91.59766700 | −36.02268900 | 0.00000000 | CLA |
| 93.90439200 | −35.29184800 | 0.00000000 | CLA |
| 96.18871900 | −34.55175500 | 0.00000000 | CLA |
| 98.44992800 | −33.80332300 | 0.00000000 | CLA |
| 100.68729600 | −33.04745700 | 0.00000000 | CLA |
| 102.90010300 | −32.28505400 | 0.00000000 | CLA |
| 105.08762600 | −31.51699400 | 0.00000000 | CLA |
| 107.24914300 | −30.74414200 | 0.00000000 | CLA |
| 110.53967800 | −29.56667400 | 0.00000000 | CLA |
| 112.66988600 | −28.79613300 | 0.00000000 | CLA |
| 114.77260000 | −28.02271900 | 0.00000000 | CLA |
| 116.84710900 | −27.24724600 | 0.00000000 | CLA |
| 118.89270500 | −26.47050500 | 0.00000000 | CLA |
| 120.90868100 | −25.69326600 | 0.00000000 | CLA |
| 122.89433700 | −24.91627500 | 0.00000000 | CLA |
| 124.84897500 | −24.14025500 | 0.00000000 | CLA |
| 126.77190300 | −23.36590300 | 0.00000000 | CLA |
| 128.66243200 | −22.59388900 | 0.00000000 | CLA |
| 130.51988200 | −21.82485700 | 0.00000000 | CLA |
| 132.34357700 | −21.05942300 | 0.00000000 | CLA |
| 134.13284800 | −20.29817500 | 0.00000000 | CLA |
| 139.12975100 | −18.15044400 | 0.00000000 | CLA |
| 140.84325800 | −17.41013300 | 0.00000000 | CLA |
| 142.52041200 | −16.67583600 | 0.00000000 | CLA |
| 144.16058200 | −15.94802200 | 0.00000000 | CLA |
| 145.76315200 | −15.22712800 | 0.00000000 | CLA |
| 147.32751100 | −14.51356500 | 0.00000000 | CLA |
| 148.85306200 | −13.80771400 | 0.00000000 | CLA |
| 150.33921700 | −13.10992800 | 0.00000000 | CLA |
| 151.78540100 | −12.42053200 | 0.00000000 | CLA |
| 153.19104900 | −11.73982500 | 0.00000000 | CLA |
| 157.77094000 | −9.51969600 | 0.00000000 | CLA |
| 159.08933500 | −8.87263300 | 0.00000000 | CLA |
| 160.36567200 | −8.23521200 | 0.00000000 | CLA |
| 161.59944400 | −7.60762000 | 0.00000000 | CLA |
| 162.79016200 | −6.99001600 | 0.00000000 | CLA |
| 168.25884800 | −4.10019400 | 0.00000000 | CLA |
| 169.31360100 | −3.53291500 | 0.00000000 | CLA |
| 170.32361200 | −2.97624700 | 0.00000000 | CLA |
| 171.28847200 | −2.43022900 | 0.00000000 | CLA |
| 172.20778900 | −1.89488100 | 0.00000000 | CLA |
| 173.08118800 | −1.37020400 | 0.00000000 | CLA |
| 173.90830900 | −0.85618200 | 0.00000000 | CLA |
| 174.68881100 | −0.35278100 | 0.00000000 | CLA |
| 175.42236900 | 0.14004600 | 0.00000000 | CLA |
| 176.10867700 | 0.62236100 | 0.00000000 | CLA |
| 176.74744700 | 1.09424200 | 0.00000000 | CLA |
| 177.33840900 | 1.55577700 | 0.00000000 | CLA |
| 177.88131100 | 2.00706600 | 0.00000000 | CLA |
| 178.37592300 | 2.44822100 | 0.00000000 | CLA |
| 178.82203000 | 2.87936300 | 0.00000000 | CLA |
| 179.21943900 | 3.30062300 | 0.00000000 | CLA |
| 179.56797700 | 3.71213700 | 0.00000000 | CLA |
| 179.86749000 | 4.11405300 | 0.00000000 | CLA |
| 180.11784600 | 4.50652200 | 0.00000000 | CLA |
| 180.31893000 | 4.88970200 | 0.00000000 | CLA |
| 180.47065100 | 5.26375500 | 0.00000000 | CLA |
| 180.57293600 | 5.62884900 | 0.00000000 | CLA |
| 180.62573500 | 5.98515500 | 0.00000000 | CLA |
| 180.62910000 | 6.33284500 | 0.00000000 | CLA |
| 180.33196700 | 9.56040600 | 0.00000000 | CLA |
| 180.27786300 | 9.81759200 | 0.00000000 | CLA |
| 180.17435700 | 10.06691200 | 0.00000000 | CLA |
| 180.02149000 | 10.30860600 | 0.00000000 | CLA |
| 179.81932900 | 10.54291500 | 0.00000000 | CLA |
| 179.56796000 | 10.77007600 | 0.00000000 | CLA |
| 179.26749000 | 10.99032400 | 0.00000000 | CLA |
| 178.91804700 | 11.20389000 | 0.00000000 | CLA |
| 178.51978200 | 11.41100300 | 0.00000000 | CLA |
| 178.07286600 | 11.61188400 | 0.00000000 | CLA |
| 177.57749000 | 11.80675200 | 0.00000000 | CLA |
| 177.03386800 | 11.99581700 | 0.00000000 | CLA |
| 176.44223200 | 12.17928800 | 0.00000000 | CLA |
| 175.80283600 | 12.35736300 | 0.00000000 | CLA |
| 175.11595400 | 12.53023600 | 0.00000000 | CLA |
| 174.38187900 | 12.69809300 | 0.00000000 | CLA |
| 173.60092400 | 12.86111400 | 0.00000000 | CLA |
| 172.77342100 | 13.01947100 | 0.00000000 | CLA |
| 171.89972000 | 13.17333000 | 0.00000000 | CLA |
| 170.98019200 | 13.32284900 | 0.00000000 | CLA |
| 170.01522300 | 13.46817800 | 0.00000000 | CLA |
| 169.00522000 | 13.60946100 | 0.00000000 | CLA |
| 167.95060400 | 13.74683400 | 0.00000000 | CLA |
| 166.85181400 | 13.88042800 | 0.00000000 | CLA |
| 165.70930800 | 14.01036400 | 0.00000000 | CLA |
| 164.52355600 | 14.13675900 | 0.00000000 | CLA |

TABLE 8-continued

Stop polygon AS2

| X[mm] | Y[mm] | Z[mm] | Type |
|---|---|---|---|
| 163.29504700 | 14.25972400 | 0.00000000 | CLA |
| 162.02428100 | 14.37936100 | 0.00000000 | CLA |
| 160.71177700 | 14.49576800 | 0.00000000 | CLA |
| 159.35806500 | 14.60903800 | 0.00000000 | CLA |
| 157.96368900 | 14.71925700 | 0.00000000 | CLA |
| 156.52920600 | 14.82650700 | 0.00000000 | CLA |
| 155.05518600 | 14.93086500 | 0.00000000 | CLA |
| 153.54220900 | 15.03240400 | 0.00000000 | CLA |
| 151.99086900 | 15.13119100 | 0.00000000 | CLA |
| 150.40176700 | 15.22729100 | 0.00000000 | CLA |
| 148.77551600 | 15.32076500 | 0.00000000 | CLA |
| 140.28917500 | 15.78795200 | 0.00000000 | CLA |
| 138.45153000 | 15.88904100 | 0.00000000 | CLA |
| 136.58103900 | 15.98734800 | 0.00000000 | CLA |
| 134.67837300 | 16.08292400 | 0.00000000 | CLA |
| 132.74420600 | 16.17581600 | 0.00000000 | CLA |
| 130.77921500 | 16.26607100 | 0.00000000 | CLA |
| 128.78408300 | 16.35373200 | 0.00000000 | CLA |
| 126.75949200 | 16.43884200 | 0.00000000 | CLA |
| 124.70613000 | 16.52144200 | 0.00000000 | CLA |
| 122.62468400 | 16.60157100 | 0.00000000 | CLA |
| 120.51584300 | 16.67926800 | 0.00000000 | CLA |
| 118.38029500 | 16.75456800 | 0.00000000 | CLA |
| 116.21873100 | 16.82751000 | 0.00000000 | CLA |
| 114.03183800 | 16.89812500 | 0.00000000 | CLA |
| 111.82030400 | 16.96645000 | 0.00000000 | CLA |
| 109.58481400 | 17.03251500 | 0.00000000 | CLA |
| 107.32605400 | 17.09635200 | 0.00000000 | CLA |
| 105.04470300 | 17.15799200 | 0.00000000 | CLA |
| 102.74144100 | 17.21746500 | 0.00000000 | CLA |
| 100.41694300 | 17.27479900 | 0.00000000 | CLA |
| 98.07188300 | 17.33002300 | 0.00000000 | CLA |
| 95.70692900 | 17.38316200 | 0.00000000 | CLA |
| 93.32274600 | 17.43424400 | 0.00000000 | CLA |
| 90.91999500 | 17.48329300 | 0.00000000 | CLA |
| 88.49933400 | 17.53033300 | 0.00000000 | CLA |
| 86.06141500 | 17.57538800 | 0.00000000 | CLA |
| 83.60688700 | 17.61847900 | 0.00000000 | CLA |
| 81.13639500 | 17.65962900 | 0.00000000 | CLA |
| 78.65057900 | 17.69885600 | 0.00000000 | CLA |
| 76.15007600 | 17.73618100 | 0.00000000 | CLA |
| 73.63551600 | 17.77162000 | 0.00000000 | CLA |
| 71.10752900 | 17.80519100 | 0.00000000 | CLA |
| 68.56673900 | 17.83690900 | 0.00000000 | CLA |
| 66.01376800 | 17.86678700 | 0.00000000 | CLA |
| 63.44923300 | 17.89484000 | 0.00000000 | CLA |
| 60.87374900 | 17.92107700 | 0.00000000 | CLA |
| 58.28792900 | 17.94551000 | 0.00000000 | CLA |
| 55.69238400 | 17.96814600 | 0.00000000 | CLA |
| 53.08772000 | 17.98899400 | 0.00000000 | CLA |
| 50.47454600 | 18.00805700 | 0.00000000 | CLA |
| 47.85346800 | 18.02534000 | 0.00000000 | CLA |
| 45.22509000 | 18.04084600 | 0.00000000 | CLA |
| 42.59001700 | 18.05457500 | 0.00000000 | CLA |
| 39.94885600 | 18.06652700 | 0.00000000 | CLA |
| 37.30221200 | 18.07669900 | 0.00000000 | CLA |
| 34.65069400 | 18.08508600 | 0.00000000 | CLA |
| 31.99491000 | 18.09168300 | 0.00000000 | CLA |
| 29.33547200 | 18.09648300 | 0.00000000 | CLA |
| 26.67299600 | 18.09947600 | 0.00000000 | CLA |
| 24.00809900 | 18.10065300 | 0.00000000 | CLA |
| −24.00809900 | 18.10065300 | 0.00000000 | CLA |
| −26.67299600 | 18.09947600 | 0.00000000 | CLA |
| −29.33547200 | 18.09648300 | 0.00000000 | CLA |
| −31.99491000 | 18.09168300 | 0.00000000 | CLA |
| −34.65069400 | 18.08508600 | 0.00000000 | CLA |
| −37.30221200 | 18.07669900 | 0.00000000 | CLA |
| −39.94885600 | 18.06652700 | 0.00000000 | CLA |
| −42.59001700 | 18.05457500 | 0.00000000 | CLA |
| −45.22509000 | 18.04084600 | 0.00000000 | CLA |
| −47.85346800 | 18.02534000 | 0.00000000 | CLA |
| −50.47454600 | 18.00805700 | 0.00000000 | CLA |
| −53.08772000 | 17.98899400 | 0.00000000 | CLA |
| −55.69238400 | 17.96814600 | 0.00000000 | CLA |
| −58.28792900 | 17.94551000 | 0.00000000 | CLA |
| −60.87374900 | 17.92107700 | 0.00000000 | CLA |
| −63.44923300 | 17.89484000 | 0.00000000 | CLA |
| −66.01376800 | 17.86678700 | 0.00000000 | CLA |
| −68.56673900 | 17.83690900 | 0.00000000 | CLA |
| −71.10752900 | 17.80519100 | 0.00000000 | CLA |
| −73.63551600 | 17.77162000 | 0.00000000 | CLA |
| −76.15007600 | 17.73618100 | 0.00000000 | CLA |
| −78.65057900 | 17.69885600 | 0.00000000 | CLA |
| −81.13639500 | 17.65962900 | 0.00000000 | CLA |
| −83.60688700 | 17.61847900 | 0.00000000 | CLA |
| −86.06141500 | 17.57538800 | 0.00000000 | CLA |
| −88.49933400 | 17.53033300 | 0.00000000 | CLA |
| −90.91999500 | 17.48329300 | 0.00000000 | CLA |
| −93.32274600 | 17.43424400 | 0.00000000 | CLA |
| −95.70692900 | 17.38316200 | 0.00000000 | CLA |
| −98.07188300 | 17.33002300 | 0.00000000 | CLA |
| −100.41694300 | 17.27479900 | 0.00000000 | CLA |
| −102.74144100 | 17.21746500 | 0.00000000 | CLA |
| −105.04470300 | 17.15799200 | 0.00000000 | CLA |
| −107.32605400 | 17.09635200 | 0.00000000 | CLA |
| −109.58481400 | 17.03251500 | 0.00000000 | CLA |
| −111.82030400 | 16.96645000 | 0.00000000 | CLA |
| −114.03183800 | 16.89812500 | 0.00000000 | CLA |
| −116.21873100 | 16.82751000 | 0.00000000 | CLA |
| −118.38029500 | 16.75456800 | 0.00000000 | CLA |
| −120.51584300 | 16.67926800 | 0.00000000 | CLA |
| −122.62468400 | 16.60157100 | 0.00000000 | CLA |
| −124.70613000 | 16.52144200 | 0.00000000 | CLA |
| −126.75949200 | 16.43884200 | 0.00000000 | CLA |
| −128.78408300 | 16.35373200 | 0.00000000 | CLA |
| −130.77921500 | 16.26607100 | 0.00000000 | CLA |
| −132.74420600 | 16.17581600 | 0.00000000 | CLA |
| −134.67837300 | 16.08292400 | 0.00000000 | CLA |
| −136.58103900 | 15.98734800 | 0.00000000 | CLA |
| −138.45153000 | 15.88904100 | 0.00000000 | CLA |
| −140.28917500 | 15.78795200 | 0.00000000 | CLA |
| −148.77551600 | 15.32076500 | 0.00000000 | CLA |
| −150.40176700 | 15.22729100 | 0.00000000 | CLA |
| −151.99086900 | 15.13119100 | 0.00000000 | CLA |
| −153.54220900 | 15.03240400 | 0.00000000 | CLA |
| −155.05518600 | 14.93086500 | 0.00000000 | CLA |
| −156.52920600 | 14.82650700 | 0.00000000 | CLA |
| −157.96368900 | 14.71925700 | 0.00000000 | CLA |
| −159.35806500 | 14.60903800 | 0.00000000 | CLA |
| −160.71177700 | 14.49576800 | 0.00000000 | CLA |
| −162.02428100 | 14.37936100 | 0.00000000 | CLA |
| −163.29504700 | 14.25972400 | 0.00000000 | CLA |
| −164.52355600 | 14.13675900 | 0.00000000 | CLA |
| −165.70930800 | 14.01036400 | 0.00000000 | CLA |
| −166.85181400 | 13.88042800 | 0.00000000 | CLA |
| −167.95060400 | 13.74683400 | 0.00000000 | CLA |
| −169.00522000 | 13.60946100 | 0.00000000 | CLA |
| −170.01522300 | 13.46817800 | 0.00000000 | CLA |
| −170.98019200 | 13.32284900 | 0.00000000 | CLA |
| −171.89972000 | 13.17333000 | 0.00000000 | CLA |
| −172.77342100 | 13.01947100 | 0.00000000 | CLA |
| −173.60092400 | 12.86111400 | 0.00000000 | CLA |
| −174.38187900 | 12.69809300 | 0.00000000 | CLA |
| −175.11595400 | 12.53023600 | 0.00000000 | CLA |
| −175.80283600 | 12.35736300 | 0.00000000 | CLA |
| −176.44223200 | 12.17928800 | 0.00000000 | CLA |
| −177.03386800 | 11.99581700 | 0.00000000 | CLA |
| −177.57749000 | 11.80675200 | 0.00000000 | CLA |
| −178.07286600 | 11.61188400 | 0.00000000 | CLA |
| −178.51978200 | 11.41100300 | 0.00000000 | CLA |
| −178.91804700 | 11.20389000 | 0.00000000 | CLA |
| −179.26749000 | 10.99032400 | 0.00000000 | CLA |
| −179.56796900 | 10.77007600 | 0.00000000 | CLA |
| −179.81932900 | 10.54291500 | 0.00000000 | CLA |
| −180.02149000 | 10.30860600 | 0.00000000 | CLA |
| −180.17435700 | 10.06691200 | 0.00000000 | CLA |
| −180.27786900 | 9.81759200 | 0.00000000 | CLA |
| −180.33196700 | 9.56040600 | 0.00000000 | CLA |
| −180.62901800 | 6.33284500 | 0.00000000 | CLA |
| −180.62573500 | 5.98515500 | 0.00000000 | CLA |
| −180.57293600 | 5.62884900 | 0.00000000 | CLA |
| −180.47065100 | 5.26375500 | 0.00000000 | CLA |

TABLE 8-continued

Stop polygon AS2

| X[mm] | Y[mm] | Z[mm] | Type |
|---|---|---|---|
| −180.31893000 | 4.88970200 | 0.00000000 | CLA |
| −180.11784600 | 4.50652200 | 0.00000000 | CLA |
| −179.86749000 | 4.11405300 | 0.00000000 | CLA |
| −179.56797700 | 3.71213700 | 0.00000000 | CLA |
| −179.21943900 | 3.30062300 | 0.00000000 | CLA |
| −178.82203000 | 2.87936300 | 0.00000000 | CLA |
| −178.37592300 | 2.44822100 | 0.00000000 | CLA |
| −177.88131100 | 2.00706600 | 0.00000000 | CLA |
| −177.33840900 | 1.55577700 | 0.00000000 | CLA |
| −176.74744700 | 1.09424200 | 0.00000000 | CLA |
| −176.10867700 | 0.62236100 | 0.00000000 | CLA |
| −175.42236900 | 0.14004600 | 0.00000000 | CLA |
| −174.68881100 | −0.35278100 | 0.00000000 | CLA |
| −173.90830900 | −0.85618200 | 0.00000000 | CLA |
| −173.08118800 | −1.37020400 | 0.00000000 | CLA |
| −172.20778900 | −1.89488100 | 0.00000000 | CLA |
| −171.28847200 | −2.43022900 | 0.00000000 | CLA |
| −170.32361200 | −2.97624700 | 0.00000000 | CLA |
| −169.31360100 | −3.53291500 | 0.00000000 | CLA |
| −168.25884800 | −4.10019400 | 0.00000000 | CLA |
| −162.79016200 | −6.99001600 | 0.00000000 | CLA |
| −161.59944400 | −7.60762000 | 0.00000000 | CLA |
| −160.36567200 | −8.23521200 | 0.00000000 | CLA |
| −159.08933500 | −8.87263300 | 0.00000000 | CLA |
| −157.77094000 | −9.51969600 | 0.00000000 | CLA |
| −153.19104900 | −11.73982500 | 0.00000000 | CLA |
| −151.78540100 | −12.42053200 | 0.00000000 | CLA |
| −150.33921700 | −13.10992800 | 0.00000000 | CLA |
| −148.85306200 | −13.80771400 | 0.00000000 | CLA |
| −147.32751100 | −14.51356500 | 0.00000000 | CLA |
| −145.76315200 | −15.22712800 | 0.00000000 | CLA |
| −144.16058200 | −15.94802200 | 0.00000000 | CLA |
| −142.52041200 | −16.67583600 | 0.00000000 | CLA |
| −140.84325800 | −17.41013300 | 0.00000000 | CLA |
| −139.12975100 | −18.15044400 | 0.00000000 | CLA |
| −134.13284800 | −20.29817500 | 0.00000000 | CLA |
| −132.34357700 | −21.05942300 | 0.00000000 | CLA |
| −130.51988200 | −21.82485700 | 0.00000000 | CLA |
| −128.66243200 | −22.59388900 | 0.00000000 | CLA |
| −126.77190300 | −23.36590300 | 0.00000000 | CLA |
| −124.84897500 | −24.14025500 | 0.00000000 | CLA |
| −122.89433700 | −24.91627500 | 0.00000000 | CLA |
| −120.90868100 | −25.69326600 | 0.00000000 | CLA |
| −118.89270500 | −26.47050500 | 0.00000000 | CLA |
| −116.84710900 | −27.24724600 | 0.00000000 | CLA |
| −114.77260000 | −28.02271900 | 0.00000000 | CLA |
| −112.66988600 | −28.79613300 | 0.00000000 | CLA |
| −110.53967800 | −29.56667400 | 0.00000000 | CLA |
| −107.24914300 | −30.74414800 | 0.00000000 | CLA |
| −105.08762600 | −31.51699400 | 0.00000000 | CLA |
| −102.90010300 | −32.28505400 | 0.00000000 | CLA |
| −100.68729600 | −33.04745700 | 0.00000000 | CLA |
| −98.44992800 | −33.80332300 | 0.00000000 | CLA |
| −96.18871900 | −34.55175500 | 0.00000000 | CLA |
| −93.90439200 | −35.29184800 | 0.00000000 | CLA |
| −91.59766700 | −36.02268900 | 0.00000000 | CLA |
| −89.26926400 | −36.74335900 | 0.00000000 | CLA |
| −86.91990000 | −37.45293200 | 0.00000000 | CLA |
| −84.55029100 | −38.15048500 | 0.00000000 | CLA |
| −82.16115000 | −38.83509200 | 0.00000000 | CLA |
| −79.75318800 | −39.50583000 | 0.00000000 | CLA |
| −77.32711100 | −40.16178300 | 0.00000000 | CLA |
| −73.99496800 | −41.04868100 | 0.00000000 | CLA |
| −71.54813700 | −41.69128700 | 0.00000000 | CLA |
| −69.08470900 | −42.31710800 | 0.00000000 | CLA |
| −66.60538000 | −42.92525600 | 0.00000000 | CLA |
| −64.11084700 | −43.51485800 | 0.00000000 | CLA |
| −61.60180100 | −44.08505900 | 0.00000000 | CLA |
| −59.07892900 | −44.63502300 | 0.00000000 | CLA |
| −56.54291400 | −45.16393500 | 0.00000000 | CLA |
| −53.99443400 | −45.67100300 | 0.00000000 | CLA |
| −51.43416400 | −46.15546400 | 0.00000000 | CLA |
| −48.86277100 | −46.61658100 | 0.00000000 | CLA |
| −46.28092200 | −47.05364500 | 0.00000000 | CLA |
| −42.92556700 | −47.59903300 | 0.00000000 | CLA |
| −40.33193500 | −48.01158900 | 0.00000000 | CLA |
| −37.72929300 | −48.39866000 | 0.00000000 | CLA |
| −35.11829400 | −48.75964300 | 0.00000000 | CLA |
| −32.49958900 | −49.09397300 | 0.00000000 | CLA |
| −29.87382300 | −49.40112300 | 0.00000000 | CLA |
| −27.24163700 | −49.68060900 | 0.00000000 | CLA |
| −24.60366900 | −49.93198400 | 0.00000000 | CLA |
| −21.96055600 | −50.15484900 | 0.00000000 | CLA |
| −19.31292800 | −50.34884700 | 0.00000000 | CLA |
| −16.66141500 | −50.51366500 | 0.00000000 | CLA |
| −13.29566300 | −50.69728600 | 0.00000000 | CLA |
| −10.64026700 | −50.83195500 | 0.00000000 | CLA |
| −7.98237900 | −50.93692400 | 0.00000000 | CLA |
| −5.32262300 | −51.01202200 | 0.00000000 | CLA |
| −2.66162300 | −51.05712900 | 0.00000000 | CLA |

TABLE 9

Stop polygon AS

| X[mm] | Y[mm] | Z[mm] | Type |
|---|---|---|---|
| −227.91573000 | −165.46964900 | 0.00000000 | CLA |
| −227.20570600 | −177.07028400 | 0.00000000 | CLA |
| −225.89504300 | −188.70208500 | 0.00000000 | CLA |
| −223.97406700 | −200.33118800 | 0.00000000 | CLA |
| −221.43499800 | −211.92240400 | 0.00000000 | CLA |
| −218.27195900 | −223.43912600 | 0.00000000 | CLA |
| −214.48127800 | −234.84332200 | 0.00000000 | CLA |
| −210.06189400 | −246.09584400 | 0.00000000 | CLA |
| −205.01484800 | −257.15653500 | 0.00000000 | CLA |
| −199.34429100 | −267.98472500 | 0.00000000 | CLA |
| −193.05688700 | −278.53883600 | 0.00000000 | CLA |
| −186.16251100 | −288.77708100 | 0.00000000 | CLA |
| −178.67405200 | −298.65757200 | 0.00000000 | CLA |
| −170.60750600 | −308.13892000 | 0.00000000 | CLA |
| −161.98229300 | −317.17983100 | 0.00000000 | CLA |
| −152.82083500 | −325.74011900 | 0.00000000 | CLA |
| −143.14897400 | −333.78069700 | 0.00000000 | CLA |
| −132.99576300 | −341.26408800 | 0.00000000 | CLA |
| −122.39337200 | −348.15452000 | 0.00000000 | CLA |
| −111.37687400 | −354.41853100 | 0.00000000 | CLA |
| −99.98426300 | −360.02496900 | 0.00000000 | CLA |
| −88.25634100 | −364.94569400 | 0.00000000 | CLA |
| −76.23601500 | −369.15568000 | 0.00000000 | CLA |
| −63.96850500 | −372.63301500 | 0.00000000 | CLA |
| −51.50093800 | −375.35980200 | 0.00000000 | CLA |
| −38.88184600 | −377.32165800 | 0.00000000 | CLA |
| −26.16076100 | −378.50812100 | 0.00000000 | CLA |
| −13.38842900 | −378.91304000 | 0.00000000 | CLA |
| 13.38842900 | −378.91304000 | 0.00000000 | CLA |
| 26.16076100 | −378.50812100 | 0.00000000 | CLA |
| 38.88184600 | −377.32165800 | 0.00000000 | CLA |
| 51.50093800 | −375.35980200 | 0.00000000 | CLA |
| 63.96850500 | −372.63301500 | 0.00000000 | CLA |
| 76.23601500 | −369.15568000 | 0.00000000 | CLA |
| 88.25634100 | −364.94569400 | 0.00000000 | CLA |
| 99.98426300 | −360.02496900 | 0.00000000 | CLA |
| 111.37687400 | −354.41853100 | 0.00000000 | CLA |
| 122.39337200 | −348.15452000 | 0.00000000 | CLA |
| 132.99576300 | −341.26408800 | 0.00000000 | CLA |
| 143.14897400 | −333.78069700 | 0.00000000 | CLA |
| 152.82083500 | −325.74011900 | 0.00000000 | CLA |
| 161.98229300 | −317.17983100 | 0.00000000 | CLA |
| 170.60750600 | −308.13892000 | 0.00000000 | CLA |
| 178.67405200 | −298.65757200 | 0.00000000 | CLA |
| 186.16251100 | −288.77708100 | 0.00000000 | CLA |
| 193.05688700 | −278.53883600 | 0.00000000 | CLA |
| 199.34429100 | −267.98472500 | 0.00000000 | CLA |
| 205.01484800 | −257.15653500 | 0.00000000 | CLA |
| 210.06189400 | −246.09584400 | 0.00000000 | CLA |
| 214.48127800 | −234.84332200 | 0.00000000 | CLA |
| 218.27195900 | −223.43912600 | 0.00000000 | CLA |
| 221.43499800 | −211.92240400 | 0.00000000 | CLA |

TABLE 9-continued

Stop polygon AS

| X[mm] | Y[mm] | Z[mm] | Type |
|---|---|---|---|
| 223.97406700 | −200.33118800 | 0.00000000 | CLA |
| 225.89504300 | −188.70208500 | 0.00000000 | CLA |
| 227.20570600 | −177.07028400 | 0.00000000 | CLA |
| 227.91573000 | −165.46964900 | 0.00000000 | CLA |
| 218.96183500 | −152.82525200 | 0.00000000 | CLA |
| 224.06330000 | −145.36750000 | 0.00000000 | CLA |
| 230.88330000 | −134.16890000 | 0.00000000 | CLA |
| 237.01280000 | −122.76050000 | 0.00000000 | CLA |
| 242.43390000 | −111.18030000 | 0.00000000 | CLA |
| 247.13070000 | −99.46550000 | 0.00000000 | CLA |
| 251.09000000 | −87.65220000 | 0.00000000 | CLA |
| 254.30090000 | −75.77540000 | 0.00000000 | CLA |
| 256.75560000 | −63.86940000 | 0.00000000 | CLA |
| 258.44930000 | −51.96710000 | 0.00000000 | CLA |
| 259.38010000 | −40.10040000 | 0.00000000 | CLA |
| 259.54960000 | −28.30030000 | 0.00000000 | CLA |
| 258.96260000 | −16.59660000 | 0.00000000 | CLA |
| 257.62740000 | −5.01790000 | 0.00000000 | CLA |
| 255.55540000 | 6.40820000 | 0.00000000 | CLA |
| 252.76110000 | 17.65520000 | 0.00000000 | CLA |
| 249.26230000 | 28.69770000 | 0.00000000 | CLA |
| 245.07930000 | 39.51170000 | 0.00000000 | CLA |
| 240.23500000 | 50.07390000 | 0.00000000 | CLA |
| 234.75450000 | 60.36280000 | 0.00000000 | CLA |
| 228.66480000 | 70.35740000 | 0.00000000 | CLA |
| 221.99440000 | 80.03840000 | 0.00000000 | CLA |
| 214.77300000 | 89.38730000 | 0.00000000 | CLA |
| 207.03120000 | 98.38680000 | 0.00000000 | CLA |
| 198.80000000 | 107.02060000 | 0.00000000 | CLA |
| 190.11060000 | 115.27340000 | 0.00000000 | CLA |
| 180.99430000 | 123.13090000 | 0.00000000 | CLA |
| 171.48180000 | 130.57960000 | 0.00000000 | CLA |
| 161.60350000 | 137.60700000 | 0.00000000 | CLA |
| 151.38900000 | 144.20150000 | 0.00000000 | CLA |
| 140.86730000 | 150.35200000 | 0.00000000 | CLA |
| 130.06640000 | 156.04850000 | 0.00000000 | CLA |
| 119.01330000 | 161.28160000 | 0.00000000 | CLA |
| 107.73430000 | 166.04280000 | 0.00000000 | CLA |
| 96.25480000 | 170.32420000 | 0.00000000 | CLA |
| 84.59910000 | 174.11880000 | 0.00000000 | CLA |
| 72.79120000 | 177.42040000 | 0.00000000 | CLA |
| 60.85400000 | 180.22340000 | 0.00000000 | CLA |
| 48.81000000 | 182.52330000 | 0.00000000 | CLA |
| 36.68120000 | 184.31610000 | 0.00000000 | CLA |
| 24.48910000 | 185.59880000 | 0.00000000 | CLA |
| 12.25500000 | 186.36930000 | 0.00000000 | CLA |
| 0.00000000 | 186.62630000 | 0.00000000 | CLA |
| −12.25500000 | 186.36930000 | 0.00000000 | CLA |
| −24.48910000 | 185.59880000 | 0.00000000 | CLA |
| −36.68120000 | 184.31610000 | 0.00000000 | CLA |
| −48.81000000 | 182.52330000 | 0.00000000 | CLA |
| −60.85400000 | 180.22340000 | 0.00000000 | CLA |
| −72.79120000 | 177.42040000 | 0.00000000 | CLA |
| −84.59910000 | 174.11880000 | 0.00000000 | CLA |
| −96.25480000 | 170.32420000 | 0.00000000 | CLA |
| −107.73430000 | 166.04280000 | 0.00000000 | CLA |
| −119.01330000 | 161.28160000 | 0.00000000 | CLA |
| −130.06640000 | 156.04850000 | 0.00000000 | CLA |
| −140.86730000 | 150.35200000 | 0.00000000 | CLA |
| −151.38900000 | 144.20150000 | 0.00000000 | CLA |
| −161.60350000 | 137.60700000 | 0.00000000 | CLA |
| −171.48180000 | 130.57960000 | 0.00000000 | CLA |
| −180.99430000 | 123.13090000 | 0.00000000 | CLA |
| −190.11060000 | 115.27340000 | 0.00000000 | CLA |
| −198.80000000 | 107.02060000 | 0.00000000 | CLA |
| −207.03120000 | 98.38680000 | 0.00000000 | CLA |
| −214.77300000 | 89.38730000 | 0.00000000 | CLA |
| −221.99440000 | 80.03840000 | 0.00000000 | CLA |
| −228.66480000 | 70.35740000 | 0.00000000 | CLA |
| −234.75450000 | 60.36280000 | 0.00000000 | CLA |
| −240.23500000 | 50.07390000 | 0.00000000 | CLA |
| −245.07930000 | 39.51170000 | 0.00000000 | CLA |
| −249.26230000 | 28.69770000 | 0.00000000 | CLA |
| −252.76110000 | 17.65520000 | 0.00000000 | CLA |
| −255.55540000 | 6.40820000 | 0.00000000 | CLA |
| −257.62740000 | −5.01790000 | 0.00000000 | CLA |
| −258.96260000 | −16.59660000 | 0.00000000 | CLA |
| −259.54960000 | −28.30030000 | 0.00000000 | CLA |
| −259.38010000 | −40.10040000 | 0.00000000 | CLA |
| −258.44930000 | −51.96710000 | 0.00000000 | CLA |
| −256.75560000 | −63.86940000 | 0.00000000 | CLA |
| −254.30090000 | −75.77540000 | 0.00000000 | CLA |
| −251.09000000 | −87.65220000 | 0.00000000 | CLA |
| −247.13070000 | −99.46550000 | 0.00000000 | CLA |
| −242.43390000 | −111.18030000 | 0.00000000 | CLA |
| −237.01280000 | −122.76050000 | 0.00000000 | CLA |
| −230.88330000 | −134.16890000 | 0.00000000 | CLA |
| −224.06330000 | −145.36750000 | 0.00000000 | CLA |
| −218.96183500 | −152.82525200 | 0.00000000 | CLA |

The projection optical unit 7 has an image-side numerical aperture of 0.55. In an imaging light plane parallel to the xz-plane (sagittal view according to FIG. 5), the projection optical unit 8 has a reduction factor $\beta_x$ of 4.00. In the yz-plane perpendicular thereto (meridional plane according to FIG. 2), the projection optical unit 7 has a reduction factor $\beta_y$ of 8.00. An object-side chief ray angle is 5.1°. This angle denotes the angle of a chief ray of a central object field point with respect to a normal to the object plane 5. A pupil obscuration of the projection optical unit 7 is 13% of the numerical aperture of the projection optical unit 7. Hence, a surface portion of $0.13^2$ of a pupil of the projection optical unit 7 is obscured. An object-image offset do's is approximately 2050 mm. The mirrors of the projection optical unit 7 can be accommodated in a parallelepiped having xyz-edge lengths of 924 mm×2452 mm×1639 mm.

The object plane 5 runs parallel to the image plane 9.

A working distance between the mirror M9 closest to the wafer and the image plane 9 is 90 mm. A mean wavefront aberration rms is 5.80 mλ, that is to say is defined in a manner dependent on the design wavelength.

The mirrors M1, M5, M6, M8 and M10 have negative radius values, that is to say in principle are concave mirrors. The mirrors M2 and M9 have positive radius values, that is to say in principle are convex mirrors.

The mirrors M3, M4 and M7 have different signs with regard to their x- and y-radius values, that is to say have a saddle surface basic shape.

The stop AS is arranged spatially between the penultimate mirror M9 in the beam path and the last mirror M10 in the beam path.

The stop AS serves for predefining a section 18 of an outer marginal contour 19 of the pupil of the projection optical unit 7. The marginal contour 19 of the pupil lies in the stop plane $E_{AS}$ and is shown in the sectional illustration according to FIG. 4. In this case, the marginal contour section 18 provided by the stop AS covers an azimuth angle B around an intersection point Z of the coordinate axis z through the stop plane $E_{AS}$, which lies at a pupil center. In this azimuth angle range B, the stop AS delimits an imaging light partial beam $3_{M9M10}$ in the beam path between the mirrors M9 and M10 (cf. FIGS. 2 and 3). In the rest of the azimuth angle range M (cf. FIG. 4), the stop AS does not have a stop effect for the imaging light 3, that is to say in particular does not delimit an imaging light partial beam $3_{M10W}$ between the mirror M10 and the image field 8, that is to say the wafer 11. In this remaining azimuth angle range M, the system pupil is delimited by the other stops AS2 to AS4.

The stop azimuth range B corresponds to an azimuth range around a center of the pupil that is greater than 180°.

Figure 4:
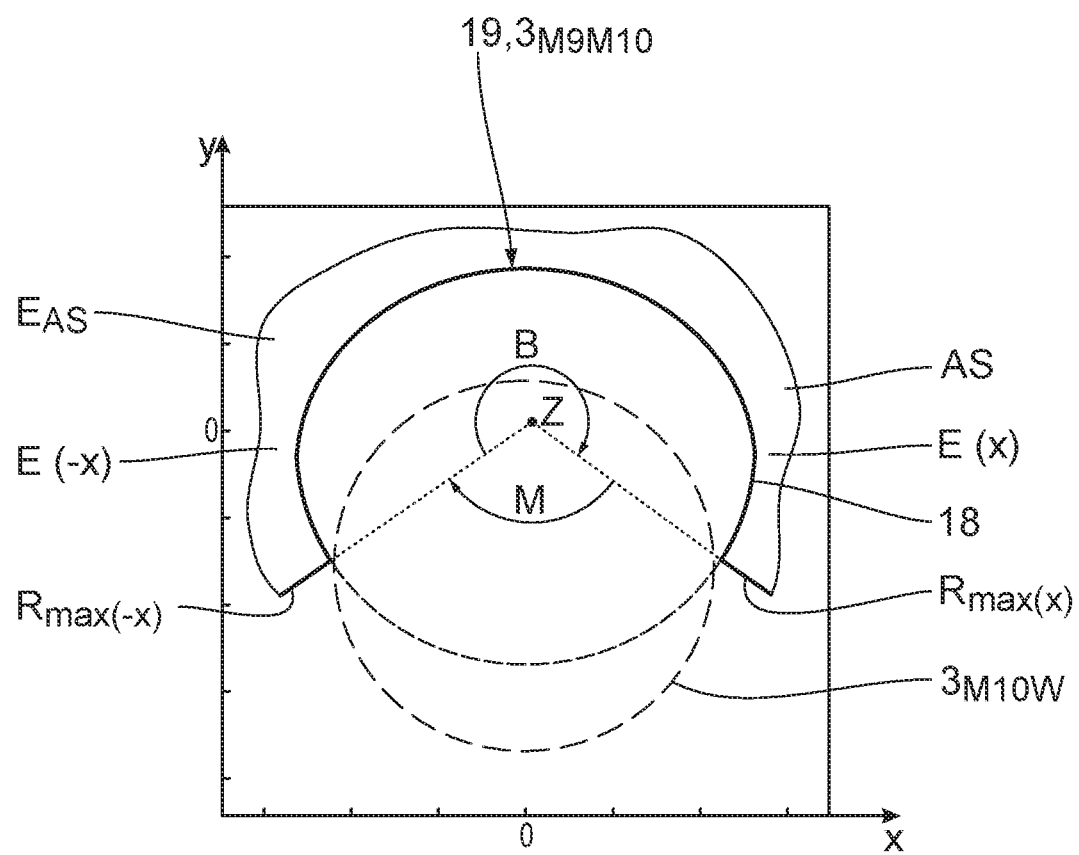
FIG. 4 shows a sectional view in accordance with plane IV in FIG. 3, with illustration of envelopes of imaging light partial beams in the beam path on the one hand between the penultimate mirror and the image field, and on the other hand between the last mirror and the image field.

In the embodiment according to FIG. 4, the azimuth range around the center of the pupil that covers the outer marginal contour of the pupil from the stop AS is approximately 240°. The azimuth range can alternatively also be 200°, 210°, 220° or 230° and can also be greater than 240°, for example 250°, 260°, 280°, 300°, 320°, 340°, and can also be even greater. In particular, the azimuth range can be 360°, such that the entire outer marginal contour of the pupil of the imaging optical unit is predefined in an embodiment of the stop AS.

The stop AS is embodied in a plane fashion, that is to say in a manner lying in exactly one plane.

The stop AS, in the x-direction perpendicular to the object displacement direction y, delimits both extreme marginal positions E(−x) and E(x) of the outer marginal contour 19 of the pupil (cf. FIG. 4).

FIG. 5 shows a sagittal view of the projection optical unit 7.

Figure 6:
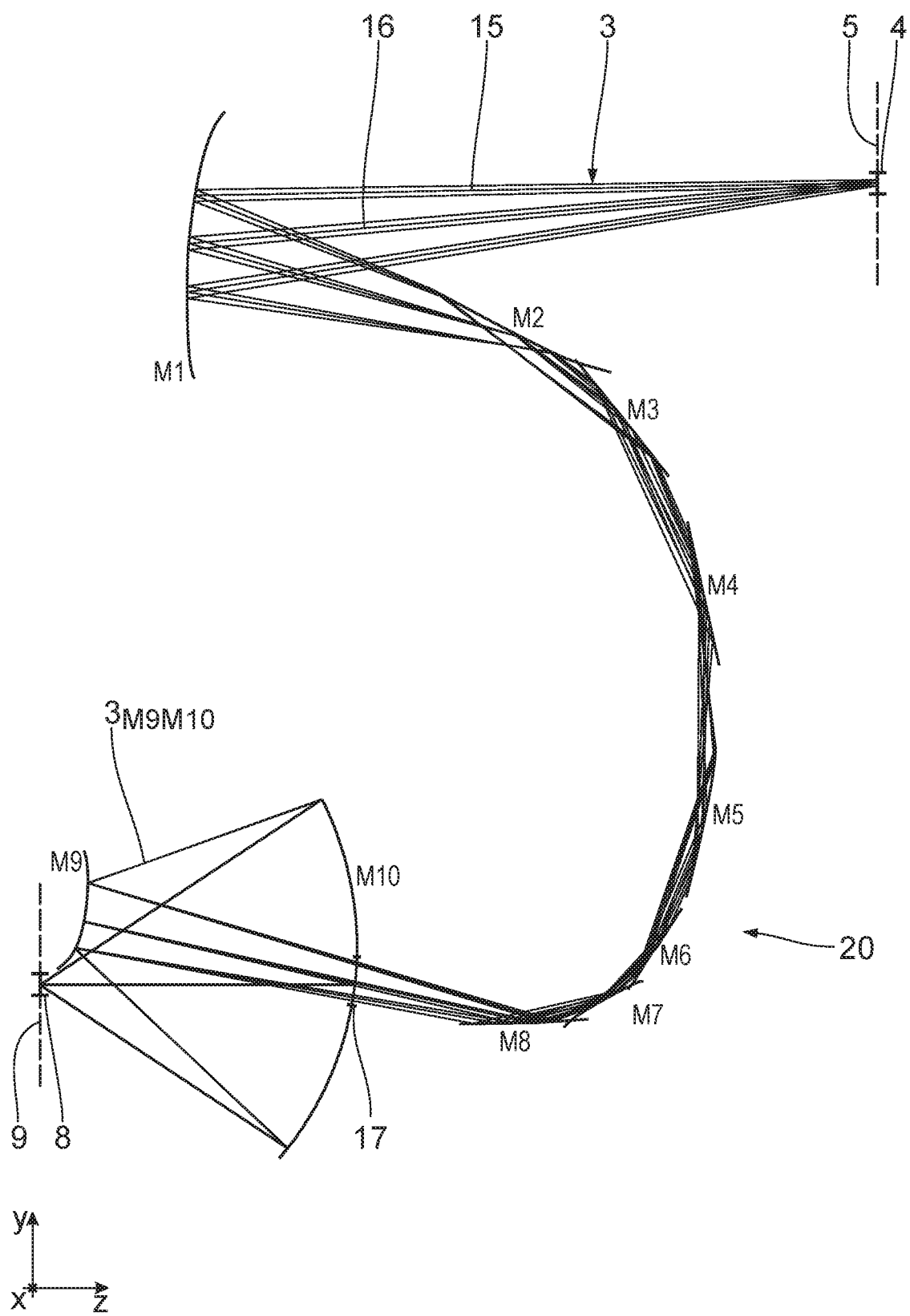
FIGS. 6 to 9 show illustrations similar to FIGS. 2 to 5 of a further embodiment of an imaging optical unit, usable as a projection lens in the projection exposure apparatus according to FIG. 1.

With reference to FIG. 6, an explanation is given below of a further embodiment of a projection optical unit 20, which can be used instead of the projection optical unit 7 in the projection exposure apparatus 1 according to FIG. 1. Components and functions which have already been explained above in the context of FIGS. 1 to 5 are denoted, where applicable, by the same reference signs and are not discussed again in detail.

The mirrors M1 to M10 are once again embodied as free-form surface mirrors for which the free-form surface equation (1) indicated above holds true. The optical design data from the projection optical unit 20 can be gathered from the following tables, which, in terms of their design, correspond to the tables for the projection optical unit 7 according to FIG. 2.

TABLE 1

| for FIG. 6 | |
|---|---|
| Exemplary embodiment | FIG. 6 |
| NA | 0.55 |
| Wavelength | 13.5 nm |
| Field dimension x | 26.0 mm |
| Field dimension y | 1.0 mm |
| Field curvature | −0.012345 1/mm |
| Stop | AS |

TABLE 2 for FIG. 6

| Surface | Radius_x[mm] | Power_x[1/mm] | Radius_y[mm] | Power_y[1/mm] | Operating mode |
|---|---|---|---|---|---|
| M10 | −924.4981198 | 0.0021492 | −841.5674623 | 0.0023921 | REFL |
| M9 | 1845.8313982 | −0.0010835 | 356.4114777 | −0.0056115 | REFL |
| M8 | −807.7853011 | 0.0006289 | −16794.6817783 | 0.0004689 | REFL |
| M7 | −633.7019549 | 0.0007380 | 20332.8433550 | −0.0004206 | REFL |
| M6 | −1159.7877847 | 0.0003528 | −7078.0588424 | 0.0013813 | REFL |
| M5 | −7911.6202298 | 0.0000533 | −2197.1749958 | 0.0043148 | REFL |
| M4 | 6252.7176733 | −0.0000660 | −2753.7274849 | 0.0035212 | REFL |
| M3 | 1718.6984546 | −0.0002678 | −10060.7554809 | 0.0008638 | REFL |
| M2 | 1592.6268445 | −0.0002500 | 2592.5626309 | −0.0038746 | REFL |
| M1 | −2135.9876330 | 0.0009216 | −1377.1202039 | 0.0014756 | REFL |

TABLE 3a for FIG. 6

| Coeffi- | M10 | M9 | M8 |
|---|---|---|---|
| KY | 0.00000000 | 0.00000000 | 0.00000000 |
| KX | 0.00000000 | 0.00000000 | 0.00000000 |
| RX | −924.49811980 | 1845.83139800 | −807.78530110 |
| C7 | 5.32161644e−09 | −7.17957299e−07 | 3.61958396e−07 |
| C9 | 1.2051462e−08 | 1.48021766e−06 | 4.61852728e−08 |
| C10 | −4.28738318e−12 | 3.94779844e−10 | 1.36275822e−10 |
| C12 | −3.49709402e−11 | 2.67402017e−09 | 4.92199166e−11 |
| C14 | −9.81786584e−12 | 6.31481582e−09 | −4.23949539e−10 |
| C16 | −3.40219667e−15 | −2.74047503e−12 | 1.12548598e−12 |
| C18 | 1.60335869e−14 | 2.04228406e−14 | 3.71761249e−13 |
| C20 | 1.30399612e−14 | 3.2725238e−11 | −2.05971586e−12 |
| C21 | −1.15274335e−17 | 2.35879877e−15 | 1.09054091e−15 |
| C23 | −6.9260806e−17 | 1.00239611e−14 | 1.70911423e−15 |
| C25 | −7.13524377e−17 | 5.05529889e−14 | −3.62622238e−15 |
| C27 | −1.67322747e−17 | 1.78538542e−13 | −7.36849912e−15 |
| C29 | −7.92528578e−21 | −4.11347975e−18 | −2.59696939e−18 |
| C31 | 1.27834004e−20 | −5.83032641e−17 | 1.25679501e−17 |
| C33 | 3.27119661e−20 | 1.71591989e−16 | −1.04543394e−17 |
| C35 | 1.71377495e−20 | 1.22876874e−15 | −3.91086555e−17 |
| C36 | −1.89551894e−23 | −4.14843428e−22 | 5.26679107e−21 |
| C38 | −1.11996388e−22 | 1.06656248e−19 | 2.8502374e−20 |
| C40 | −1.96750203e−22 | 2.08419251e−19 | 6.3260457e−20 |
| C42 | −1.2392523e−22 | 8.95301505e−19 | 4.7233819e−21 |
| C44 | −2.47458966e−23 | 8.36809183e−18 | −2.27707911e−19 |
| C46 | −9.77909864e−27 | −1.02394711e−22 | 1.39450428e−23 |
| C48 | 5.19824336e−27 | −7.95041789e−23 | 1.68839235e−22 |
| C50 | 5.59498452e−26 | 8.75666056e−22 | 2.79254271e−22 |

TABLE 3a-continued for FIG. 6

| Coeffi- | M10 | M9 | M8 |
|---|---|---|---|
| C52 | 6.43656264e−26 | 4.60087068e−21 | −9.11661464e−23 |
| C54 | 1.96031627e−26 | 4.50459082e−20 | 1.98458883e−22 |
| C55 | −1.9734083e−29 | 2.61667221e−26 | −4.54521391e−26 |
| C57 | −1.39192995e−28 | −1.48955085e−25 | 1.23387971e−24 |
| C59 | −3.49342237e−28 | 2.18616238e−24 | 4.57708029e−24 |
| C61 | −3.79015472e−28 | 8.50729665e−24 | 6.06052772e−24 |
| C63 | −1.77868817e−28 | 2.63725246e−23 | −9.61661588e−26 |
| C65 | −2.61320106e−29 | 1.37431086e−22 | 9.18355997e−24 |
| C67 | −1.75320584e−32 | 1.91491617e−26 | −2.00093096e−27 |
| C69 | −1.49695509e−32 | −5.27938029e−27 | 2.16982668e−27 |
| C71 | 6.84912486e−32 | −5.29216183e−27 | −7.30096104e−27 |
| C73 | 1.54586906e−31 | 4.04146338e−26 | −4.93769708e−27 |
| C75 | 1.15783975e−31 | 2.37812676e−25 | −4.16594376e−26 |
| C77 | 4.14587364e−32 | 1.20314674e−24 | −1.62235584e−25 |
| C78 | −5.34426777e−35 | 4.49836368e−31 | 6.13330316e−30 |
| C80 | −4.27488688e−34 | 1.29694668e−29 | −1.62333428e−29 |
| C82 | −1.25436413e−33 | 3.24280489e−29 | −1.68167617e−28 |
| C84 | −1.71502766e−33 | 3.00254831e−29 | −4.89454528e−28 |
| C86 | −1.25734127e−33 | 7.46446045e−28 | −6.5895393e−28 |
| C88 | −5.19929261e−34 | 5.84363659e−27 | −1.5416679e−27 |
| C90 | −9.42013117e−35 | 2.61240017e−26 | −3.38007496e−27 |
| C92 | 1.00872668e−38 | −4.95175891e−33 | 1.78435553e−32 |
| C94 | −1.45968234e−39 | 2.0913161e−33 | 1.10022934e−32 |
| C96 | 2.49294655e−38 | 9.54156933e−32 | 1.00044858e−30 |
| C98 | 1.25738947e−37 | −7.47916509e−33 | 1.98972461e−30 |
| C100 | 1.6844889e−37 | 7.35199153e−30 | −3.47483305e−30 |
| C102 | 7.66863005e−38 | 5.82871085e−29 | −1.47027148e−29 |
| C104 | −1.4887687e−38 | 2.15570834e−28 | −2.0886266e−29 |
| C105 | 3.84331333e−41 | −2.72151554e−36 | −1.09100622e−34 |
| C107 | 4.50330303e−40 | −6.8970507e−35 | 3.91399908e−34 |
| C109 | 1.60900752e−39 | −2.41557224e−34 | 4.01031765e−33 |
| C111 | 2.46751199e−39 | 1.07560857e−33 | 1.8289791e−32 |
| C113 | 1.94052198e−39 | 8.96263507e−33 | 2.87152163e−32 |
| C115 | 9.9606188e−40 | 4.77961552e−32 | −4.19223781e−33 |
| C117 | 4.55475999e−40 | 2.14647641e−31 | −4.42634085e−32 |
| C119 | 9.96424428e−41 | 6.08163641e−31 | −4.46533131e−32 |
| C121 | −6.67748909e−44 | 0 | 0 |
| C123 | −1.35652075e−43 | 0 | 0 |
| C125 | 1.98636308e−43 | 0 | 0 |
| C127 | 1.25607622e−42 | 0 | 0 |
| C129 | 2.10051386e−42 | 0 | 0 |
| C131 | 1.77289428e−42 | 0 | 0 |
| C133 | 7.94693346e−43 | 0 | 0 |
| C135 | 1.74862061e−43 | 0 | 0 |
| C136 | −1.77390976e−46 | 0 | 0 |
| C138 | −2.00142247e−45 | 0 | 0 |
| C140 | −8.6258998e−45 | 0 | 0 |
| C142 | −1.91465627e−44 | 0 | 0 |
| C144 | −2.50271596e−44 | 0 | 0 |
| C146 | −2.03958823e−44 | 0 | 0 |
| C148 | −1.04613962e−44 | 0 | 0 |
| C150 | −3.18867421e−45 | 0 | 0 |
| C152 | −4.17582475e−46 | 0 | 0 |

TABLE 3b for FIG. 6

| Coeffi- | M7 | M6 | M5 |
|---|---|---|---|
| KY | 0.00000000 | 0.00000000 | 0.00000000 |
| KX | 0.00000000 | 0.00000000 | 0.00000000 |
| RX | −633.70195490 | −1159.78778500 | −7911.62023000 |
| C7 | −3.6838108e−08 | 8.9762673e−08 | 1.29208819e−08 |
| C9 | 1.66051547e−07 | 5.4606184e−08 | −4.52621083e−08 |
| C10 | 2.70786958e−11 | −4.84436976e−10 | −5.84676904e−10 |
| C12 | −4.05365907e−10 | 4.4034394e−11 | 3.29353371e−11 |
| C14 | 1.17570885e−09 | −8.49494866e−10 | 3.27765845e−11 |
| C16 | 5.32058235e−13 | −1.22366579e−12 | −4.06185258e−13 |
| C18 | −2.33907349e−12 | 3.31495258e−12 | −3.0655881e−13 |
| C20 | 1.03622586e−11 | 4.74017946e−12 | −9.90515078e−14 |
| C21 | 1.84951658e−17 | 4.70815441e−16 | 6.8177486e−16 |
| C23 | 1.97362743e−16 | −5.63918759e−15 | 1.78311332e−16 |

TABLE 3b-continued for FIG. 6

| Coeffi- | M7 | M6 | M5 |
|---|---|---|---|
| C25 | −4.50645748e−14 | −2.04438614e−14 | 1.92769745e−15 |
| C27 | 1.22197136e−13 | −4.46320586e−14 | 1.11134948e−15 |
| C29 | −8.3397015e−19 | 3.12037967e−18 | 1.20925734e−18 |
| C31 | 5.73336291e−17 | 2.52930984e−17 | −2.68755339e−18 |
| C33 | −4.26965471e−16 | 2.57659349e−16 | −5.94759876e−18 |
| C35 | 1.12309508e−15 | 3.62043368e−16 | −4.78247891e−18 |
| C36 | −2.54002154e−21 | −2.33285817e−21 | 8.64176325e−21 |
| C38 | 6.58698589e−22 | 6.78093367e−21 | 2.69603122e−21 |
| C40 | 9.19834216e−19 | −6.09316184e−19 | 1.90190625e−20 |
| C42 | −5.20603364e−18 | −2.48560476e−18 | 2.06136053e−20 |
| C44 | 1.95177251e−17 | −3.71987432e−18 | 1.52178482e−20 |
| C46 | 5.11031274e−23 | −2.36475219e−24 | 1.40723013e−23 |
| C48 | −5.22351362e−22 | 1.08955249e−21 | −1.74886691e−23 |
| C50 | 1.29955621e−20 | 6.28062297e−21 | −1.31280422e−22 |
| C52 | −7.19352591e−20 | 2.83502526e−20 | −1.33189978e−22 |
| C54 | 3.01583882e−19 | 4.05968238e−20 | −5.11578136e−23 |
| C55 | −3.2378259e−26 | 5.04920803e−26 | −9.74226056e−26 |
| C57 | 2.56114803e−26 | −1.66126857e−24 | 1.25073538e−25 |
| C59 | −2.15568526e−23 | −1.21962666e−23 | 3.61644254e−25 |
| C61 | 7.54597503e−23 | −7.85294647e−23 | 6.17670028e−25 |
| C63 | −1.37768633e−21 | −2.60819335e−22 | 3.1972004e−25 |
| C65 | −9.91159698e−22 | −3.82043453e−22 | 5.14604952e−26 |
| C67 | 8.86143266e−29 | 1.38719494e−27 | −4.85096213e−29 |
| C69 | 2.95926995e−28 | 1.1409927e−26 | −1.52883817e−29 |
| C71 | −4.08946521e−25 | 1.70193798e−26 | −2.99192047e−28 |
| C73 | 1.1764e−24 | 5.79647838e−25 | 1.27326956e−27 |
| C75 | −1.82271068e−23 | 1.8185183e−24 | 2.14215183e−27 |
| C77 | −6.0476105e−23 | 2.47496013e−24 | −2.43586456e−28 |
| C78 | −1.46974123e−31 | −2.48880617e−30 | 2.2910216e−30 |
| C80 | −1.62035317e−29 | −3.63910799e−30 | −2.10355105e−30 |
| C82 | 2.64119709e−28 | −1.39124488e−28 | −3.56165247e−30 |
| C84 | −2.75435112e−27 | −9.92371827e−28 | −1.25073816e−29 |
| C86 | 6.06493358e−26 | −2.9562807e−27 | −1.02346615e−29 |
| C88 | −1.82794269e−25 | −7.99387324e−27 | 1.25693216e−30 |
| C90 | 8.10897778e−25 | −1.01333935e−26 | 6.64972771e−30 |
| C92 | −5.94852836e−33 | −2.20554773e−33 | 1.22559104e−33 |
| C94 | 7.23973112e−32 | 1.10525284e−31 | −1.24849687e−32 |
| C96 | 7.40539289e−30 | −4.613537e−32 | −3.29652704e−32 |
| C98 | 4.88216265e−30 | 4.80483016e−30 | −8.41705133e−32 |
| C100 | 9.65449531e−28 | 6.23756899e−30 | −1.57134898e−31 |
| C102 | −1.70876067e−27 | 2.1445453e−29 | −1.2032548e−31 |
| C104 | 2.67082934e−26 | 2.28654521e−29 | −3.36577402e−32 |
| C105 | 2.35094421e−36 | 2.08468354e−35 | −1.08251776e−35 |
| C107 | 3.37747137e−34 | −1.04397603e−34 | 3.142163e−35 |
| C109 | 7.70896596e−34 | 2.85346997e−34 | 8.01180965e−35 |
| C111 | 6.84579774e−32 | −8.80664689e−35 | 3.89769754e−34 |
| C113 | −9.31004972e−32 | −9.19882787e−33 | 7.80016296e−34 |
| C115 | 5.48180337e−30 | −1.39857273e−33 | 7.27970094e−34 |
| C117 | −9.40923091e−30 | −2.85191959e−32 | 3.44660803e−34 |
| C119 | 1.58250782e−28 | −2.04899764e−32 | 5.28320959e−35 |

TABLE 3c for FIG. 6

| Coeffi- | M4 | M3 | M2 |
|---|---|---|---|
| KY | 0.00000000 | 0.00000000 | 0.00000000 |
| KX | 0.00000000 | 0.00000000 | 0.00000000 |
| RX | 6252.71767300 | 1718.69845500 | 1592.62684400 |
| C7 | 2.02039657e−07 | −7.72442186e−08 | −2.81200257e−07 |
| C9 | 6.26194854e−08 | −6.39011454e−08 | −4.33420894e−07 |
| C10 | −1.17096485e−10 | 5.38504965e−10 | 2.16914992e−10 |
| C12 | 1.65918593e−10 | 1.54474735e−10 | −2.43233271e−10 |
| C14 | 2.6047855e−11 | −5.67012949e−11 | 1.0908048e−09 |
| C16 | 1.53352973e−13 | −1.28128634e−12 | −1.3249687e−12 |
| C18 | 6.85280998e−14 | 3.29016521e−13 | 2.3245033e−12 |
| C20 | 1.33134745e−14 | −7.9135182e−14 | −2.74288101e−12 |
| C21 | 9.63392843e−16 | −2.23006179e−16 | −3.54173468e−16 |
| C23 | −2.56356327e−16 | 8.08610012e−16 | 5.15456653e−15 |
| C25 | −4.93143601e−16 | −1.64061139e−16 | −1.06774698e−14 |
| C27 | −3.50827102e−17 | −8.3638218e−18 | 5.96789915e−15 |
| C29 | −1.32470314e−18 | 2.06883208e−18 | 1.70541615e−18 |

TABLE 3c-continued for FIG. 6

| Coeffi- | M4 | M3 | M2 |
|---|---|---|---|
| C31 | −1.08456401e−18 | −3.75046097e−18 | −2.42446489e−17 |
| C33 | −3.23480928e−19 | 1.52741866e−18 | 4.43191025e−17 |
| C35 | −3.72075346e−19 | 1.62584985e−18 | −1.05861269e−17 |
| C36 | −3.85707039e−21 | −2.85425871e−21 | 1.53834046e−21 |
| C38 | 7.16357253e−21 | 4.79674043e−21 | −1.1251108e−20 |
| C40 | −1.76766744e−21 | 6.62315222e−22 | 1.18315789e−19 |
| C42 | −5.70159933e−21 | −2.6546097e−21 | −1.77703731e−19 |
| C44 | −3.65158025e−21 | 1.5355861e−20 | 1.37862764e−20 |
| C46 | −2.99726604e−23 | −7.26058549e−23 | −2.55922076e−23 |
| C48 | −4.17503344e−23 | −9.21476496e−23 | 1.00193833e−22 |
| C50 | −4.7884568e−23 | −2.35567601e−22 | −5.31735424e−22 |
| C52 | −6.91516977e−24 | −1.35526865e−22 | 6.79507546e−22 |
| C54 | 1.98546253e−23 | 9.61975988e−23 | 4.01660209e−23 |
| C55 | −1.94031018e−26 | 1.56888015e−25 | −1.38213528e−26 |
| C57 | −3.42382432e−25 | 2.2750218e−25 | 1.79376182e−25 |
| C59 | −2.2756817e−25 | −1.23549695e−25 | −5.94897934e−25 |

TABLE 3c-continued for FIG. 6

| Coeffi- | M4 | M3 | M2 |
|---|---|---|---|
| C61 | 2.01539859e−25 | 2.29974662e−25 | 2.27901415e−24 |
| C63 | 4.95631548e−25 | 8.59833428e−25 | −2.22922414e−24 |
| C65 | 1.12176727e−25 | 1.26876311e−24 | −7.70058057e−25 |
| C67 | 9.06942404e−28 | 9.3079309e−28 | 3.74223228e−28 |
| C69 | 1.9957938e−27 | 4.99157193e−27 | −9.62902214e−28 |
| C71 | 3.12476201e−27 | 1.58761398e−26 | 2.15189986e−27 |
| C73 | 4.54981924e−27 | 1.53821757e−26 | −8.59545995e−27 |
| C75 | 6.59335485e−28 | 3.62238546e−27 | 5.36715829e−27 |
| C77 | −1.58015986e−27 | −1.19949042e−27 | 5.14863336e−27 |
| C78 | 4.37655985e−30 | −2.15256015e−30 | −6.68041182e−32 |
| C80 | 8.62343063e−30 | −8.27474872e−30 | −2.88698633e−30 |
| C82 | 1.3965552e−29 | −1.85964202e−29 | 2.97808799e−30 |
| C84 | 1.2610299e−29 | −5.63075807e−29 | −9.25513518e−30 |
| C86 | −4.82567841e−30 | −7.58802797e−29 | 2.1567675e−29 |
| C88 | −1.35566233e−29 | −6.2816052e−29 | −8.2378632e−30 |
| C90 | 8.35698293e−31 | −2.48292667e−29 | −1.8363031e−29 |
| C92 | −6.20912191e−33 | −1.53848466e−33 | −2.72722676e−33 |
| C94 | −3.03339233e−32 | −5.56751434e−32 | 9.35668771e−33 |
| C96 | −4.15846221e−32 | −2.81174802e−31 | 1.01318148e−32 |
| C98 | −1.20240425e−31 | −5.69729421e−31 | 4.31201041e−32 |
| C100 | −1.23999978e−31 | −3.40400557e−31 | −2.58821352e−32 |
| C102 | 1.77507014e−33 | −9.97858945e−32 | 6.91936623e−33 |
| C104 | 3.83557979e−32 | 1.09580074e−31 | 3.45333625e−32 |
| C105 | −1.52261212e−35 | 5.38313447e−37 | 2.4018539e−36 |
| C107 | −7.96360046e−35 | 8.5583118e−35 | 1.94949839e−35 |
| C109 | −2.50162343e−34 | 3.84351739e−34 | −2.7269109e−35 |
| C111 | −2.81541874e−34 | 1.85492006e−33 | −5.57867255e−35 |
| C113 | −6.28531061e−34 | 2.60940268e−33 | −8.0628501e−35 |
| C115 | 2.25293161e−35 | 2.55655776e−33 | 6.48059264e−36 |
| C117 | 7.79107372e−35 | 1.01920129e−33 | −2.46632816e−36 |
| C119 | −1.12500845e−34 | 7.43677377e−34 | −2.70846382e−35 |

TABLE 3d for FIG. 6

| Coefficient | M1 |
|---|---|
| KY | 0.00000000 |
| KX | 0.00000000 |
| RX | −2135.98763300 |
| C7 | −3.62667214e−08 |
| C9 | −8.77001096e−09 |
| C10 | −7.9878408e−12 |
| C12 | 3.57622422e−11 |
| C14 | 5.67666306e−11 |
| C16 | −1.00670933e−14 |
| C18 | −6.43363507e−14 |
| C20 | 3.49263438e−14 |
| C21 | −1.83622059e−18 |
| C23 | 1.63146414e−17 |
| C25 | 2.33281554e−16 |
| C27 | −2.13403252e−16 |
| C29 | −7.17734463e−22 |
| C31 | −7.76916167e−20 |
| C33 | −2.45391831e−19 |
| C35 | 9.06895125e−19 |
| C36 | −2.87240432e−24 |
| C38 | −5.67479156e−24 |
| C40 | 2.53075334e−22 |
| C42 | 2.33441297e−22 |
| C44 | −4.90816027e−21 |
| C46 | −1.82993123e−26 |
| C48 | 1.40735408e−25 |
| C50 | −1.62994831e−25 |
| C52 | 4.12295522e−24 |
| C54 | 2.26175423e−23 |
| C55 | 6.84620783e−30 |
| C57 | −8.9211373e−29 |
| C59 | 3.99552919e−28 |
| C61 | 2.87701829e−26 |
| C63 | 7.90515964e−26 |
| C65 | 4.93963599e−26 |

TABLE 3d-continued for FIG. 6

| Coefficient | M1 |
|---|---|
| C67 | 8.37008672e−32 |
| C69 | −9.8548077e−31 |
| C71 | −7.50758997e−30 |
| C73 | −6.72582496e−30 |
| C75 | 2.5702957e−28 |
| C77 | −1.08487883e−27 |
| C78 | 4.88158898e−36 |
| C80 | 1.55182242e−33 |
| C82 | 1.52095525e−32 |
| C84 | −1.27781492e−31 |
| C86 | −1.81913568e−30 |
| C88 | −5.89459163e−30 |
| C90 | 2.69055495e−30 |
| C92 | −4.03243187e−38 |
| C94 | 3.64827588e−36 |
| C96 | 3.2629352e−35 |
| C98 | 1.58289449e−34 |
| C100 | −1.41502554e−34 |
| C102 | −7.52721979e−33 |
| C104 | 1.42550505e−32 |
| C105 | −9.85463233e−41 |
| C107 | −4.7133732e−39 |
| C109 | −9.62905307e−38 |
| C111 | −4.88592887e−38 |
| C113 | 5.89605443e−36 |
| C115 | 4.37586765e−35 |
| C117 | 1.2944388e−34 |
| C119 | −5.79847892e−35 |

TABLE 4a for FIG. 6

| Surface | DCX | DCY | DCZ |
|---|---|---|---|
| Image | 0.00000000 | 0.00000000 | 0.00000000 |
| M10 | 0.00000000 | 0.00000000 | 805.12545493 |
| AS | 0.00000000 | 121.91685762 | 283.85220626 |
| M9 | 0.00000000 | 161.70815863 | 113.71871405 |
| M8 | 0.00000000 | −95.26534725 | 1237.21684296 |
| M7 | 0.00000000 | −33.77425023 | 1447.75579022 |
| M6 | 0.00000000 | 65.18321239 | 1551.64751609 |
| M5 | −0.00000000 | 416.29245364 | 1699.16961083 |
| M4 | −0.00000000 | 1004.20719186 | 1696.34134424 |
| M3 | −0.00000000 | 1452.13094016 | 1490.08513977 |
| M2 | 0.00000000 | 1660.63260708 | 1219.01552868 |
| M1 | 0.00000000 | 1898.51696847 | 380.25896967 |
| Object | 0.00000000 | 2052.66210418 | 2142.14593325 |

TABLE 4b for FIG. 6

| Surface | TLA[deg] | TLB[deg] | TLC[deg] |
|---|---|---|---|
| Image | −0.00000000 | 0.00000000 | −0.00000000 |
| M10 | 6.58193819 | 0.00000000 | −0.00000000 |
| AS | −11.93243779 | 180.00000000 | 0.00000000 |
| M9 | 193.02365372 | 0.00000000 | −0.00000000 |
| M8 | 88.30109261 | 0.00000000 | −0.00000000 |
| M7 | 60.05609350 | 0.00000000 | −0.00000000 |
| M6 | 34.59181790 | −0.00000000 | 0.00000000 |
| M5 | 11.25728686 | −0.00000000 | −0.00000000 |
| M4 | −12.50018064 | −0.00000000 | −0.00000000 |
| M3 | −38.57896098 | −0.00000000 | −0.00000000 |
| M2 | −63.29951574 | 0.00000000 | −0.00000000 |
| M1 | 185.41707922 | 0.00000000 | −0.00000000 |
| Object | 0.00000000 | −0.00000000 | −0.00000000 |

TABLE 5 for FIG. 6

| Surface | Angle of incidence[deg] | Reflectivity |
|---|---|---|
| M10 | 6.54595976 | 0.66117442 |
| M9 | 0.00927643 | 0.66565898 |
| M8 | 75.28639991 | 0.80872354 |
| M7 | 76.47603147 | 0.82797484 |
| M6 | 78.19600441 | 0.85363243 |
| M5 | 77.82111064 | 0.84823702 |
| M4 | 78.09660546 | 0.85221183 |
| M3 | 76.69476435 | 0.83137252 |
| M2 | 78.51546985 | 0.85815129 |
| M1 | 10.19565951 | 0.65421761 |
| Overall transmis- | | 0.0849 |

TABLE 6

Stop polygon AS in the imaging beam path between M9 and M10

| X[mm] | Y[mm] | Z[mm] | Type |
|---|---|---|---|
| 0.00000000 | 186.44396300 | 0.00000000 | CLA |
| −7.35372500 | 186.35147200 | 0.00000000 | CLA |
| −14.70293000 | 186.07403500 | 0.00000000 | CLA |
| −22.04308600 | 185.61182900 | 0.00000000 | CLA |
| −29.36964700 | 184.96518200 | 0.00000000 | CLA |
| −36.67804500 | 184.13440100 | 0.00000000 | CLA |
| −43.96368200 | 183.12003500 | 0.00000000 | CLA |
| −51.22191700 | 181.92270400 | 0.00000000 | CLA |
| −58.44805800 | 180.54312300 | 0.00000000 | CLA |
| −65.63737700 | 178.98213000 | 0.00000000 | CLA |
| −72.78506700 | 177.24065500 | 0.00000000 | CLA |
| −79.88623100 | 175.31975300 | 0.00000000 | CLA |
| −86.93596800 | 173.22057400 | 0.00000000 | CLA |
| −93.92919900 | 170.94433700 | 0.00000000 | CLA |
| −100.86081300 | 168.49243500 | 0.00000000 | CLA |
| −107.72561700 | 165.86632300 | 0.00000000 | CLA |
| −114.51817800 | 163.06745500 | 0.00000000 | CLA |
| −121.23320200 | 160.09761200 | 0.00000000 | CLA |
| −127.86509600 | 156.95849800 | 0.00000000 | CLA |
| −134.40820300 | 153.65200500 | 0.00000000 | CLA |
| −140.85671700 | 150.17999100 | 0.00000000 | CLA |
| −147.20471200 | 146.54456300 | 0.00000000 | CLA |
| −153.44628600 | 142.74788800 | 0.00000000 | CLA |
| −159.57526400 | 138.79218000 | 0.00000000 | CLA |
| −165.58539900 | 134.67982000 | 0.00000000 | CLA |
| −171.47033600 | 130.41326100 | 0.00000000 | CLA |
| −177.22373200 | 125.99505700 | 0.00000000 | CLA |
| −182.83880500 | 121.42778500 | 0.00000000 | CLA |
| −188.30943000 | 116.71453300 | 0.00000000 | CLA |
| −193.62848600 | 111.85789200 | 0.00000000 | CLA |
| −198.78943200 | 106.86098000 | 0.00000000 | CLA |
| −203.78559400 | 101.72694700 | 0.00000000 | CLA |
| −208.61006200 | 96.45897500 | 0.00000000 | CLA |
| −213.25621900 | 91.06052500 | 0.00000000 | CLA |
| −217.71726100 | 85.53509300 | 0.00000000 | CLA |
| −221.64901400 | 80.02685000 | 0.75883100 | CLA |
| −224.92026500 | 74.62899500 | 2.51098300 | CLA |
| −227.96741300 | 69.17817200 | 4.24784700 | CLA |
| −227.95344500 | 65.14191000 | 12.02424500 | CLA |
| −227.12122900 | 61.57814900 | 20.84485000 | CLA |
| −226.13600200 | 58.16537900 | 29.29174900 | CLA |
| −225.00391900 | 54.89925100 | 37.37569500 | CLA |
| −223.73072400 | 51.77538400 | 45.10754800 | CLA |
| −222.32096800 | 48.78916600 | 52.49869000 | CLA |
| −220.77884700 | 45.93608000 | 59.56032000 | CLA |
| −219.10785500 | 43.21147900 | 66.30394300 | CLA |
| −217.31114600 | 40.61084100 | 72.74070800 | CLA |
| −215.39130600 | 38.12963900 | 78.88190200 | CLA |
| −213.35065800 | 35.76334400 | 84.73869500 | CLA |
| −211.19147600 | 33.50760700 | 90.32183800 | CLA |
| −208.91541000 | 31.35813700 | 95.64194500 | CLA |
| −206.52437200 | 29.31065100 | 100.70964500 | CLA |
| −204.01998900 | 27.36108900 | 105.53499200 | CLA |
| −201.40409200 | 25.50539800 | 110.12799200 | CLA |
| −198.67828500 | 23.73971400 | 114.49825000 | CLA |

TABLE 6-continued

Stop polygon AS in the imaging beam path between M9 and M10

| X[mm] | Y[mm] | Z[mm] | Type |
|---|---|---|---|
| −195.84432600 | 22.06021900 | 118.65512200 | CLA |
| −192.90404400 | 20.46324100 | 122.60777000 | CLA |
| −189.85948300 | 18.94530500 | 126.36481000 | CLA |
| −186.71258400 | 17.50289700 | 129.93489500 | CLA |
| −183.46561700 | 16.13274600 | 133.32612800 | CLA |
| −180.12097900 | 14.83174200 | 136.54624500 | CLA |
| −176.68110900 | 13.59664400 | 139.60322200 | CLA |
| −173.14867400 | 12.42461700 | 142.50407800 | CLA |
| −169.52649800 | 11.31290900 | 145.25565800 | CLA |
| −165.81747500 | 10.25866300 | 147.86498500 | CLA |
| −162.02456000 | 9.25931400 | 150.33846500 | CLA |
| −158.15106700 | 8.31237400 | 152.68225100 | CLA |
| −154.20002700 | 7.41549400 | 154.90205700 | CLA |
| −150.17487800 | 6.56640100 | 157.00369200 | CLA |
| −146.07892700 | 5.76289700 | 158.99242700 | CLA |
| −141.91554000 | 5.00295700 | 160.87334600 | CLA |
| −137.68807700 | 4.28459200 | 162.65135200 | CLA |
| −133.39999600 | 3.60596600 | 164.33101000 | CLA |
| −129.05467700 | 2.96531800 | 165.91665100 | CLA |
| −124.65533100 | 2.36095400 | 167.41255500 | CLA |
| −120.20527800 | 1.79126700 | 168.82252900 | CLA |
| −115.70776900 | 1.25482400 | 170.15030200 | CLA |
| −111.16585800 | 0.75015100 | 171.39936900 | CLA |
| −106.58255900 | 0.27593600 | 172.57309400 | CLA |
| −101.96080900 | −0.16912300 | 173.67466600 | CLA |
| −97.30348300 | −0.58612700 | 174.70677900 | CLA |
| −92.61320100 | −0.97618500 | 175.67221000 | CLA |
| −87.89258900 | −1.34039400 | 176.57364900 | CLA |
| −83.14404000 | −1.67974700 | 177.41357200 | CLA |
| −78.36997500 | −1.99507900 | 178.19405200 | CLA |
| −73.57255500 | −2.28728800 | 178.91731600 | CLA |
| −68.75389700 | −2.55709000 | 179.58512000 | CLA |
| −63.91599300 | −2.80527500 | 180.19940100 | CLA |
| −59.06068500 | −3.03248700 | 180.76176400 | CLA |
| −54.18980800 | −3.23932800 | 181.27369700 | CLA |
| −49.30495700 | −3.42635500 | 181.73660500 | CLA |
| −44.40776200 | −3.59407000 | 182.15171600 | CLA |
| −39.49967000 | −3.74294100 | 182.52018300 | CLA |
| −34.72856800 | −5.38995400 | 181.76530200 | CLA |
| −29.78751600 | −5.57165600 | 181.99973400 | CLA |
| −24.83568700 | −5.70520100 | 182.21115500 | CLA |
| −19.85720300 | −5.45684800 | 182.63399600 | CLA |
| −14.87055900 | −4.88189700 | 183.22816000 | CLA |
| −9.89854300 | −4.30609100 | 183.76604500 | CLA |
| −4.94917700 | −4.28491600 | 183.86163300 | CLA |
| −0.00000000 | −4.29338300 | 183.88257600 | CLA |
| 4.94917700 | −4.28491600 | 183.86163600 | CLA |
| 9.89854300 | −4.30609100 | 183.76604500 | CLA |
| 14.87055900 | −4.88189700 | 183.22816000 | CLA |
| 19.85720300 | −5.45684800 | 182.63399600 | CLA |
| 24.83568700 | −5.70520100 | 182.21115500 | CLA |
| 29.78751600 | −5.57165600 | 181.99973400 | CLA |
| 34.72856800 | −5.38995400 | 181.76530200 | CLA |
| 39.49967000 | −3.74294100 | 182.52018300 | CLA |
| 44.40776200 | −3.59407000 | 182.15171600 | CLA |
| 49.30495700 | −3.42635500 | 181.73660500 | CLA |
| 54.18980800 | −3.23932800 | 181.27369700 | CLA |
| 59.06068500 | −3.03248700 | 180.76176400 | CLA |
| 63.91599100 | −2.80527500 | 180.19940100 | CLA |
| 68.75389500 | −2.55709000 | 179.58512000 | CLA |
| 73.57255800 | −2.28727100 | 178.91729500 | CLA |
| 78.36997500 | −1.99507900 | 178.19405200 | CLA |
| 83.14404000 | −1.67974700 | 177.41357200 | CLA |
| 87.89258900 | −1.34039400 | 176.57364900 | CLA |
| 92.61320100 | −0.97618500 | 175.67221000 | CLA |
| 97.30348300 | −0.58612700 | 174.70677900 | CLA |
| 101.96080900 | −0.16912300 | 173.67466600 | CLA |
| 106.58255900 | 0.27593600 | 172.57309400 | CLA |
| 111.16585800 | 0.75015100 | 171.39936900 | CLA |
| 115.70776900 | 1.25482400 | 170.15030200 | CLA |
| 120.20527800 | 1.79127100 | 168.82252900 | CLA |
| 124.65533100 | 2.36095500 | 167.41251400 | CLA |
| 129.05467500 | 2.96531400 | 165.91669400 | CLA |
| 133.40000700 | 3.60598900 | 164.33096700 | CLA |
| 137.68808700 | 4.28461400 | 162.65129200 | CLA |
| 141.91554100 | 5.00295900 | 160.87334600 | CLA |

TABLE 6-continued

Stop polygon AS in the imaging beam path between M9 and M10

| X[mm] | Y[mm] | Z[mm] | Type |
|---|---|---|---|
| 146.07893600 | 5.76289900 | 158.99242700 | CLA |
| 150.17490500 | 6.56642700 | 157.00360400 | CLA |
| 154.20002700 | 7.41549400 | 154.90205700 | CLA |
| 158.15106700 | 8.31237400 | 152.68225100 | CLA |
| 162.02457400 | 9.25929100 | 150.33850000 | CLA |
| 165.81746100 | 10.25864300 | 147.86503800 | CLA |
| 169.52648100 | 11.31288100 | 145.25571300 | CLA |
| 173.14868300 | 12.42463300 | 142.50404300 | CLA |
| 176.68112300 | 13.59665400 | 139.60319000 | CLA |
| 180.12098800 | 14.83171400 | 136.54629600 | CLA |
| 183.46561700 | 16.13275100 | 133.32612800 | CLA |
| 186.71259200 | 17.50290300 | 129.93487300 | CLA |
| 189.85947400 | 18.94530200 | 126.36483200 | CLA |
| 192.90404400 | 20.46324100 | 122.60777000 | CLA |
| 195.84432600 | 22.06021900 | 118.65512200 | CLA |
| 198.67828500 | 23.73971400 | 114.49825000 | CLA |
| 201.40409200 | 25.50539800 | 110.12798100 | CLA |
| 204.01998900 | 27.36108900 | 105.53499200 | CLA |
| 206.52437200 | 29.31065100 | 100.70965600 | CLA |
| 208.91541000 | 31.35813700 | 95.64195600 | CLA |
| 211.19147600 | 33.50760700 | 90.32183800 | CLA |
| 213.35065800 | 35.76334400 | 84.73868400 | CLA |
| 215.39130600 | 38.12963900 | 78.88190700 | CLA |
| 217.31114600 | 40.61084100 | 72.74071900 | CLA |
| 219.10785500 | 43.21147900 | 66.30393200 | CLA |
| 220.77884700 | 45.93608000 | 59.56031000 | CLA |
| 222.32096800 | 48.78916600 | 52.49869000 | CLA |
| 223.73072400 | 51.77538400 | 45.10753500 | CLA |
| 225.00391900 | 54.89925100 | 37.37569500 | CLA |
| 226.13600200 | 58.16537900 | 29.29174900 | CLA |
| 227.12122900 | 61.57814900 | 20.84483900 | CLA |
| 227.95344500 | 65.14191000 | 12.02423400 | CLA |
| 227.96741000 | 69.17817300 | 4.24784700 | CLA |
| 224.92026200 | 74.62899500 | 2.51098200 | CLA |
| 221.64901100 | 80.02685100 | 0.75883000 | CLA |
| 217.71726100 | 85.53509300 | 0.00000000 | CLA |
| 213.25621500 | 91.06052500 | 0.00000000 | CLA |
| 208.61005500 | 96.45897500 | 0.00000000 | CLA |
| 203.78559400 | 101.72694700 | 0.00000000 | CLA |
| 198.78942700 | 106.86098000 | 0.00000000 | CLA |
| 193.62848300 | 111.85789200 | 0.00000000 | CLA |
| 188.30942700 | 116.71453300 | 0.00000000 | CLA |
| 182.83880500 | 121.42778500 | 0.00000000 | CLA |
| 177.22372500 | 125.99505700 | 0.00000000 | CLA |
| 171.47033100 | 130.41326100 | 0.00000000 | CLA |
| 165.58539100 | 134.67982000 | 0.00000000 | CLA |
| 159.57526500 | 138.79218000 | 0.00000000 | CLA |
| 153.44628100 | 142.74788800 | 0.00000000 | CLA |
| 147.20470800 | 146.54456300 | 0.00000000 | CLA |
| 140.85671700 | 150.17999100 | 0.00000000 | CLA |
| 134.40815300 | 153.65196000 | 0.00000000 | CLA |
| 127.86507800 | 156.95847900 | 0.00000000 | CLA |
| 121.23319300 | 160.09759500 | 0.00000000 | CLA |
| 114.51820300 | 163.06746100 | 0.00000000 | CLA |
| 107.72555500 | 165.86627400 | 0.00000000 | CLA |
| 100.86080300 | 168.49243500 | 0.00000000 | CLA |
| 93.92919400 | 170.94433800 | 0.00000000 | CLA |
| 86.93605000 | 173.22065200 | 0.00000000 | CLA |
| 79.88623100 | 175.31975300 | 0.00000000 | CLA |
| 72.78506700 | 177.24065500 | 0.00000000 | CLA |
| 65.63737700 | 178.98213000 | 0.00000000 | CLA |
| 58.44805800 | 180.54312300 | 0.00000000 | CLA |
| 51.22191700 | 181.92270400 | 0.00000000 | CLA |
| 43.96368200 | 183.12003500 | 0.00000000 | CLA |
| 36.67804500 | 184.13440100 | 0.00000000 | CLA |
| 29.36964700 | 184.96518200 | 0.00000000 | CLA |
| 22.04308600 | 185.61182900 | 0.00000000 | CLA |
| 14.70293000 | 186.07403500 | 0.00000000 | CLA |
| 7.35372500 | 186.35147200 | 0.00000000 | CLA |

An overall reflectivity of the projection optical unit 20 is approximately 8.49%.

The projection optical unit 20 has an image-side numerical aperture of 0.55. The image field 8 has an x-extent of two-times 13.0 mm and a y-extent of 1 mm. The projection optical unit 20 is optimized for an operating wavelength of the illumination light 3 of 13.5 nm.

Figure 7:
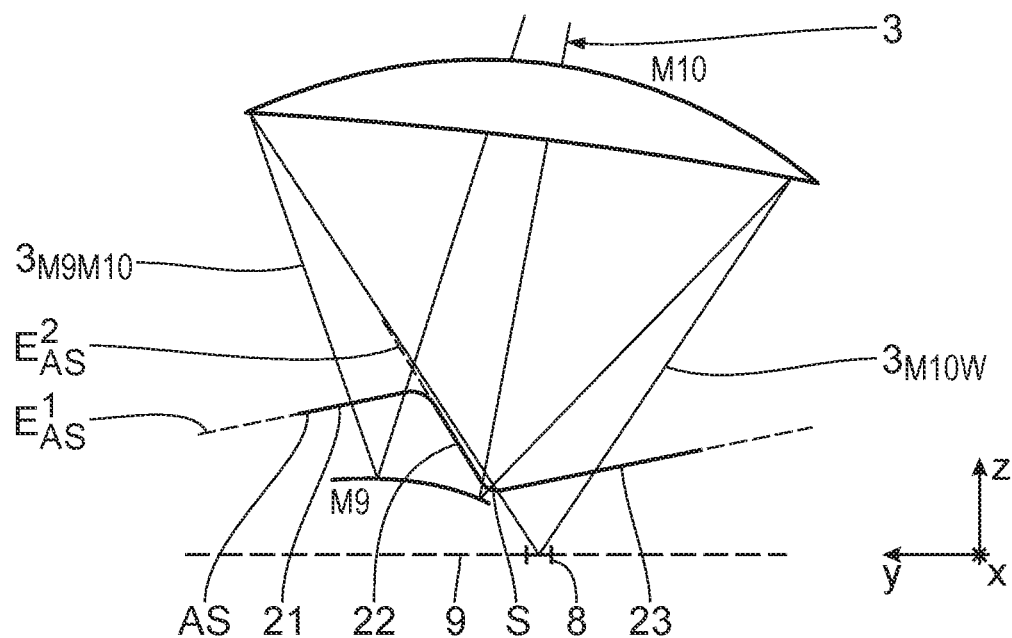

Instead of four stops AS to AS4 in the case of the projection optical unit 7 according to FIGS. 2 to 5, the projection optical unit 20 has exactly one stop AS (cf. FIG. 7), which is arranged spatially between the penultimate mirror M9 in the beam path and the last mirror M10 in the beam path.

The stop AS of the projection optical unit 20 delimits the outer marginal contour of the pupil of the projection optical unit 20 in an azimuth range of 360°, that is to say fully circumferentially. The stop AS of the projection optical unit 20 thus predefines the entire outer marginal contour of the pupil.

The stop AS of the projection optical unit 20 is embodied in a plane fashion in sections and includes two plane stop sections 21, 22 and a further plane carrying section 23. The stop AS of the projection optical unit 20 delimits a marginal contour 24 of the pupil of the projection optical unit 20 in more than one plane, namely in stop planes $E_{AS}^1$ and $E_{AS}^2$.

Figure 8:
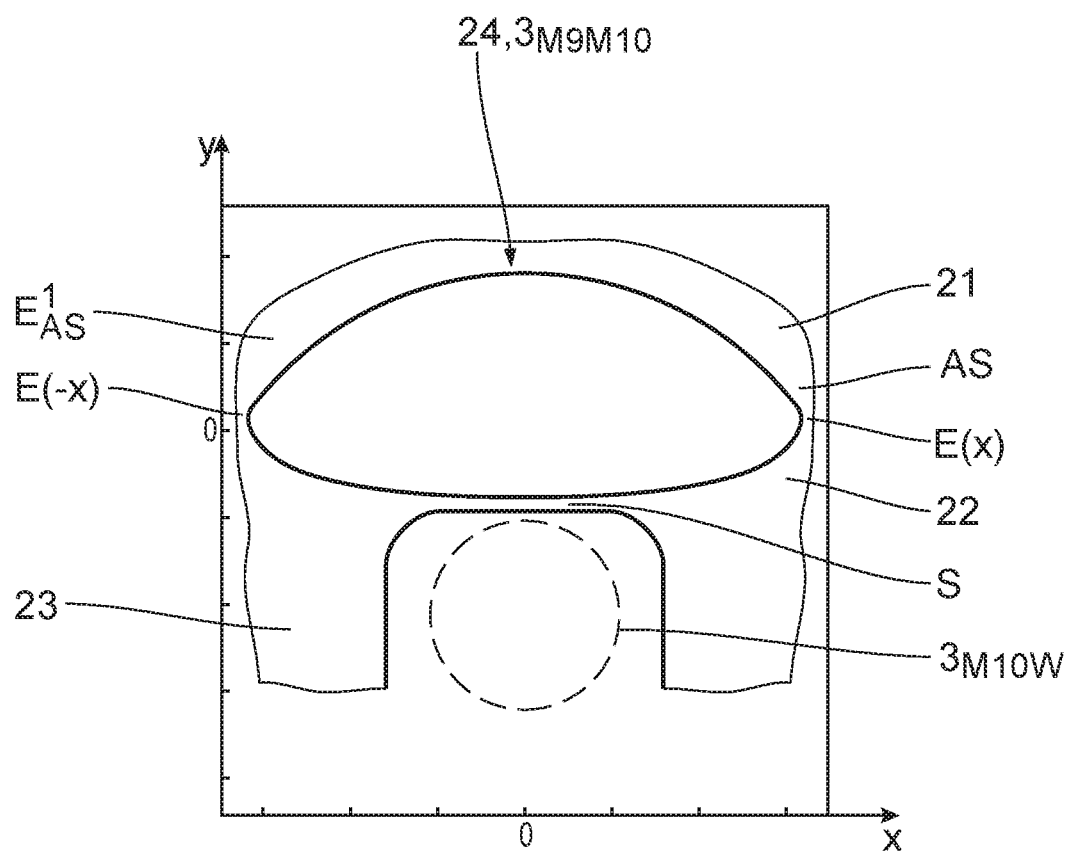

FIG. 8 shows a projection of the marginal contour 24 of the pupil of the projection optical unit 20 onto the stop plane $E_{AS}^1$. An outer marginal contour of the stop AS, that is to say a contour of the stop AS where it is not beam-delimiting, is not illustrated in greater detail, but rather indicated by a broken line.

In the first stop plane $E_{AS}^1$, the stop AS delimits the pupil marginal contour 24 by stopping down the imaging light partial beam $3_{M9M10}$ between the mirrors M9 an M10 with the stop section 21.

The stop AS of the projection optical unit 20 runs in a bent fashion between the stop sections 21 and 22. The sections 21, 22, on the one hand, and the sections 22, 23, on the other hand, of the stop AS of the projection optical unit 20 run at obtuse angles with respect to one another. The extreme marginal positions E(x), E(−x) of the outer pupil marginal contour 24 lie in the bend region between the stop sections 21 and 22.

In the second stop plane $E_{AS}^2$, the stop AS delimits the pupil marginal contour of the projection optical unit 20 by outer stopping down likewise of the imaging light partial beam $3_{M9M10}$. In the region of very small y-values, namely exactly between the two imaging light partial beams $3_{M9M10}$ and $3_{M10W}$, the stop AS of the projection optical unit 20 is embodied in a narrow fashion, such that it does not delimit the imaging light partial beam $3_{M10W}$. In the region between the imaging light partial beams $3_{M9M10}$ and $3_{M10W}$, the stop AS of the projection optical unit 20 is embodied as a narrow web S. The carrying section 23 is led past the imaging light partial beam $3_{M10W}$ on both sides, that is to say for negative and for positive x-values.

Figure 9:
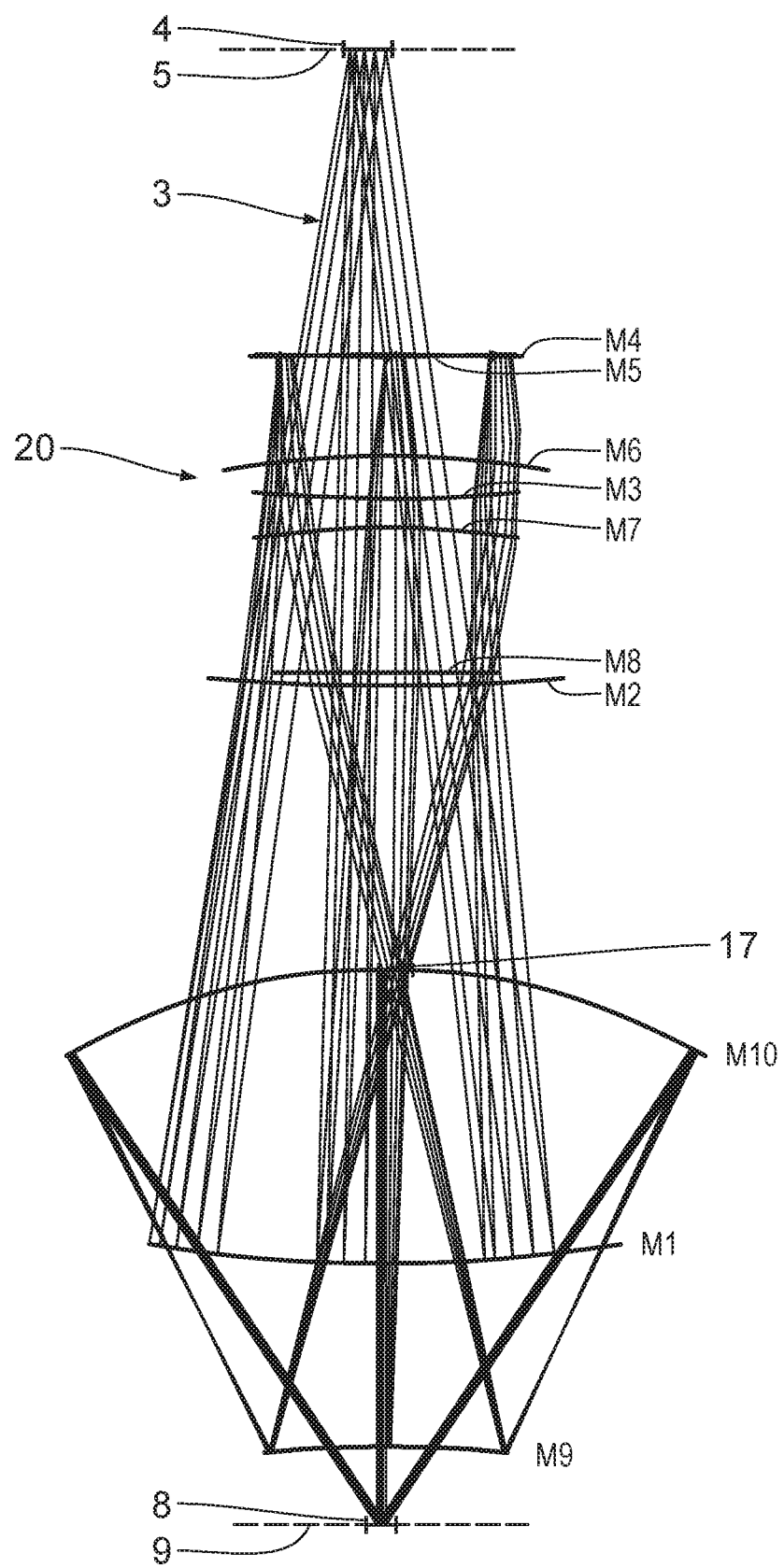

FIG. 9 is once again a sagittal view of the projection optical unit 20.

Figure 10:
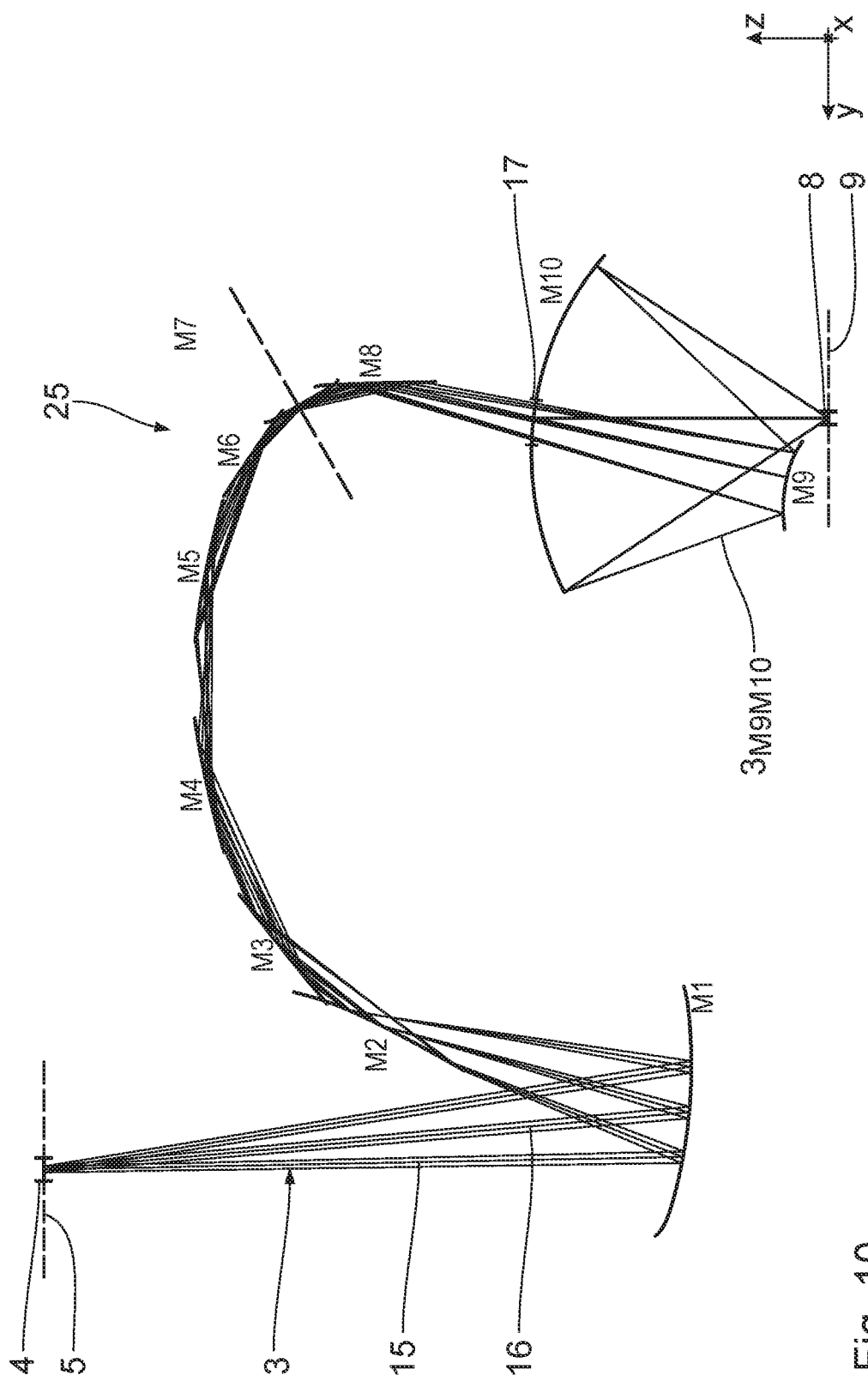
FIGS. 10 to 12 show illustrations similar to FIGS. 2, 3 and 5 of a further embodiment of an imaging optical unit, usable as a projection lens in the projection exposure apparatus according to FIG. 1.

With reference to FIG. 10, an explanation is given below of a further embodiment of a projection optical unit 25, which can be used instead of the projection optical unit 7 in the projection exposure apparatus 1 according to FIG. 1. Components and functions which have already been explained above in the context of FIGS. 1 to 9 are denoted, where applicable, by the same reference signs and are not discussed again in detail.

The mirrors M1 to M10 are once again configured as free-form surfaces for which the free-form surface equation (1) indicated above holds true. The optical design data from the projection optical unit 21 can be gathered from the following tables, which, in terms of their design, correspond to the tables for the projection optical unit 7 according to FIG. 2.

TABLE 1 for FIG. 10

| Exemplary embodiment | FIG. 10 |
|---|---|
| NA | 0.55 |
| Wavelength | 13.5 nm |
| Field dimension x | 26.0 mm |
| Field dimension y | 1.0 mm |
| Field curvature | −0.012345 1/mm |
| Stop | AS |

TABLE 2 for FIG. 10

| Surface | Radius_x[mm] | Power_x[1/mm] | Radius_y[mm] | Power_y[1/mm] | Operating mode |
|---|---|---|---|---|---|
| M10 | −924.4981198 | 0.0021492 | −841.5674623 | 0.0023921 | REFL |
| M9 | 1845.8313982 | −0.0010835 | 356.4114777 | −0.0056115 | REFL |
| M8 | −807.7853011 | 0.0006289 | −16794.6817783 | 0.0004689 | REFL |
| M7 | −633.7019549 | 0.0007380 | 20332.8433550 | −0.0004206 | REFL |
| M6 | −1159.7877847 | 0.0003528 | −7078.0588424 | 0.0013813 | REFL |
| M5 | −7911.6202298 | 0.0000533 | −2197.1749958 | 0.0043148 | REFL |
| M4 | 6252.7176733 | −0.0000660 | −2753.7274849 | 0.0035212 | REFL |
| M3 | 1718.6984546 | −0.0002678 | −10060.7554809 | 0.0008638 | REFL |
| M2 | 1592.6268445 | −0.0002500 | 2592.5626309 | −0.0038746 | REFL |
| M1 | −2135.9876330 | 0.0009216 | −1377.1202039 | 0.0014756 | REFL |

TABLE 3a for FIG. 10

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −924.49811980 | 1845.83139800 | −807.78530110 |
| C7 | 5.32161644e−09 | −7.17957299e−07 | 3.61958396e−07 |
| C9 | 1.2051462e−08 | 1.48021766e−06 | 4.61852728e−08 |
| C10 | −4.28738318e−12 | 3.94779844e−10 | 1.36275822e−10 |
| C12 | −3.49709402e−11 | 2.67402017e−09 | 4.92199166e−11 |
| C14 | −9.81786584e−12 | 6.31481582e−09 | −4.23949539e−10 |
| C16 | −3.40219667e−15 | −2.74047503e−12 | 1.12548598e−12 |
| C18 | 1.60355869e−14 | 2.04228406e−14 | 3.71761249e−13 |
| C20 | 1.30399612e−14 | 3.2725238e−11 | −2.05971586e−12 |
| C21 | −1.15274335e−17 | 2.35879877e−15 | 1.09054091e−15 |
| C23 | −6.9260806e−17 | 1.00239611e−14 | 1.70911423e−15 |
| C25 | −7.13524377e−17 | 5.05529889e−14 | −3.62622238e−15 |
| C27 | −1.67322747e−17 | 1.78538542e−13 | −7.36849912e−15 |
| C29 | −7.92528578e−21 | −4.11347975e−18 | −2.59696939e−14 |
| C31 | 1.27834004e−20 | −5.83032641e−17 | 1.25679501e−17 |
| C33 | 3.27119661e−20 | 1.71591989e−16 | −1.04543394e−17 |
| C35 | 1.71377495e−20 | 1.22876874e−15 | −3.91086555e−17 |
| C36 | −1.89551894e−23 | −4.14843428e−22 | 5.26679107e−21 |
| C38 | −1.11996388e−22 | 1.06656248e−19 | 2.8502374e−20 |
| C40 | −1.96750203e−22 | 2.08419251e−19 | 6.3260457e−20 |
| C42 | −1.2392523e−22 | 8.95301505e−19 | 4.7233819e−21 |
| C44 | −2.47458966e−23 | 8.36809183e−18 | −2.27707911e−19 |
| C46 | −9.77909864e−27 | −1.02394711e−22 | 1.39450428e−23 |
| C48 | 5.19824336e−27 | −7.95041789e−20 | 1.68839235e−22 |
| C50 | 5.59498452e−26 | 8.75666056e−22 | 2.79254271e−22 |
| C52 | 6.43656264e−26 | 4.60087068e−21 | −9.11661464e−23 |
| C54 | 1.96031627e−26 | 4.50459082e−20 | 1.98458883e−22 |
| C55 | −1.9734083e−29 | 2.61667221e−26 | −4.54521391e−26 |
| C57 | −1.39192995e−28 | −1.48955085e−25 | 1.23387971e−24 |
| C59 | −3.49342237e−28 | 2.18616238e−24 | 4.57708029e−24 |
| C61 | −3.79015472e−28 | 8.50729665e−24 | 6.06052772e−24 |
| C63 | −1.77868817e−28 | 2.63725246e−23 | −9.61661588e−26 |
| C65 | −2.61320106e−29 | 1.37431086e−22 | 9.18355997e−24 |
| C67 | −1.75320584e−32 | 1.91491617e−28 | −2.00093096e−27 |

TABLE 3a-continued for FIG. 10

| Coefficient | M10 | M9 | M8 |
|---|---|---|---|
| C69 | −1.49695509e−32 | −5.27938029e−27 | 2.16982668e−27 |
| C71 | 6.84912486e−32 | −5.29216183e−27 | −7.30096104e−27 |
| C73 | 1.54586906e−31 | 4.04146338e−26 | −4.93769708e−27 |
| C75 | 1.15783975e−31 | 2.37812676e−25 | −4.16594376e−26 |
| C77 | 4.14587364e−32 | 1.20314674e−24 | −1.62235584e−25 |
| C78 | −5.34426777e−35 | 4.49836368e−31 | 6.13330316e−30 |
| C80 | −4.27488688e−34 | 1.29694668e−29 | −1.62333428e−29 |
| C82 | −1.25436413e−33 | 3.24280489e−29 | −1.68167617e−28 |
| C84 | −1.71502766e−33 | 3.00254831e−29 | −4.89454528e−28 |
| C86 | −1.25734127e−33 | 7.46446045e−28 | −6.5895393e−28 |
| C88 | −5.19929261e−34 | 5.84363659e−27 | −1.5416679e−27 |

TABLE 3a-continued for FIG. 10

| Coefficient | M10 | M9 | M8 |
|---|---|---|---|
| C90 | −9.42013117e−35 | 2.61240017e−26 | −3.38007496e−27 |
| C92 | 1.00872668e−38 | −4.95175891e−33 | 1.78435553e−32 |
| C94 | −1.45968234e−39 | 2.0913161e−33 | 1.10022934e−32 |
| C96 | 2.49294655e−38 | 9.54156933e−32 | 1.00044858e−30 |
| C98 | 1.25738947e−37 | −7.47916509e−33 | 1.98972461e−30 |
| C100 | 1.6844889e−37 | 7.35199153e−30 | −3.47483305e−30 |
| C102 | 7.66863005e−38 | 5.82871085e−29 | −1.47027148e−29 |
| C104 | −1.4887687e−38 | 2.15570834e−28 | −2.0886266e−29 |
| C105 | 3.84331333e−41 | −2.72151554e−36 | −1.09100622e−34 |
| C107 | 4.50330303e−40 | −6.8970507e−35 | 3.91399908e−34 |
| C109 | 1.60900752e−39 | −2.41557224e−34 | 4.01031765e−33 |
| C111 | 2.46751199e−39 | 1.07560857e−33 | 1.8289791e−32 |
| C113 | 1.94052198e−39 | 8.96263507e−33 | 2.87152163e−32 |
| C115 | 9.9606188e−40 | 4.77961552e−32 | −4.19223781e−33 |
| C117 | 4.55475999e−40 | 2.14647641e−31 | −4.42634085e−32 |
| C119 | 9.96424428e−41 | 6.08163641e−31 | −4.46533131e−32 |
| C121 | −6.67748909e−44 | 0 | 0 |
| C123 | −1.35652075e−43 | 0 | 0 |
| C125 | 1.98636308e−43 | 0 | 0 |
| C127 | 1.25607622e−42 | 0 | 0 |
| C129 | 2.10051386e−42 | 0 | 0 |
| C131 | 1.77289428e−42 | 0 | 0 |
| C133 | 7.94693346e−43 | 0 | 0 |
| C135 | 1.74862061e−43 | 0 | 0 |
| C136 | −1.77390976e−46 | 0 | 0 |
| C138 | −2.00142247e−45 | 0 | 0 |
| C140 | −8.6258998e−45 | 0 | 0 |
| C142 | −1.91465627e−44 | 0 | 0 |
| C144 | −2.50271596e−44 | 0 | 0 |
| C146 | −2.03958823e−44 | 0 | 0 |
| C148 | −1.04613962e−44 | 0 | 0 |
| C150 | −3.18867421e−45 | 0 | 0 |
| C152 | −4.17582475e−46 | 0 | 0 |

TABLE 3b for FIG. 10

| Coeffi- | M7 | M6 | M5 |
|---|---|---|---|
| KY | 0.00000000 | 0.00000000 | 0.00000000 |
| KX | 0.00000000 | 0.00000000 | 0.00000000 |
| RX | −633.70195490 | −1159.78778500 | −7911.62023000 |
| C7 | −3.6838108e−08 | 8.9762673e−08 | 1.29208819e−08 |
| C9 | 1.66051547e−07 | 5.4606184e−08 | −4.52621083e−08 |
| C10 | 2.70786958e−11 | −4.84436976e−10 | −5.84676904e−10 |
| C12 | −4.05365907e−10 | 4.4034394e−11 | 3.29353371e−11 |
| C14 | 1.17570885e−09 | −8.49494866e−10 | 3.27657845e−11 |
| C16 | 5.32058235e−13 | −1.22366579e−12 | −4.06185258e−13 |
| C18 | −2.33907349e−12 | 3.31495258e−12 | −3.05655881e−13 |
| C20 | 1.03622586e−11 | 4.74017946e−12 | −9.90515078e−14 |
| C21 | 1.84951658e−17 | 4.70815441e−16 | 6.8177486e−16 |
| C23 | 1.97362743e−16 | −5.63918759e−15 | 1.78311332e−16 |
| C25 | −4.50645748e−14 | −2.04438614e−14 | 1.92769745e−15 |
| C27 | 1.22197136e−13 | −4.46320586e−14 | 1.11134948e−15 |
| C29 | −8.3397015e−19 | 3.12037967e−18 | 1.20925734e−18 |
| C31 | 5.73336291e−17 | 2.52930984e−17 | −2.68755339e−18 |
| C33 | −4.26965471e−16 | 2.57659349e−16 | −5.94759876e−18 |
| C35 | 1.12309508e−15 | 3.62043368e−16 | −4.78247891e−18 |
| C36 | −2.54002154e−21 | −2.33285817e−21 | 8.64176325e−21 |
| C38 | 6.58698589e−22 | 6.78093367e−21 | 2.69603122e−21 |
| C40 | 9.19834216e−19 | −6.09316184e−19 | 1.90190625e−20 |
| C42 | −5.20603364e−18 | −2.48560476e−18 | 2.06136053e−20 |
| C44 | 1.95177251e−17 | −3.71987432e−18 | 1.52178482e−20 |
| C46 | 5.11031274e−23 | −2.36475219e−24 | 1.40723013e−23 |
| C48 | −5.22351362e−22 | 1.08955249e−21 | −1.74886691e−23 |
| C50 | 1.29955621e−20 | 6.28062297e−21 | −1.31280422e−22 |
| C52 | −7.19352591e−20 | 2.83502526e−20 | −1.33189978e−22 |
| C54 | 3.01583882e−19 | 4.05968238e−20 | −5.11578136e−23 |
| C55 | −3.2378259e−26 | 5.04920803e−26 | −9.74226056e−26 |
| C57 | 2.56114803e−26 | −1.66126857e−24 | 1.25073538e−25 |
| C59 | −2.15568526e−23 | −1.21962666e−23 | 3.61644254e−25 |
| C61 | 7.54597503e−23 | −7.85294647e−23 | 6.17670028e−25 |
| C63 | −1.37768633e−21 | −2.60819335e−22 | 3.1972004e−25 |
| C65 | −9.91159698e−22 | −3.82043453e−22 | 5.14604952e−26 |
| C67 | 8.86143266e−29 | 1.38719494e−27 | −4.85096213e−29 |
| C69 | 2.95926995e−28 | 1.1409927e−26 | −1.52883817e−29 |
| C71 | −4.08946521e−25 | 1.70193798e−25 | −2.99192047e−28 |
| C73 | 1.1764e−24 | 5.79647838e−25 | 1.27326956e−27 |
| C75 | −1.82271068e−23 | 1.8185183e−24 | 2.14215183e−27 |
| C77 | −6.0476105e−23 | 2.47496013e−24 | −2.43586456e−28 |
| C78 | −1.46974123e−31 | −2.48880617e−30 | 2.2910216e−30 |
| C80 | −1.62035317e−29 | −3.63910799e−30 | −2.10355105e−30 |
| C82 | 2.64119709e−28 | −1.39124488e−28 | −3.56165247e−30 |
| C84 | −2.75435112e−27 | −9.92371827e−28 | −1.25073816e−29 |
| C86 | 6.06493358e−26 | −2.9562807e−27 | −1.02346615e−29 |
| C88 | −1.82794269e−25 | −7.99387324e−27 | 1.25693216e−30 |
| C90 | 8.10897778e−25 | −1.01333935e−26 | 6.64972771e−30 |
| C92 | −5.94852836e−33 | −2.20554773e−33 | 1.22259104e−33 |
| C94 | 7.23973112e−32 | 1.10525284e−31 | −1.24849687e−32 |
| C96 | 7.40539289e−30 | −4.613537e−32 | −3.29652704e−32 |
| C98 | 4.88216265e−30 | 4.80483016e−30 | −8.41705133e−32 |
| C100 | 9.65449531e−28 | 6.23756899e−30 | −1.57134898e−31 |
| C102 | −1.70876067e−27 | 2.1445453e−29 | −1.2032548e−31 |
| C104 | 2.67082934e−26 | 2.28654521e−29 | −3.36577402e−32 |
| C105 | 2.35094421e−36 | 2.08468354e−35 | −1.08251776e−35 |
| C107 | 3.37747137e−34 | −1.04397603e−34 | 3.142163e−35 |
| C109 | 7.70896596e−34 | 2.85346997e−34 | 8.01180965e−35 |
| C111 | 6.84579774e−32 | −8.80664689e−35 | 3.89769754e−34 |
| C113 | −9.31004972e−32 | −9.19882787e−33 | 7.80016296e−34 |
| C115 | 5.48180337e−30 | −1.39857273e−33 | 7.27970094e−34 |
| C117 | −9.40923091e−30 | −2.85191959e−32 | 3.44660803e−34 |
| C119 | 1.58250782e−28 | −2.04899764e−32 | 5.28320959e−35 |

TABLE 3c for FIG. 10

| Coeffi- | M4 | M3 | M2 |
|---|---|---|---|
| KY | 0.00000000 | 0.00000000 | 0.00000000 |
| KX | 0.00000000 | 0.00000000 | 0.00000000 |
| RX | 6252.71767300 | 1718.69845500 | 1592.62684400 |

TABLE 3c-continued for FIG. 10

| Coeffi- | M4 | M3 | M2 |
|---|---|---|---|
| C7 | 2.02039657e−07 | −7.72442186e−08 | −2.81200257e−07 |
| C9 | 6.26194854e−08 | −6.39011454e−08 | −4.33420894e−07 |
| C10 | −1.17096485e−10 | 5.38504965e−10 | 2.16914992e−10 |
| C12 | 1.65918593e−10 | 1.54474735e−10 | −2.43233271e−10 |
| C14 | 2.6047855e−11 | −5.67012949e−11 | 1.0908048e−09 |
| C16 | 1.53352973e−13 | −1.28128634e−12 | −1.3249687e−12 |
| C18 | 6.85280998e−14 | 3.29016521e−13 | 2.3245033e−12 |
| C20 | 1.33134745e−14 | −7.9135182e−14 | −2.74288101e−12 |
| C21 | 9.63392843e−16 | −2.23006179e−16 | −3.54173468e−16 |
| C23 | −2.56356327e−16 | 8.08610012e−16 | 5.15456653e−15 |
| C25 | −4.93143601e−16 | −1.64061139e−16 | −1.06774698e−14 |
| C27 | −3.50827102e−17 | −8.3638218e−18 | 5.96789915e−15 |
| C29 | −1.32470314e−18 | 2.06883208e−18 | 1.70541615e−18 |
| C31 | −1.08456401e−18 | −3.75046097e−18 | −2.42446489e−17 |
| C33 | −3.23480928e−19 | 1.52741866e−18 | 4.43191025e−17 |
| C35 | −3.72075346e−19 | 1.62584985e−18 | −1.05861269e−17 |
| C36 | −3.85707039e−21 | −2.85425871e−21 | 1.53834046e−21 |
| C38 | 7.16357253e−21 | 4.79674043e−21 | −1.1251108e−20 |
| C40 | −1.76766744e−21 | 6.62315222e−22 | 1.18315789e−19 |
| C42 | −5.70159933e−21 | −2.6546097e−21 | −1.77703731e−19 |
| C44 | −3.65158025e−21 | 1.5355861e−21 | 1.37862764e−20 |
| C46 | −2.99726604e−23 | −7.26058549e−23 | −2.55922076e−23 |
| C48 | −4.17503344e−23 | −9.21476496e−23 | 1.00193833e−22 |
| C50 | −4.7884568e−23 | −2.35567601e−22 | −5.31735424e−22 |
| C52 | −6.91516977e−24 | −1.35526865e−22 | 6.79507546e−22 |
| C54 | 1.98546253e−23 | 9.61975988e−23 | 4.01660209e−23 |
| C55 | −1.94031018e−26 | 1.56888015e−25 | −1.38213528e−26 |
| C57 | −3.42382432e−25 | 2.2750218e−25 | 1.79376182e−25 |
| C59 | −2.2756817e−25 | −1.23549695e−25 | −5.94897934e−25 |
| C61 | 2.01539859e−25 | 2.29974662e−25 | 2.27901415e−24 |
| C63 | 4.95631548e−25 | 8.59833428e−25 | −2.22922414e−24 |
| C65 | 1.12176727e−25 | 1.26876311e−24 | −7.70058057e−25 |
| C67 | 9.06942404e−28 | 9.3079309e−28 | 3.74223228e−28 |
| C69 | 1.9957938e−27 | 4.99157193e−27 | −9.62902214e−28 |
| C71 | 3.12476201e−27 | 1.58761398e−26 | 2.15189986e−27 |
| C73 | 4.54981924e−27 | 1.53821757e−26 | −8.59545995e−27 |
| C75 | 6.59335485e−28 | 3.62238546e−27 | 5.36715829e−27 |
| C77 | −1.58015986e−27 | −1.19949042e−27 | 5.14863336e−27 |
| C78 | 4.37655985e−30 | −2.15256015e−30 | −6.68041182e−32 |
| C80 | 8.62343063e−30 | −8.27474872e−30 | −2.88698633e−30 |
| C82 | 1.3965552e−29 | −1.85964202e−29 | 2.97808799e−30 |
| C84 | 1.2610299e−29 | −5.63075807e−29 | −9.25513518e−30 |
| C86 | −4.82567841e−30 | −7.58802797e−29 | 2.1567675e−29 |
| C88 | −1.35566233e−29 | −6.2816052e−29 | −8.2378632e−30 |
| C90 | 8.35698293e−31 | −2.48292667e−29 | −1.8363031e−29 |
| C92 | −6.20912191e−33 | −1.53848466e−33 | −2.72722676e−33 |
| C94 | −3.03339233e−32 | −5.56751434e−32 | 9.35668771e−33 |
| C96 | −4.15846221e−32 | −2.81174802e−31 | 1.01318148e−32 |
| C98 | −1.20240425e−31 | −5.69729421e−31 | 4.31201041e−32 |
| C100 | −1.23999978e−31 | −3.40400557e−31 | −2.58821352e−32 |
| C102 | 1.77507014e−32 | −9.97858945e−32 | 6.91936623e−33 |
| C104 | 3.83557979e−32 | 1.09580074e−31 | 3.45333625e−32 |
| C105 | −1.52261212e−35 | 5.38313447e−37 | 2.4018539e−36 |
| C107 | −7.96360046e−35 | 8.5583118e−35 | 1.94949839e−35 |
| C109 | −2.50162343e−34 | 3.84351739e−34 | −2.7269109e−35 |
| C111 | −2.81541874e−34 | 1.85492006e−33 | −5.57867255e−35 |
| C113 | −6.28531061e−34 | 2.60940268e−33 | −8.0628501e−35 |
| C115 | 2.25293161e−35 | 2.55655776e−33 | 6.48059264e−36 |
| C117 | 7.79107372e−35 | 1.01920129e−33 | −2.46632816e−36 |
| C119 | −1.12500845e−34 | 7.43677377e−34 | −2.70846382e−35 |

TABLE 3d for FIG. 10

| Coefficient | M1 |
|---|---|
| KY | 0.00000000 |
| KX | 0.00000000 |
| RX | −2135.98763300 |
| C7 | −3.62667214e−08 |
| C9 | −8.77001096e−09 |
| C10 | −7.9878408e−12 |

TABLE 3d-continued for FIG. 10

| Coefficient | M1 |
|---|---|
| C12 | 3.57622422e−11 |
| C14 | 5.67666306e−11 |
| C16 | −1.00670933e−14 |
| C18 | −6.43363507e−14 |
| C20 | 3.49263438e−14 |
| C21 | −1.83622059e−18 |
| C23 | 1.63146414e−17 |
| C25 | 2.33281554e−16 |
| C27 | −2.13403252e−16 |
| C29 | −7.17734463e−22 |
| C31 | −7.76916167e−20 |
| C33 | −2.45391831e−19 |
| C35 | 9.06895125e−19 |
| C36 | −2.87240432e−24 |
| C38 | −5.67479156e−24 |
| C40 | 2.53075334e−22 |
| C42 | 2.33441297e−22 |
| C44 | −4.90816027e−21 |
| C46 | −1.82993123e−26 |
| C48 | 1.40735408e−25 |
| C50 | −1.62994831e−25 |
| C52 | 4.12295522e−24 |
| C54 | 2.26175423e−23 |
| C55 | 6.84620783e−30 |
| C57 | −8.9211373e−29 |
| C59 | 3.99552919e−28 |
| C61 | 2.87701829e−26 |
| C63 | 7.90515964e−26 |
| C65 | 4.93963599e−26 |
| C67 | 8.37008672e−32 |
| C69 | −9.8548077e−31 |
| C71 | −7.50758997e−30 |
| C73 | −6.72582496e−30 |
| C75 | 2.5702957e−28 |
| C77 | −1.08487883e−27 |
| C78 | 4.88158898e−36 |
| C80 | 1.55182242e−33 |
| C82 | 1.52095525e−32 |
| C84 | −1.27781492e−31 |
| C86 | −1.81913568e−30 |
| C88 | −5.89459163e−30 |
| C90 | 2.69055495e−30 |
| C92 | −4.03243187e−38 |
| C94 | 3.64827588e−36 |
| C96 | 3.2629352e−35 |
| C98 | 1.58289449e−34 |
| C100 | −1.41502554e−34 |
| C102 | −7.52721979e−33 |
| C104 | 1.42550505e−32 |
| C105 | −9.85463233e−41 |
| C107 | −4.7133732e−39 |
| C109 | −9.62905307e−38 |
| C111 | −4.88592887e−38 |
| C113 | 5.89605443e−36 |
| C115 | 4.37586765e−35 |
| C117 | 1.2944388e−34 |
| C119 | −5.79847892e−35 |

TABLE 4a for FIG. 10

| Surface | DCX | DCY | DCZ |
|---|---|---|---|
| Image | 0.00000000 | 0.00000000 | 0.00000000 |
| M10 | 0.00000000 | 0.00000000 | 805.12545493 |
| AS | 0.00000000 | 121.91685762 | 283.85220626 |
| M9 | 0.00000000 | 161.70815863 | 113.71871405 |
| M8 | −0.00000000 | −95.26534725 | 1237.21684296 |
| M7 | −0.00000000 | −33.77425023 | 1447.75579022 |
| M6 | −0.00000000 | 65.18321239 | 1551.64751609 |
| M5 | −0.00000000 | 416.29245364 | 1699.16961083 |
| M4 | −0.00000000 | 1004.20719186 | 1696.34134424 |

TABLE 4a-continued for FIG. 10

| Surface | DCX | DCY | DCZ |
|---|---|---|---|
| M3 | −0.00000000 | 1452.13094016 | 1490.08513977 |
| M2 | 0.00000000 | 1660.63260708 | 1219.01552868 |
| M1 | 0.00000000 | 1898.51696847 | 380.25896967 |
| Object | −0.00000000 | 2052.66210418 | 2142.14593325 |

TABLE 4b for FIG. 10

| Surface | TLA[deg] | TLB[deg] | TLC[deg] |
|---|---|---|---|
| Image | −0.00000000 | 0.00000000 | −0.00000000 |
| M10 | 6.58193819 | −0.00000000 | −0.00000000 |
| AS | 33.06787638 | 180.00000000 | 0.00000000 |
| M9 | 193.02365372 | 0.00000000 | −0.00000000 |
| M8 | 88.30109261 | −0.00000000 | 0.00000000 |
| M7 | 60.05609350 | −0.00000000 | −0.00000000 |
| M6 | 34.59181790 | −0.00000000 | 0.00000000 |
| M5 | 11.25728686 | −0.00000000 | −0.00000000 |
| M4 | −12.50018064 | −0.00000000 | −0.00000000 |
| M3 | −38.57896098 | −0.00000000 | −0.00000000 |
| M2 | −63.29951574 | 0.00000000 | −0.00000000 |
| M1 | 185.41707922 | 0.00000000 | −0.00000000 |
| Object | 0.00000000 | −0.00000000 | −0.00000000 |

TABLE 5 for FIG. 10

| Surface | Angle of incidence[deg] | Reflectivity |
|---|---|---|
| M10 | 6.54595976 | 0.66117442 |
| M9 | 0.00927824 | 0.66565898 |
| M8 | 75.28640231 | 0.80872358 |
| M7 | 76.47602867 | 0.82797480 |
| M6 | 78.19600462 | 0.85363243 |
| M5 | 77.82112299 | 0.84823720 |
| M4 | 78.09659958 | 0.85221174 |
| M3 | 76.69475350 | 0.83137235 |
| M2 | 78.51548223 | 0.85815147 |
| M1 | 10.19566395 | 0.65421760 |
| Overall transmis- | | 0.0849 |

TABLE 6 for FIG. 10: Stop polygon AS in the imaging beam path between M9 and M10

| X[mm] | Y[mm] | Z[mm] | Type |
|---|---|---|---|
| 0.00000000 | 131.83589200 | 131.83589200 | CLA |
| −7.35374100 | 131.77048700 | 131.77048700 | CLA |
| −14.70296100 | 131.57431400 | 131.57431400 | CLA |
| −22.04313100 | 131.24749000 | 131.24749000 | CLA |
| −29.36970700 | 130.79021600 | 130.79021600 | CLA |
| −36.67812000 | 130.20277000 | 130.20277000 | CLA |
| −43.96377000 | 129.48550800 | 129.48550800 | CLA |
| −51.22201700 | 128.63886500 | 128.63886500 | CLA |
| −58.44817700 | 127.66335300 | 127.66335300 | CLA |
| −65.63750700 | 126.55956000 | 126.55956000 | CLA |
| −72.78520400 | 125.32814900 | 125.32814900 | CLA |
| −79.88639400 | 123.96985800 | 123.96985800 | CLA |
| −86.93612800 | 122.48549900 | 122.48549900 | CLA |
| −93.92937000 | 120.87595600 | 120.87595600 | CLA |
| −100.86099500 | 119.14218500 | 119.14218500 | CLA |
| −107.72578000 | 117.28521600 | 117.28521600 | CLA |
| −114.51840200 | 115.30614500 | 115.30614500 | CLA |
| −121.23342700 | 113.20614300 | 113.20614300 | CLA |
| −127.86531200 | 110.98644900 | 110.98644900 | CLA |

TABLE 6-continued for FIG. 10: Stop polygon AS in the imaging beam path between M9 and M10

| X[mm] | Y[mm] | Z[mm] | Type |
|---|---|---|---|
| −134.40839900 | 108.64837300 | 108.64837300 | CLA |
| −140.85691200 | 106.19329300 | 106.19329300 | CLA |
| −147.20495800 | 103.62266000 | 103.62266000 | CLA |
| −153.44653000 | 100.93799400 | 100.93799400 | CLA |
| −159.57550100 | 98.14088700 | 98.14088700 | CLA |
| −165.58563900 | 95.23300400 | 95.23300400 | CLA |
| −171.47060200 | 92.21608300 | 92.21608300 | CLA |
| −177.22395400 | 89.09193600 | 89.09193600 | CLA |
| −182.83916900 | 85.86245400 | 85.86245400 | CLA |
| −188.30964600 | 82.52960300 | 82.52960300 | CLA |
| −193.62872100 | 79.09543300 | 79.09543300 | CLA |
| −198.78968100 | 75.56207400 | 75.56207400 | CLA |
| −203.78578300 | 71.93174200 | 71.93174200 | CLA |
| −208.61027600 | 68.20674000 | 68.20674000 | CLA |
| −213.25641600 | 64.38946000 | 64.38946000 | CLA |
| −217.71749400 | 60.48238700 | 60.48238700 | CLA |
| −221.98685600 | 56.48810300 | 56.48810300 | CLA |
| −226.05793100 | 52.40928400 | 52.40928400 | CLA |
| −229.92425500 | 48.24870700 | 48.24870700 | CLA |
| −233.57949800 | 44.00925100 | 44.00925100 | CLA |
| −237.01749200 | 39.69389700 | 39.69389700 | CLA |
| −240.23226000 | 35.30573300 | 35.30573300 | CLA |
| −243.21803600 | 30.84795100 | 30.84795100 | CLA |
| −245.96930200 | 26.32385100 | 26.32385100 | CLA |
| −248.48080600 | 21.73684100 | 21.73684100 | CLA |
| −250.74758900 | 17.09043500 | 17.09043500 | CLA |
| −252.76501100 | 12.38825600 | 12.38825600 | CLA |
| −254.52877100 | 7.63403200 | 7.63403200 | CLA |
| −256.03492600 | 2.83160000 | 2.83160000 | CLA |
| −257.27991400 | −2.01510200 | −2.01510200 | CLA |
| −258.26056300 | −6.90202700 | −6.90202700 | CLA |
| −258.97411000 | −11.82502800 | −11.82502800 | CLA |
| −259.41821000 | −16.77985300 | −16.77985300 | CLA |
| −259.59094200 | −21.76215200 | −21.76215200 | CLA |
| −259.49081700 | −26.76747100 | −26.76747100 | CLA |
| −259.11677800 | −31.79125700 | −31.79125700 | CLA |
| −258.46820200 | −36.82885800 | −36.82885800 | CLA |
| −257.54489300 | −41.87552300 | −41.87552300 | CLA |
| −256.34708200 | −46.92640000 | −46.92640000 | CLA |
| −254.87541300 | −51.97654200 | −51.97654200 | CLA |
| −253.13093700 | −57.02090100 | −57.02090100 | CLA |
| −251.11510000 | −62.05433300 | −62.05433300 | CLA |
| −248.82972800 | −67.07159700 | −67.07159700 | CLA |
| −246.27701400 | −72.06735500 | −72.06735500 | CLA |
| −243.45950400 | −77.03617900 | −77.03617900 | CLA |
| −240.38007900 | −81.97254400 | −81.97254400 | CLA |
| −237.04194200 | −86.87084100 | −86.87084100 | CLA |
| −231.96108600 | −91.93003900 | −87.66439900 | CLA |
| −215.75319900 | −97.95558800 | −57.71637300 | CLA |
| −200.50494000 | −102.97145500 | −29.26997800 | CLA |
| −187.50396000 | −107.03629500 | −6.21712400 | CLA |
| −176.16536800 | −110.38803000 | 12.79151000 | CLA |
| −166.08539300 | −113.19140700 | 28.69025100 | CLA |
| −156.97673300 | −115.56411200 | 42.14652500 | CLA |
| −148.62973700 | −117.59244200 | 53.64975800 | CLA |
| −140.88812900 | −119.34110800 | 63.56693800 | CLA |
| −133.63328500 | −120.85957600 | 72.17859500 | CLA |
| −126.77374700 | −122.18629300 | 79.70278000 | CLA |
| −120.23804100 | −123.35158400 | 86.31147700 | CLA |
| −113.96964400 | −124.37968000 | 92.14209800 | CLA |
| −107.92338600 | −125.29016100 | 97.30569100 | CLA |
| −102.06283300 | −126.09901100 | 101.89290600 | CLA |
| −96.35834900 | −126.81939500 | 105.97841200 | CLA |
| −90.78564100 | −127.46224600 | 109.62420100 | CLA |
| −85.32465800 | −128.03670200 | 112.88210200 | CLA |
| −79.95873600 | −128.55045100 | 115.79571500 | CLA |
| −74.67394200 | −129.00999300 | 118.40190700 | CLA |
| −69.45855200 | −129.42085000 | 120.73199200 | CLA |
| −64.30264200 | −129.78772800 | 122.81266100 | CLA |
| −59.19775900 | −130.11464900 | 124.66672400 | CLA |
| −54.13665500 | −130.40505600 | 126.31370400 | CLA |
| −49.11308000 | −130.66189700 | 127.77032000 | CLA |
| −44.12159800 | −130.88769300 | 129.05087400 | CLA |
| −39.15744700 | −131.08459700 | 130.16757100 | CLA |
| −34.21642400 | −131.25443500 | 131.13077000 | CLA |
| −29.29477500 | −131.39874700 | 131.94920200 | CLA |
| −24.38912200 | −131.51881300 | 132.63013400 | CLA |
| −19.49638000 | −131.61568300 | 133.17950800 | CLA |
| −14.61370400 | −131.69018800 | 133.60204800 | CLA |
| −9.73842500 | −131.74296200 | 133.90134800 | CLA |
| −4.86800800 | −131.77445100 | 134.07993100 | CLA |
| −0.00000000 | −131.78491900 | 134.13929300 | CLA |
| 4.86800800 | −131.77445100 | 134.07993100 | CLA |
| 9.73842500 | −131.74296200 | 133.90134800 | CLA |
| 14.61370400 | −131.69018800 | 133.60204800 | CLA |
| 19.49638000 | −131.61568300 | 133.17950800 | CLA |
| 24.38912200 | −131.51881300 | 132.63013400 | CLA |
| 29.29477500 | −131.39874700 | 131.94920200 | CLA |
| 34.21642400 | −131.25443500 | 131.13077000 | CLA |
| 39.15744700 | −131.08459700 | 130.16757100 | CLA |
| 44.12159800 | −130.88769300 | 129.05087400 | CLA |
| 49.11308000 | −130.66189700 | 127.77032000 | CLA |
| 54.13665500 | −130.40505600 | 126.31370400 | CLA |
| 59.19775900 | −130.11464900 | 124.66672400 | CLA |
| 64.30264200 | −129.78772800 | 122.81266100 | CLA |
| 69.45855200 | −129.42085000 | 120.73199200 | CLA |
| 74.67394200 | −129.00999300 | 118.40190700 | CLA |
| 79.95873600 | −128.55045100 | 115.79571500 | CLA |
| 85.32465800 | −128.03670200 | 112.88210200 | CLA |
| 90.78564100 | −127.46224600 | 109.62420100 | CLA |
| 96.35834900 | −126.81939500 | 105.97841200 | CLA |
| 102.06283300 | −126.09901100 | 101.89290600 | CLA |
| 107.92338600 | −125.29016100 | 97.30569100 | CLA |
| 113.96964400 | −124.37968000 | 92.14209800 | CLA |
| 120.23804100 | −123.35158400 | 86.31147700 | CLA |
| 126.77374700 | −122.18629300 | 79.70278000 | CLA |
| 133.63328500 | −120.85957600 | 72.17859500 | CLA |
| 140.88812900 | −119.34110800 | 63.56693800 | CLA |
| 148.62973700 | −117.59244200 | 53.64975800 | CLA |
| 156.97673300 | −115.56411200 | 42.14652500 | CLA |
| 166.08539300 | −113.19140700 | 28.69025100 | CLA |
| 176.16536800 | −110.38803000 | 12.79151000 | CLA |
| 187.50396000 | −107.03629500 | −6.21712400 | CLA |
| 200.50494000 | −102.97145500 | −29.26997800 | CLA |
| 215.75319900 | −97.95558800 | −57.71637300 | CLA |
| 231.96108600 | −91.93003900 | −87.66439900 | CLA |
| 237.04194200 | −86.87084100 | −86.87084100 | CLA |
| 240.38007900 | −81.97254400 | −81.97254400 | CLA |
| 243.45950400 | −77.03617900 | −77.03617900 | CLA |
| 246.27701400 | −72.06735500 | −72.06735500 | CLA |
| 248.82972800 | −67.07159700 | −67.07159700 | CLA |
| 251.11510000 | −62.05433300 | −62.05433300 | CLA |
| 253.13093700 | −57.02090100 | −57.02090100 | CLA |
| 254.87541300 | −51.97654200 | −51.97654200 | CLA |
| 256.34708200 | −46.92640000 | −46.92640000 | CLA |
| 257.54489300 | −41.87552300 | −41.87552300 | CLA |
| 258.46820200 | −36.82885800 | −36.82885800 | CLA |
| 259.11677800 | −31.79125700 | −31.79125700 | CLA |
| 259.49081700 | −26.76747100 | −26.76747100 | CLA |
| 259.59094200 | −21.76215200 | −21.76215200 | CLA |
| 259.41821000 | −16.77985300 | −16.77985300 | CLA |
| 258.97411000 | −11.82502800 | −11.82502800 | CLA |
| 258.26056300 | −6.90202700 | −6.90202700 | CLA |
| 257.27991400 | −2.01510200 | −2.01510200 | CLA |
| 256.03492600 | 2.83160000 | 2.83160000 | CLA |
| 254.52877100 | 7.63403200 | 7.63403200 | CLA |
| 252.76501100 | 12.38825600 | 12.38825600 | CLA |
| 250.74758900 | 17.09043500 | 17.09043500 | CLA |
| 248.48080600 | 21.73684100 | 21.73684100 | CLA |
| 245.96930200 | 26.32385100 | 26.32385100 | CLA |
| 243.21803600 | 30.84795100 | 30.84795100 | CLA |
| 240.23226000 | 35.30573300 | 35.30573300 | CLA |
| 237.01749200 | 39.69389700 | 39.69389700 | CLA |
| 233.57949800 | 44.00925100 | 44.00925100 | CLA |
| 229.92425500 | 48.24870700 | 48.24870700 | CLA |
| 226.05793100 | 52.40928400 | 52.40928400 | CLA |
| 221.98685600 | 56.48810300 | 56.48810300 | CLA |
| 217.71749400 | 60.48238700 | 60.48238700 | CLA |
| 213.25641600 | 64.38946000 | 64.38946000 | CLA |
| 208.61027600 | 68.20674000 | 68.20674000 | CLA |

TABLE 6-continued for FIG. 10: Stop polygon AS in the imaging beam path between M9 and M10

| X[mm] | Y[mm] | Z[mm] | Type |
|---|---|---|---|
| 203.78578300 | 71.93174200 | 71.93174200 | CLA |
| 198.78968100 | 75.56207400 | 75.56207400 | CLA |
| 193.62872100 | 79.09543300 | 79.09543300 | CLA |
| 188.30964600 | 82.52960300 | 82.52960300 | CLA |
| 182.83916900 | 85.86245400 | 85.86245400 | CLA |
| 177.22395400 | 89.09193600 | 89.09193600 | CLA |
| 171.47060200 | 92.21608300 | 92.21608300 | CLA |
| 165.58563900 | 95.23300400 | 95.23300400 | CLA |
| 159.57550100 | 98.14088700 | 98.14088700 | CLA |
| 153.44653000 | 100.93799400 | 100.93799400 | CLA |
| 147.20495800 | 103.62266000 | 103.62266000 | CLA |
| 140.85691200 | 106.19329300 | 106.19329300 | CLA |
| 134.40839900 | 108.64837300 | 108.64837300 | CLA |
| 127.86531200 | 110.98644900 | 110.98644900 | CLA |
| 121.23342700 | 113.20614300 | 113.20614300 | CLA |
| 114.51840200 | 115.30614500 | 115.30614500 | CLA |
| 107.72578000 | 117.28521600 | 117.28521600 | CLA |
| 100.86099500 | 119.14218500 | 119.14218500 | CLA |
| 93.92937000 | 120.87595600 | 120.87595600 | CLA |
| 86.93612800 | 122.48549900 | 122.48549900 | CLA |
| 79.88639400 | 123.96985800 | 123.96985800 | CLA |
| 72.78520400 | 125.32814900 | 125.32814900 | CLA |
| 65.63750700 | 126.55956000 | 126.55956000 | CLA |
| 58.44817700 | 127.66335300 | 127.66335300 | CLA |
| 51.22201700 | 128.63886500 | 128.63886500 | CLA |
| 43.96377000 | 129.48550800 | 129.48550800 | CLA |
| 36.67812000 | 130.20277000 | 130.20277000 | CLA |
| 29.36970700 | 130.79021600 | 130.79021600 | CLA |
| 22.04313100 | 131.24749000 | 131.24749000 | CLA |
| 14.70296100 | 131.57431400 | 131.57431400 | CLA |
| 7.35374100 | 131.77048700 | 131.77048700 | CLA |

An overall reflectivity of the projection optical unit 25 is approximately 8.49%.

The image field 8 has an x-extent of two-times 13.0 mm and a y-extent of 1.0 mm. The projection optical unit 25 is optimized for an operating wavelength of the illumination light 3 of 13.5 nm.

Figure 11:
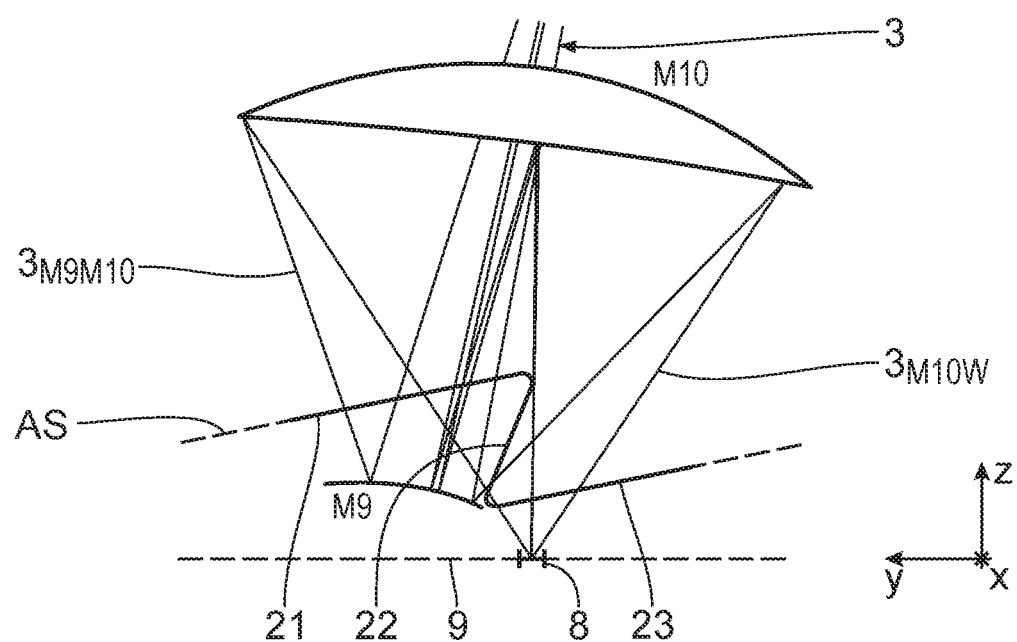

FIG. 11 shows the profile of the stop AS in the case of the projection optical unit 25. The differences of this stop AS of the projection optical unit 25 with respect to those of the stop AS of the projection optical unit 20 are explained below.

Between the stop sections 21 and 22, on the one hand, and the stop section 22 and the carrying section 23, on the other hand, the stop AS of the projection optical unit 25 is bent in each case to a significantly greater extent than in the case of the stop AS of the projection optical unit 20. In the case of the stop AS of the projection optical unit 25, the bending angles are in each case such that the sections 21, 22, on the one hand, and the sections 22, 23, on the other hand, run at acute angles with respect to one another.

The stop section 21 delimits the pupil marginal contour of the projection optical unit 25 beyond the two extreme marginal positions E(x), E(−x), approximately as far as maximum marginal positions $R_{max(x)}$ and $R_{max(−x)}$ (cf. FIG. 4). Starting from these maximum marginal positions $R_{max(x)}$ and $R_{max(−x)}$, the stop contour makes way for the imaging light partial beam $3_{M10W}$ on the one hand in the negative z-direction and on the other hand in the positive y-direction and delimits the rest of the pupil marginal contour in accordance with the stop AS of the projection optical unit 21. Following the marginal positions $R_{max(x)}$ and $R_{max(−x)}$, the stop AS of the projection optical unit 25 thus transitions into the web region S of the stop embodiment of the projection optical unit 20 according to FIGS. 7 and 8.

The marginal contours of the stops AS of the projection optical units 20 and 25 have a three-dimensional profile. The marginal contours of the stops AS of the projection optical units 20 and 25 are embodied in each case in a plane fashion in sections. The stops AS of the projection optical units 20 and 25 delimit the pupil marginal contour 24 in more than one plane.

Figure 12:
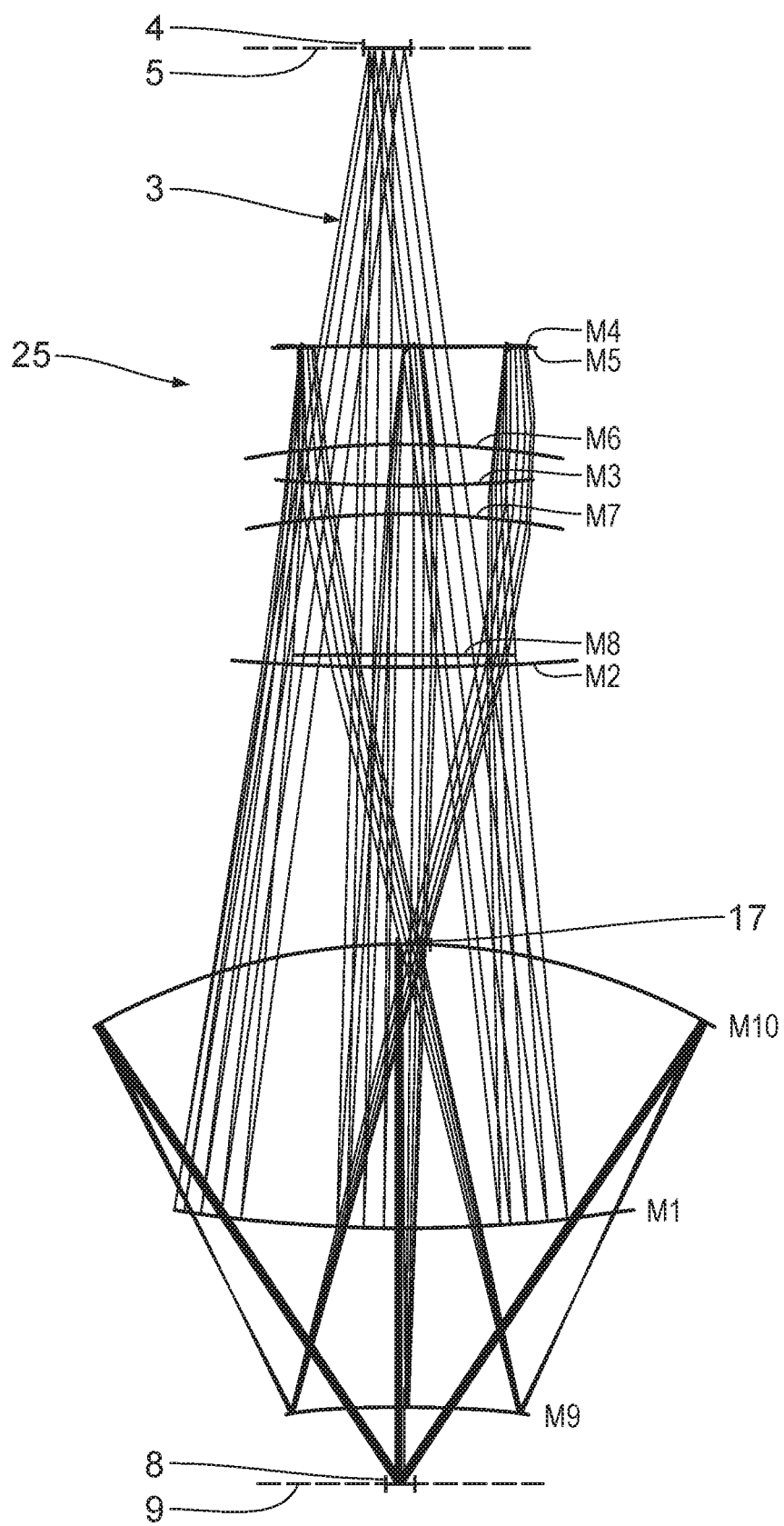

FIG. 12 shows a sagittal view of the projection optical unit 25.

A further embodiment of a projection optical unit 26, which can be used in the projection exposure apparatus 1 according to FIG. 1 instead of the projection optical unit 7, is explained in the following text on the basis of FIGS. 13 to 15. Components and functions which have already been explained above in the context of FIGS. 1 to 12 are denoted, where applicable, by the same reference signs and are not discussed again in detail.

The mirrors M1 to M10 are once again configured as free-form surfaces for which the free-form surface equation (1) indicated above holds true. The optical design data from the projection optical unit 26 can be gathered from the following tables, which, in terms of their design, correspond to the tables for the projection optical unit 7 according to FIG. 2.

Figure 13:
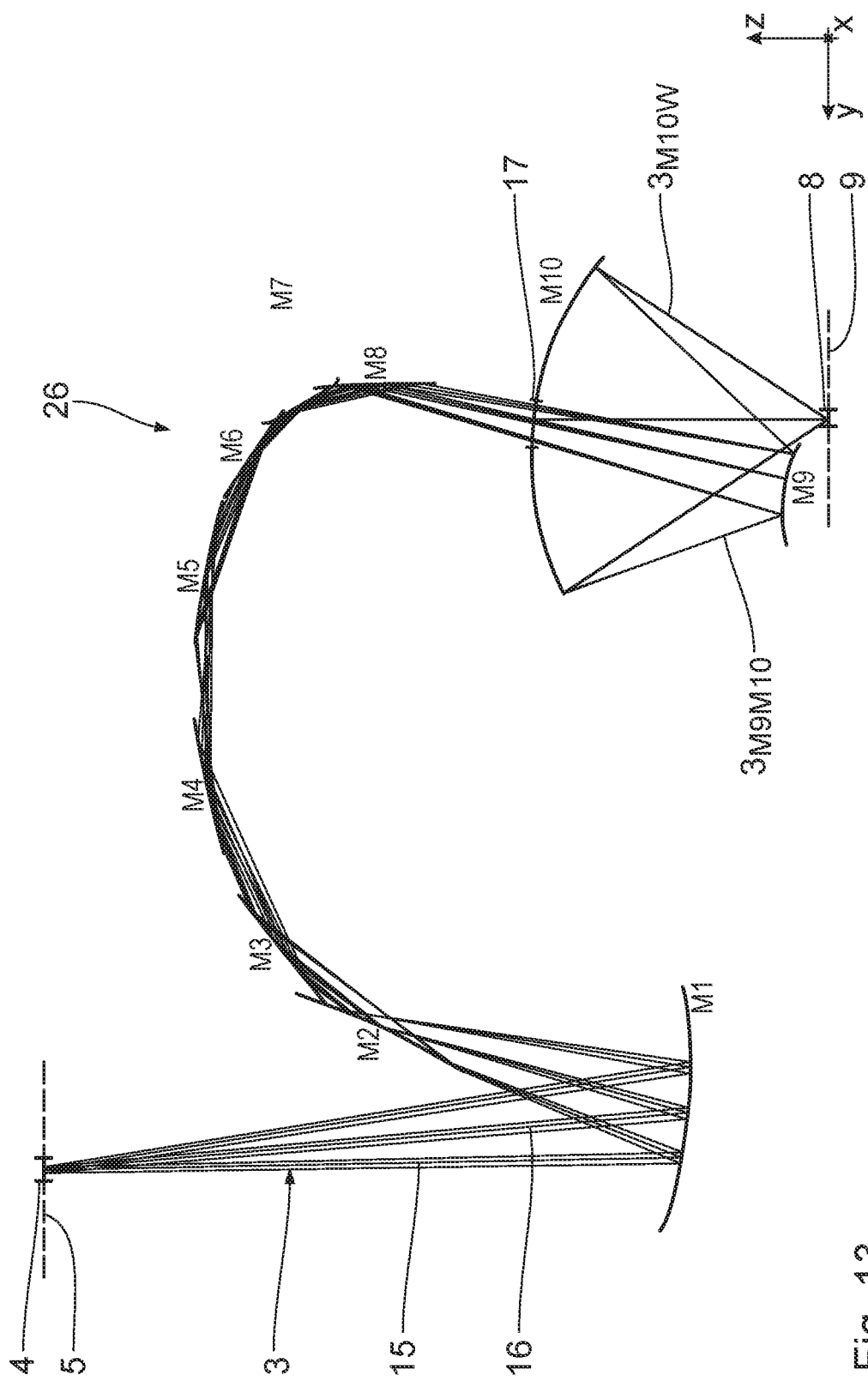
FIGS. 13 to 15 show illustrations similar to FIGS. 2, 3 and 5 of a further embodiment of an imaging optical unit, usable as a projection lens in the projection exposure apparatus according to FIG. 1.

TABLE 1 for FIG. 13

| Exemplary embodiment | FIG. 13 |
|---|---|
| NA | 0.55 |
| Wavelength | 13.5 nm |
| Field dimension x | 26.0 mm |
| Field dimension y | 1.0 mm |
| Field curvature | −0.012345 1/mm |
| Stop | AS |

TABLE 2 for FIG. 13

| Surface | Radius_x[mm] | Power_x[1/mm] | Radius_y[mm] | Power_y[1/mm] | Operating mode |
|---|---|---|---|---|---|
| M10 | −924.4981198 | 0.0021492 | −841.5674623 | 0.0023921 | REFL |
| M9 | 1845.8313982 | −0.0010835 | 356.4114777 | −0.0056115 | REFL |
| M8 | −807.7853011 | 0.0006289 | −16794.6817783 | 0.0004689 | REFL |
| M7 | −633.7019549 | 0.0007380 | 20332.8433550 | −0.0004206 | REFL |
| M6 | −1159.7877847 | 0.0003528 | −7078.0588424 | 0.0013813 | REFL |
| M5 | −7911.6202298 | 0.0000533 | −2197.1749958 | 0.0043148 | REFL |
| M4 | 6252.7176733 | −0.0000660 | −2753.7274849 | 0.0035212 | REFL |
| M3 | 1718.6984546 | −0.0002678 | −10060.7554809 | 0.0008638 | REFL |
| M2 | 1592.6268445 | −0.0002500 | 2592.5626309 | −0.0038746 | REFL |
| M1 | −2135.9876330 | 0.0009216 | −1377.1202039 | 0.0014756 | REFL |

TABLE 3a for FIG. 13

| Coeffi- | M10 | M9 | M8 |
|---|---|---|---|
| KY | 0.00000000 | 0.00000000 | 0.00000000 |
| KX | 0.00000000 | 0.00000000 | 0.00000000 |
| RX | −924.49811980 | 1845.83139800 | −807.78530110 |
| C7 | 5.32161644e−09 | −7.19957299e−07 | 3.61958396e−07 |
| C9 | 1.2051462e−08 | 1.48021766e−06 | 4.61852728e−08 |
| C10 | −4.28738318e−12 | 3.94779844e−10 | 1.36275822e−10 |
| C12 | −3.49709402e−11 | 2.67402017e−09 | 4.92199166e−11 |
| C14 | −9.81786584e−12 | 6.31481582e−09 | −4.23949539e−10 |
| C16 | −3.40219667e−15 | −2.74047503e−12 | 1.12548598e−12 |
| C18 | 1.60335869e−14 | 2.04228406e−14 | 3.71761249e−13 |
| C20 | 1.30399612e−14 | 3.2725238e−11 | −2.05971586e−12 |
| C21 | −1.15274335e−17 | 2.35879877e−15 | 1.09054091e−15 |
| C23 | −6.9260806e−17 | 1.00239611e−14 | 1.70911423e−15 |
| C25 | −7.13524377e−17 | 5.05529889e−14 | −3.62622238e−15 |
| C27 | −1.67322747e−17 | 1.78538542e−13 | −7.36849912e−15 |
| C29 | −7.92528578e−21 | −4.11347975e−18 | −2.59696939e−18 |
| C31 | 1.27834004e−20 | −5.83032641e−17 | 1.25679501e−17 |
| C33 | 3.27119661e−20 | 1.71591989e−16 | −1.04543394e−17 |
| C35 | 1.71377495e−20 | 1.22876874e−15 | −3.91086555e−17 |
| C36 | −1.89551894e−23 | −4.14843428e−22 | 5.26679107e−21 |
| C38 | −1.11996388e−22 | 1.06656248e−19 | 2.8502374e−20 |
| C40 | −1.96750203e−22 | 2.08419251e−19 | 6.3260457e−20 |
| C42 | −1.2392523e−22 | 8.95301505e−19 | 4.7233819e−21 |
| C44 | −2.47458966e−23 | 8.36809183e−18 | −2.27707911e−19 |
| C46 | −9.77909864e−27 | −1.02394711e−22 | 1.39450428e−22 |
| C48 | 5.19824336e−27 | −7.95041789e−23 | 1.68839235e−22 |
| C50 | 5.59498452e−26 | 8.75666056e−22 | 2.79254271e−22 |
| C52 | 6.43656264e−26 | 4.60087068e−21 | −9.11661464e−23 |
| C54 | 1.96031627e−26 | 4.50459082e−20 | 1.98458883e−22 |
| C55 | −1.9734083e−29 | 2.61667221e−26 | −4.54521391e−26 |
| C57 | −1.39192995e−28 | −1.48955085e−25 | 1.23387971e−24 |
| C59 | −3.49342237e−28 | 2.18616238e−24 | 4.57708029e−24 |
| C61 | −3.79015472e−28 | 8.50729665e−24 | 6.06052772e−24 |
| C63 | −1.77868817e−28 | 2.63725246e−23 | 6.16661588e−26 |
| C65 | −2.61320106e−29 | 1.37431086e−22 | 9.18355997e−24 |
| C67 | −1.75320584e−32 | 1.91491617e−28 | −2.00093096e−27 |
| C69 | −1.49695509e−32 | −5.27938029e−27 | 2.16982668e−27 |
| C71 | 6.84912486e−32 | −5.29216183e−27 | −7.30096104e−27 |
| C73 | 1.54586906e−31 | 4.04146338e−26 | −4.93769708e−27 |
| C75 | 1.15783975e−31 | 2.37812676e−25 | −4.16594376e−26 |
| C77 | 4.14587364e−32 | 1.20314674e−24 | −1.62235584e−25 |
| C78 | −5.34426777e−35 | 4.49836638e−31 | 6.13330376e−30 |
| C80 | −4.27488688e−34 | 1.29694668e−29 | −1.62333428e−29 |
| C82 | −1.25436413e−33 | 3.24280489e−29 | −1.68167617e−28 |
| C84 | −1.71502766e−33 | 3.00254831e−29 | −4.89454528e−28 |
| C86 | −1.25734127e−33 | 7.46446045e−28 | −6.5895393e−28 |
| C88 | −5.19929261e−34 | 5.84363659e−27 | −1.5416679e−27 |
| C90 | −9.42013117e−35 | 2.61240017e−26 | −3.38007496e−27 |
| C92 | 1.00872668e−38 | −4.95175891e−33 | 1.78435553e−32 |
| C94 | −1.45968234e−39 | 2.0913161e−33 | 1.10022934e−32 |
| C96 | 2.49294655e−38 | 9.54156933e−32 | 1.00044858e−30 |
| C98 | 1.25738947e−37 | −7.49916509e−33 | 1.98972461e−30 |
| C100 | 1.6844889e−37 | 7.35199153e−30 | −3.47483305e−30 |
| C102 | 7.66863005e−38 | 5.82871085e−29 | −1.47027148e−29 |
| C104 | −1.4887687e−38 | 2.15570834e−28 | −2.0886266e−29 |
| C105 | 3.84331333e−41 | −2.72151554e−36 | −1.09100622e−34 |
| C107 | 4.50330303e−40 | −6.8970507e−35 | 3.91399908e−34 |
| C109 | 1.60900752e−39 | −2.41557224e−34 | 4.01031765e−33 |
| C111 | 2.46751199e−39 | 1.07560857e−33 | 1.8289791e−32 |
| C113 | 1.94052198e−39 | 8.96263507e−33 | 2.87152163e−32 |
| C115 | 9.9606188e−40 | 4.77961552e−32 | −4.19223781e−33 |
| C117 | 4.55475999e−40 | 2.14647641e−31 | −4.42634085e−32 |
| C119 | 9.96424428e−41 | 6.08163641e−31 | −4.46533131e−32 |
| C121 | −6.67748909e−44 | 0 | 0 |
| C123 | −1.35652075e−43 | 0 | 0 |
| C125 | 1.98636308e−43 | 0 | 0 |
| C127 | 1.25607622e−42 | 0 | 0 |
| C129 | 2.10051386e−42 | 0 | 0 |
| C131 | 1.77289428e−42 | 0 | 0 |
| C133 | 7.94693346e−43 | 0 | 0 |
| C135 | 1.74862061e−43 | 0 | 0 |
| C136 | −1.77390976e−46 | 0 | 0 |
| C138 | −2.00142247e−45 | 0 | 0 |
| C140 | −8.6258998e−45 | 0 | 0 |
| C142 | −1.91465627e−44 | 0 | 0 |
| C144 | −2.50271596e−44 | 0 | 0 |

TABLE 3a-continued for FIG. 13

| Coeffi- | M10 | M9 | M8 |
|---|---|---|---|
| C146 | −2.03958823e−44 | 0 | 0 |
| C148 | −1.04613962e−44 | 0 | 0 |
| C150 | −3.18867421e−45 | 0 | 0 |
| C152 | −4.17582475e−46 | 0 | 0 |

TABLE 3b for FIG. 13

| Coeffi- | M7 | M6 | M5 |
|---|---|---|---|
| KY | 0.00000000 | 0.00000000 | 0.00000000 |
| KX | 0.00000000 | 0.00000000 | 0.00000000 |
| RX | −633.70195490 | −1159.78778500 | −7911.62023000 |
| C7 | −3.6838108e−08 | 8.9762673e−08 | 1.29208819e−08 |
| C9 | 1.66051547e−07 | 5.4606184e−08 | −4.52621083e−08 |
| C10 | 2.70786958e−11 | −4.84436976e−10 | −5.84676904e−10 |
| C12 | −4.05365907e−10 | 4.4034394e−11 | 3.29353371e−11 |
| C14 | 1.17570885e−09 | −8.49494866e−10 | 3.27657845e−11 |
| C16 | 5.32058235e−13 | −1.22366579e−12 | −4.06185258e−13 |
| C18 | −2.33907349e−12 | 3.31495258e−12 | −3.05655881e−13 |
| C20 | 1.03622586e−11 | 4.74017946e−12 | −9.90515078e−14 |
| C21 | 1.84951658e−17 | 4.70815441e−16 | 6.8177486e−16 |
| C23 | 1.97362743e−16 | −5.63918759e−15 | 1.78311332e−16 |
| C25 | −4.50645748e−14 | −2.04438614e−14 | 1.92769745e−15 |
| C27 | 1.22197136e−13 | −4.46320586e−14 | 1.11134948e−15 |
| C29 | −8.3397015e−19 | 3.12037967e−18 | 1.20925734e−18 |
| C31 | 5.73336291e−17 | 2.52930984e−17 | −2.68755339e−18 |
| C33 | −4.26965471e−16 | 2.57659349e−16 | −5.94759876e−18 |
| C35 | 1.12309508e−15 | 3.62043368e−16 | −4.78247891e−18 |
| C36 | −2.54002154e−21 | −2.33285817e−21 | 8.64176325e−21 |
| C38 | 6.58698589e−22 | 6.78093367e−21 | 2.69603122e−21 |
| C40 | 9.19834216e−19 | −6.09316184e−19 | 1.90190625e−20 |
| C42 | −5.20603364e−18 | −2.48560476e−18 | 2.06136053e−20 |
| C44 | 1.95177251e−17 | −3.71987432e−18 | 1.52178482e−20 |
| C46 | 5.11031274e−23 | −2.36475219e−24 | 1.40723013e−23 |
| C48 | −5.22351362e−22 | 1.08955249e−21 | −1.74886691e−23 |
| C50 | 1.29955621e−20 | 6.28062297e−21 | −1.31280422e−22 |
| C52 | −7.19352591e−20 | 2.83502526e−20 | −1.33189978e−22 |
| C54 | 3.01583882e−19 | 4.05968238e−20 | −5.11578136e−23 |
| C55 | −3.2378259e−26 | 5.04920803e−26 | −9.74226056e−26 |
| C57 | 2.56114803e−26 | −1.66126857e−24 | 1.25073538e−25 |
| C59 | −2.15568526e−23 | −1.21962666e−23 | 3.61644254e−25 |
| C61 | 7.54597503e−23 | −7.85294647e−23 | 6.17670028e−25 |
| C63 | −1.37768633e−21 | −2.60819335e−22 | 3.1972004e−25 |
| C65 | −9.91125998e−22 | −3.82043453e−22 | 5.14604952e−26 |
| C67 | 8.86143266e−29 | 1.38719494e−27 | −4.85096213e−29 |
| C69 | 2.95926995e−28 | 1.1409927e−26 | −1.52883817e−29 |
| C71 | −4.08946521e−25 | 1.70193798e−25 | −2.99192047e−28 |
| C73 | 1.1764e−24 | 5.79647838e−25 | 1.27326956e−27 |
| C75 | −1.82271068e−23 | 1.8185183e−24 | 2.14215183e−27 |
| C77 | −6.0476105e−23 | 2.47496013e−24 | −2.43586456e−28 |
| C78 | −1.46974123e−31 | −2.4888067e−30 | 2.2910216e−30 |
| C80 | −1.62035317e−29 | −3.63910799e−30 | −2.10355105e−30 |
| C82 | 2.64119709e−28 | −1.39124488e−28 | −3.56165247e−30 |
| C84 | −2.75435112e−27 | −9.92371827e−28 | −1.25073816e−29 |
| C86 | 6.06493358e−26 | −2.9562807e−27 | −1.02346615e−29 |
| C88 | −1.82794269e−25 | −7.99387324e−27 | 1.25693216e−30 |
| C90 | 8.10697778e−25 | −1.01333935e−26 | 6.64972771e−30 |
| C92 | −5.94852836e−33 | −2.20554773e−33 | 1.22259104e−33 |
| C94 | 7.23973112e−32 | 1.10525284e−31 | −1.24849687e−32 |
| C96 | 7.40539289e−30 | −4.613537e−32 | −3.29652704e−32 |
| C98 | 4.88216265e−30 | 4.80483016e−30 | −8.41705133e−32 |
| C100 | 9.65449531e−28 | 6.23756899e−30 | −1.57134898e−31 |
| C102 | −1.70876067e−27 | 2.1445453e−29 | −1.2032548e−31 |
| C104 | 2.67082934e−26 | 2.28654521e−29 | −3.36577402e−32 |
| C105 | 2.35094421e−36 | 2.08468354e−35 | −1.08251776e−35 |
| C107 | 3.37747137e−34 | −1.04397603e−34 | 3.142163e−35 |
| C109 | 7.70896596e−34 | 2.85346997e−34 | 8.01180965e−35 |
| C111 | 6.84579774e−32 | −8.80664689e−35 | 3.89769754e−34 |
| C113 | −9.31004972e−32 | −9.19882787e−33 | 7.80016296e−34 |
| C115 | 5.48180337e−30 | −1.39857273e−33 | 7.27970094e−34 |

TABLE 3b-continued for FIG. 13

| Coeffi- | M7 | M6 | M5 |
|---|---|---|---|
| C117 | −9.40923091e−30 | −2.85191959e−32 | 3.44660803e−34 |
| C119 | 1.58250782e−28 | −2.04899764e−32 | 5.28320959e−35 |

TABLE 3c for FIG. 13

| Coeffi- | M4 | M3 | M2 |
|---|---|---|---|
| KY | 0.00000000 | 0.00000000 | 0.00000000 |
| KX | 0.00000000 | 0.00000000 | 0.00000000 |
| RX | 6252.71767300 | 1718.69845500 | 1592.62684400 |
| C7 | 2.02039657e−07 | −7.72442186e−08 | −2.81200257e−07 |
| C9 | 6.26194854e−08 | −6.39011454e−08 | −4.33420894e−07 |
| C10 | −1.17096485e−10 | 5.38504965e−10 | 2.16914992e−10 |
| C12 | 1.65918593e−10 | 1.54474735e−10 | −2.43233271e−10 |
| C14 | 2.6047855e−11 | −5.67012949e−11 | 1.0908048e−09 |
| C16 | 1.53352973e−13 | −1.28128634e−12 | −1.3249687e−12 |
| C18 | 6.85280998e−14 | 3.29016521e−13 | 2.3245033e−12 |
| C20 | 1.33134745e−14 | −7.9135182e−14 | −2.74288101e−12 |
| C21 | 9.63392843e−16 | −2.23006179e−16 | −3.54173468e−16 |
| C23 | −2.56356327e−16 | 8.08610012e−16 | 5.15456653e−15 |
| C25 | −4.93143601e−16 | −1.64061139e−16 | −1.06774698e−14 |
| C27 | −3.50827102e−17 | −8.3638218e−18 | 5.96789915e−15 |
| C29 | −1.32470314e−18 | 2.06883208e−18 | 1.70541615e−18 |
| C31 | −1.08456401e−18 | −3.75046097e−18 | −2.42446489e−17 |
| C33 | −3.23480928e−19 | 1.52741866e−18 | 4.43191025e−17 |
| C35 | −3.72075346e−19 | 1.62584985e−18 | −1.05861269e−17 |
| C36 | −3.85707039e−21 | −2.85425871e−21 | 1.53834046e−21 |
| C38 | 7.16357253e−21 | 4.79674043e−21 | −1.1251108e−20 |
| C40 | −1.76766744e−21 | 6.62315222e−22 | 1.18315789e−19 |
| C42 | −5.70159933e−21 | −2.6546097e−21 | −1.77703731e−19 |
| C44 | −3.65158025e−21 | 1.5355861e−20 | 1.37862764e−20 |
| C46 | −2.99726604e−23 | −7.26058549e−23 | −2.55922076e−23 |
| C48 | −4.17503344e−23 | −9.21476496e−23 | 1.00193833e−22 |
| C50 | −4.7884568e−23 | −2.35567601e−22 | −5.31735424e−22 |
| C52 | −6.91516977e−24 | −1.35526865e−22 | 6.79507546e−22 |
| C54 | 1.98546253e−23 | 9.61975988e−23 | 4.01660209e−23 |
| C55 | −1.94031018e−26 | 1.56888896e−25 | −1.38213528e−26 |
| C57 | −3.42382432e−25 | 2.2750218e−25 | 1.79376182e−25 |
| C59 | −2.2756817e−25 | −1.23549695e−25 | −5.94897934e−25 |
| C61 | 2.01539859e−25 | 2.29974662e−25 | 2.27901415e−24 |
| C63 | 4.95631548e−25 | 8.59853428e−25 | −2.22922414e−24 |
| C65 | 1.12176727e−25 | 1.26876311e−24 | −7.70058057e−25 |
| C67 | 9.06942404e−28 | 9.3079309e−28 | 3.74223228e−28 |
| C69 | 1.9957938e−27 | 4.99157193e−27 | −9.62902214e−28 |
| C71 | 3.12476201e−27 | 1.58761398e−26 | 2.15189986e−27 |
| C73 | 4.54981924e−27 | 1.53821757e−26 | −8.59545995e−27 |
| C75 | 6.59335485e−28 | 3.62238546e−27 | 5.36715829e−27 |
| C77 | −1.58015986e−27 | −1.19949042e−27 | 5.14863336e−27 |
| C78 | 4.37655985e−30 | −2.15256015e−30 | −6.68041182e−32 |
| C80 | 8.62343063e−30 | −8.27474872e−30 | −2.88698633e−30 |
| C82 | 1.3965552e−29 | −1.85964202e−29 | 2.97808799e−30 |
| C84 | 1.2610299e−29 | −5.63075807e−29 | −9.25513518e−30 |
| C86 | −4.82567841e−30 | −7.58802797e−29 | 2.1567675e−29 |
| C88 | −1.35566233e−29 | −6.2816052e−29 | −8.2378632e−30 |
| C90 | 8.35698293e−31 | −2.48292667e−29 | −1.8363031e−29 |
| C92 | −6.20912191e−33 | −1.53848466e−33 | −2.72722676e−33 |
| C94 | −3.03339233e−32 | −5.56751434e−32 | 9.35668771e−33 |
| C96 | −4.15846221e−32 | −2.81174802e−31 | 1.01318148e−32 |
| C98 | −1.20240425e−31 | −5.69729421e−31 | 4.31201041e−32 |
| C100 | −1.23999978e−31 | −3.40400557e−31 | −2.58821352e−32 |
| C102 | 1.77507014e−33 | −9.97858945e−32 | 6.91936623e−33 |
| C104 | 3.83557979e−32 | 1.09580074e−31 | 3.45333625e−32 |
| C105 | −1.52261212e−35 | 5.38313447e−37 | 2.4018539e−36 |
| C107 | −7.96360046e−35 | 8.5583118e−35 | 1.94949839e−35 |
| C109 | −2.50162343e−34 | 3.84351739e−34 | −2.7269109e−35 |
| C111 | −2.81541874e−34 | 1.85492006e−33 | −5.57867255e−35 |
| C113 | −6.28531061e−34 | 2.60940268e−33 | −8.0628501e−35 |
| C115 | 2.25293161e−35 | 2.55655776e−33 | 6.48059264e−36 |
| C117 | 7.79107372e−35 | 1.01920129e−33 | −2.46632816e−36 |
| C119 | −1.12500845e−34 | 7.43677377e−34 | −2.70846382e−35 |

TABLE 3d for FIG. 13

| Coefficient | M1 |
|---|---|
| KY | 0.00000000 |
| KX | 0.00000000 |
| RX | −2135.98763300 |
| C7 | −3.62667214e−08 |
| C9 | −8.77001096e−09 |
| C10 | −7.9878408e−12 |
| C12 | 3.57622422e−11 |
| C14 | 5.67666306e−11 |
| C16 | −1.00670933e−14 |
| C18 | −6.43363507e−14 |
| C20 | 3.49263438e−14 |
| C21 | −1.83622059e−18 |
| C23 | 1.63146414e−17 |
| C25 | 2.33281554e−16 |
| C27 | −2.13403252e−16 |
| C29 | −7.17734463e−22 |
| C31 | −7.76916167e−20 |
| C33 | −2.45391831e−19 |
| C35 | 9.06895125e−19 |
| C36 | −2.87240432e−24 |
| C38 | −5.67479156e−24 |
| C40 | 2.53075334e−22 |
| C42 | 2.33441297e−22 |
| C44 | −4.90816027e−21 |
| C46 | −1.82993123e−26 |
| C48 | 1.40735408e−25 |
| C50 | −1.62994831e−25 |
| C52 | 4.12295522e−24 |
| C54 | 2.26175423e−23 |
| C55 | 6.84620783e−30 |
| C57 | −8.9211373e−29 |
| C59 | 3.99552919e−28 |
| C61 | 2.87701829e−26 |
| C63 | 7.90515964e−26 |
| C65 | 4.93963599e−26 |
| C67 | 8.37008672e−32 |
| C69 | −9.8548077e−31 |
| C71 | −7.50758997e−30 |
| C73 | −6.72582496e−30 |
| C75 | 2.5702957e−28 |
| C77 | −1.08487883e−27 |
| C78 | 4.88158898e−36 |
| C80 | 1.55182242e−33 |
| C82 | 1.52095525e−32 |
| C84 | −1.27781492e−31 |
| C86 | −1.81913568e−30 |
| C88 | −5.89459163e−30 |
| C90 | 2.69055495e−30 |
| C92 | −4.03243187e−38 |
| C94 | 3.64827588e−36 |
| C96 | 3.2629352e−35 |
| C98 | 1.58289449e−34 |
| C100 | −1.41502554e−34 |
| C102 | −7.52721979e−33 |
| C104 | 1.42550505e−32 |
| C105 | −9.85463233e−41 |
| C107 | −4.7133732e−39 |
| C109 | −9.62905307e−38 |
| C111 | −4.88592887e−38 |
| C113 | 5.89605443e−36 |
| C115 | 4.37586765e−35 |
| C117 | 1.2944388e−34 |
| C119 | −5.79847892e−35 |

TABLE 4a for FIG. 13

| Surface | DCX | DCY | DCZ |
|---|---|---|---|
| Image | 0.00000000 | 0.00000000 | 0.00000000 |
| M10 | 0.00000000 | 0.00000000 | 805.12545493 |
| AS | 0.00000000 | 229.02635233 | 308.90327698 |

TABLE 4a-continued for FIG. 13

| Surface | DCX | DCY | DCZ |
|---|---|---|---|
| M9 | 0.00000000 | 161.70815863 | 113.71871405 |
| M8 | 0.00000000 | −95.26534725 | 1237.21684296 |
| M7 | 0.00000000 | −33.77425023 | 1447.75579022 |
| M6 | 0.00000000 | 65.18321239 | 1551.64751609 |
| M5 | −0.00000000 | 416.29245364 | 1699.16961083 |
| M4 | −0.00000000 | 1004.20719186 | 1696.34134424 |
| M3 | −0.00000000 | 1452.13094016 | 1490.08513977 |
| M2 | 0.00000000 | 1660.63260708 | 1219.01552868 |
| M1 | 0.00000000 | 1898.51696847 | 380.25896967 |
| Object | 0.00000000 | 2052.66210418 | 2142.14593325 |

TABLE 4b for FIG. 13

| Surface | TLA[deg] | TLB[deg] | TLC[deg] |
|---|---|---|---|
| Image | −0.00000000 | 0.00000000 | −0.00000000 |
| M10 | 6.58193819 | 0.00000000 | −0.00000000 |
| AS | 55.06787638 | 180.00000000 | 0.00000000 |
| M9 | 193.02365372 | 0.00000000 | −0.00000000 |
| M8 | 88.30109261 | 0.00000000 | −0.00000000 |
| M7 | 60.05609350 | 0.00000000 | −0.00000000 |
| M6 | 34.59181790 | 0.00000000 | 0.00000000 |
| M5 | 11.25728686 | −0.00000000 | −0.00000000 |
| M4 | −12.50018064 | −0.00000000 | −0.00000000 |
| M3 | −38.57896098 | −0.00000000 | −0.00000000 |
| M2 | −63.29951574 | 0.00000000 | −0.00000000 |
| M1 | 185.41707922 | 0.00000000 | −0.00000000 |
| Object | 0.00000000 | −0.00000000 | −0.00000000 |

TABLE 5 for FIG. 13

| Surface | Angle of incidence[deg] | Reflectivity |
|---|---|---|
| M10 | 6.54595976 | 0.66117442 |
| M9 | 0.00927824 | 0.66565898 |
| M8 | 75.28640231 | 0.80872358 |
| M7 | 76.47602867 | 0.82797480 |
| M6 | 78.19600462 | 0.85363243 |
| M5 | 77.82112299 | 0.84823720 |
| M4 | 78.09659958 | 0.85221174 |
| M3 | 76.69475350 | 0.83137235 |
| M2 | 78.51548223 | 0.85815147 |
| M1 | 10.19566395 | 0.65421760 |
| Overall transmis- | | 0.0849 |

TABLE 6

Stop polygon AS in the imaging beam path between M9 and M10

| X[mm] | Y[mm] | Z[mm] | Type |
|---|---|---|---|
| 0.00000000 | 353.51387100 | 0.00000000 | CLA |
| −12.96238300 | 352.78667200 | 0.00000000 | CLA |
| −25.85530400 | 350.61342700 | 0.00000000 | CLA |
| −38.61060800 | 347.01896200 | 0.00000000 | CLA |
| −51.16270500 | 342.04388900 | 0.00000000 | CLA |
| −63.44972800 | 335.74349800 | 0.00000000 | CLA |
| −75.41455000 | 328.18629200 | 0.00000000 | CLA |
| −87.00562600 | 319.45221900 | 0.00000000 | CLA |
| −98.17764100 | 309.63070300 | 0.00000000 | CLA |
| −108.89195400 | 298.81854400 | 0.00000000 | CLA |
| −119.11683100 | 287.11777800 | 0.00000000 | CLA |
| −128.82747700 | 274.63358000 | 0.00000000 | CLA |
| −138.00590000 | 261.47227200 | 0.00000000 | CLA |
| −146.64060400 | 247.73949500 | 0.00000000 | CLA |

TABLE 6-continued

Stop polygon AS in the imaging beam path between M9 and M10

| X[mm] | Y[mm] | Z[mm] | Type |
|---|---|---|---|
| −154.72616300 | 233.53858800 | 0.00000000 | CLA |
| −162.26269100 | 218.96920100 | 0.00000000 | CLA |
| −169.25524900 | 204.12615200 | 0.00000000 | CLA |
| −175.71320100 | 189.09853000 | 0.00000000 | CLA |
| −181.64955800 | 173.96904400 | 0.00000000 | CLA |
| −187.08033200 | 158.81358700 | 0.00000000 | CLA |
| −192.02390600 | 143.70100000 | 0.00000000 | CLA |
| −196.50044400 | 128.69301600 | 0.00000000 | CLA |
| −200.53134900 | 113.84434200 | 0.00000000 | CLA |
| −204.13877400 | 99.20286700 | 0.00000000 | CLA |
| −207.34519000 | 84.80996300 | 0.00000000 | CLA |
| −210.17301200 | 70.70085100 | 0.00000000 | CLA |
| −212.64428600 | 56.90502000 | 0.00000000 | CLA |
| −214.78042700 | 43.44667100 | 0.00000000 | CLA |
| −216.60201000 | 30.34518200 | 0.00000000 | CLA |
| −218.12860900 | 17.61556600 | 0.00000000 | CLA |
| −219.37867800 | 5.26892700 | 0.00000000 | CLA |
| −220.36947300 | −6.68710700 | 0.00000000 | CLA |
| −221.11699800 | −18.24796700 | 0.00000000 | CLA |
| −221.63599400 | −29.41175400 | 0.00000000 | CLA |
| −221.93993900 | −40.17888700 | 0.00000000 | CLA |
| −222.04107500 | −50.55176400 | 0.00000000 | CLA |
| −221.95044900 | −60.53447000 | 0.00000000 | CLA |
| −221.67796800 | −70.13250500 | 0.00000000 | CLA |
| −221.23246600 | −79.35254200 | 0.00000000 | CLA |
| −220.62177400 | −88.20221800 | 0.00000000 | CLA |
| −219.85279900 | −96.68994000 | 0.00000000 | CLA |
| −218.93160700 | −104.82472400 | 0.00000000 | CLA |
| −217.86350300 | −112.61605400 | 0.00000000 | CLA |
| −216.65311600 | −120.07375400 | 0.00000000 | CLA |
| −215.30448300 | −127.20788700 | 0.00000000 | CLA |
| −213.82112600 | −134.02866400 | 0.00000000 | CLA |
| −212.20613200 | −140.54636700 | 0.00000000 | CLA |
| −210.46222800 | −146.77128700 | 0.00000000 | CLA |
| −208.59184900 | −152.71367000 | 0.00000000 | CLA |
| −206.59720300 | −158.38367400 | 0.00000000 | CLA |
| −204.48033700 | −163.79132900 | 0.00000000 | CLA |
| −202.24318600 | −168.94651100 | 0.00000000 | CLA |
| −199.88762700 | −173.85891600 | 0.00000000 | CLA |
| −197.41552400 | −178.53803800 | 0.00000000 | CLA |
| −194.82876600 | −182.99315700 | 0.00000000 | CLA |
| −192.12929800 | −187.23332000 | 0.00000000 | CLA |
| −189.31915400 | −191.26733600 | 0.00000000 | CLA |
| −186.40047400 | −195.10376400 | 0.00000000 | CLA |
| −183.37552100 | −198.75090800 | 0.00000000 | CLA |
| −180.24669500 | −202.21681200 | 0.00000000 | CLA |
| −177.01653700 | −205.50925400 | 0.00000000 | CLA |
| −173.68773300 | −208.63574800 | 0.00000000 | CLA |
| −170.26310600 | −211.60353800 | 0.00000000 | CLA |
| −166.74561700 | −214.41960100 | 0.00000000 | CLA |
| −163.13835200 | −217.09064600 | 0.00000000 | CLA |
| −159.44450600 | −219.62311500 | 0.00000000 | CLA |
| −155.66737600 | −222.02318800 | 0.00000000 | CLA |
| −151.81033800 | −224.29678000 | 0.00000000 | CLA |
| −147.87683200 | −226.44955100 | 0.00000000 | CLA |
| −143.87034100 | −228.48690600 | 0.00000000 | CLA |
| −139.79437800 | −230.41400200 | 0.00000000 | CLA |
| −135.65245800 | −232.23575100 | 0.00000000 | CLA |
| −131.44809000 | −233.95682800 | 0.00000000 | CLA |
| −127.18474800 | −235.58167300 | 0.00000000 | CLA |
| −122.86586500 | −237.11450300 | 0.00000000 | CLA |
| −118.49481100 | −238.55931300 | 0.00000000 | CLA |
| −114.07488000 | −239.91988600 | 0.00000000 | CLA |
| −109.60928000 | −241.19979600 | 0.00000000 | CLA |
| −105.10112300 | −242.40242000 | 0.00000000 | CLA |
| −100.55341100 | −243.53093800 | 0.00000000 | CLA |
| −95.96903600 | −244.58834400 | 0.00000000 | CLA |
| −91.35076900 | −245.57745200 | 0.00000000 | CLA |
| −86.70126100 | −246.50089900 | 0.00000000 | CLA |
| −82.02303800 | −247.36115400 | 0.00000000 | CLA |
| −77.31850200 | −248.16052200 | 0.00000000 | CLA |
| −72.58993100 | −248.90114800 | 0.00000000 | CLA |
| −67.83948100 | −249.58502600 | 0.00000000 | CLA |
| −63.06919300 | −250.21399800 | 0.00000000 | CLA |
| −58.28099200 | −250.78976400 | 0.00000000 | CLA |
| −53.47669600 | −251.31388100 | 0.00000000 | CLA |

TABLE 6-continued

Stop polygon AS in the imaging beam path between M9 and M10

| X[mm] | Y[mm] | Z[mm] | Type |
|---|---|---|---|
| −48.65802100 | −251.78777000 | 0.00000000 | CLA |
| −43.82658700 | −252.21271800 | 0.00000000 | CLA |
| −38.98392900 | −252.58987900 | 0.00000000 | CLA |
| −34.13149800 | −252.92028200 | 0.00000000 | CLA |
| −29.27067600 | −253.20482600 | 0.00000000 | CLA |
| −24.40278100 | −253.44429000 | 0.00000000 | CLA |
| −19.52907500 | −253.63932700 | 0.00000000 | CLA |
| −14.65077700 | −253.79047200 | 0.00000000 | CLA |
| −9.76906600 | −253.89813800 | 0.00000000 | CLA |
| −4.88509600 | −253.96261900 | 0.00000000 | CLA |
| −0.00000000 | −253.98409300 | 0.00000000 | CLA |
| 4.88509600 | −253.96261900 | 0.00000000 | CLA |
| 9.76906600 | −253.89813800 | 0.00000000 | CLA |
| 14.65077700 | −253.79047200 | 0.00000000 | CLA |
| 19.52907500 | −253.63932700 | 0.00000000 | CLA |
| 24.40278100 | −253.44429000 | 0.00000000 | CLA |
| 29.27067600 | −253.20482600 | 0.00000000 | CLA |
| 34.13149800 | −252.92028200 | 0.00000000 | CLA |
| 38.98392900 | −252.58987900 | 0.00000000 | CLA |
| 43.82658700 | −252.21271800 | 0.00000000 | CLA |
| 48.65802100 | −251.78777000 | 0.00000000 | CLA |
| 53.47669600 | −251.31388100 | 0.00000000 | CLA |
| 58.28099200 | −250.78976400 | 0.00000000 | CLA |
| 63.06919300 | −250.21399800 | 0.00000000 | CLA |
| 67.83948100 | −249.58502600 | 0.00000000 | CLA |
| 72.58993100 | −248.90114800 | 0.00000000 | CLA |
| 77.31850200 | −248.16052200 | 0.00000000 | CLA |
| 82.02303800 | −247.36115400 | 0.00000000 | CLA |
| 86.70126100 | −246.50089900 | 0.00000000 | CLA |
| 91.35076900 | −245.57745200 | 0.00000000 | CLA |
| 95.96903600 | −244.58834400 | 0.00000000 | CLA |
| 100.55341100 | −243.53093800 | 0.00000000 | CLA |
| 105.10112300 | −242.40242000 | 0.00000000 | CLA |
| 109.60928000 | −241.19979600 | 0.00000000 | CLA |
| 114.07488000 | −239.91988600 | 0.00000000 | CLA |
| 118.49481100 | −238.55931300 | 0.00000000 | CLA |
| 122.86586500 | −237.11450300 | 0.00000000 | CLA |
| 127.18474800 | −235.58167300 | 0.00000000 | CLA |
| 131.44809000 | −233.95682800 | 0.00000000 | CLA |
| 135.65245800 | −232.23575100 | 0.00000000 | CLA |
| 139.79437800 | −230.41400200 | 0.00000000 | CLA |
| 143.87034100 | −228.48690600 | 0.00000000 | CLA |
| 147.87683200 | −226.44955100 | 0.00000000 | CLA |
| 151.81033800 | −224.29678000 | 0.00000000 | CLA |
| 155.66737600 | −222.02318800 | 0.00000000 | CLA |
| 159.44450600 | −219.62311500 | 0.00000000 | CLA |
| 163.13835200 | −217.09064600 | 0.00000000 | CLA |
| 166.74561700 | −214.41960100 | 0.00000000 | CLA |
| 170.26310600 | −211.60353800 | 0.00000000 | CLA |
| 173.68773300 | −208.63574800 | 0.00000000 | CLA |
| 177.01653700 | −205.50925400 | 0.00000000 | CLA |
| 180.24669500 | −202.21681200 | 0.00000000 | CLA |
| 183.37552100 | −198.75090800 | 0.00000000 | CLA |
| 186.40047400 | −195.10376400 | 0.00000000 | CLA |
| 189.31915400 | −191.26733600 | 0.00000000 | CLA |
| 192.12929800 | −187.23332000 | 0.00000000 | CLA |
| 194.82876600 | −182.99315700 | 0.00000000 | CLA |
| 197.41552400 | −178.53803800 | 0.00000000 | CLA |
| 199.88762700 | −173.85891600 | 0.00000000 | CLA |
| 202.24318600 | −168.94651100 | 0.00000000 | CLA |
| 204.48033700 | −163.79132900 | 0.00000000 | CLA |
| 206.59720300 | −158.38367400 | 0.00000000 | CLA |
| 208.59184900 | −152.71367000 | 0.00000000 | CLA |
| 210.46222800 | −146.77128700 | 0.00000000 | CLA |
| 212.20613200 | −140.54636700 | 0.00000000 | CLA |
| 213.82112600 | −134.02866400 | 0.00000000 | CLA |
| 215.30448300 | −127.20788700 | 0.00000000 | CLA |
| 216.65311600 | −120.07375400 | 0.00000000 | CLA |
| 217.86350300 | −112.61605400 | 0.00000000 | CLA |
| 218.93160700 | −104.82472400 | 0.00000000 | CLA |
| 219.85279900 | −96.68994000 | 0.00000000 | CLA |
| 220.62177400 | −88.20221800 | 0.00000000 | CLA |
| 221.23246600 | −79.35254200 | 0.00000000 | CLA |
| 221.67796800 | −70.13250500 | 0.00000000 | CLA |
| 221.95044900 | −60.53447000 | 0.00000000 | CLA |
| 222.04107500 | −50.55176400 | 0.00000000 | CLA |
| 221.93993900 | −40.17888700 | 0.00000000 | CLA |
| 221.63599400 | −29.41175400 | 0.00000000 | CLA |
| 221.11699800 | −18.24796700 | 0.00000000 | CLA |
| 220.36947300 | −6.68710700 | 0.00000000 | CLA |
| 219.37867800 | 5.26892700 | 0.00000000 | CLA |
| 218.12860900 | 17.61556600 | 0.00000000 | CLA |
| 216.60201000 | 30.34518200 | 0.00000000 | CLA |
| 214.78042700 | 43.44667100 | 0.00000000 | CLA |
| 212.64428600 | 56.90502000 | 0.00000000 | CLA |
| 210.17301200 | 70.70085100 | 0.00000000 | CLA |
| 207.34519000 | 84.80996300 | 0.00000000 | CLA |
| 204.13877400 | 99.20286700 | 0.00000000 | CLA |
| 200.53134900 | 113.84434200 | 0.00000000 | CLA |
| 196.50044400 | 128.69301600 | 0.00000000 | CLA |
| 192.02390600 | 143.70100000 | 0.00000000 | CLA |
| 187.08033200 | 158.81358700 | 0.00000000 | CLA |
| 181.64955800 | 173.96904400 | 0.00000000 | CLA |
| 175.71320100 | 189.09853000 | 0.00000000 | CLA |
| 169.25524900 | 204.12615200 | 0.00000000 | CLA |
| 162.26269100 | 218.96920100 | 0.00000000 | CLA |
| 154.72616300 | 233.53858800 | 0.00000000 | CLA |
| 146.64060400 | 247.73949500 | 0.00000000 | CLA |
| 138.00590000 | 261.47227200 | 0.00000000 | CLA |
| 128.82747700 | 274.63358000 | 0.00000000 | CLA |
| 119.11683100 | 287.11777800 | 0.00000000 | CLA |
| 108.89195400 | 298.81854400 | 0.00000000 | CLA |
| 98.17764100 | 309.63070300 | 0.00000000 | CLA |
| 87.00562600 | 319.45221900 | 0.00000000 | CLA |
| 75.41455000 | 328.18629200 | 0.00000000 | CLA |
| 63.44972800 | 335.74349800 | 0.00000000 | CLA |
| 51.16270500 | 342.04388900 | 0.00000000 | CLA |
| 38.61060800 | 347.01896200 | 0.00000000 | CLA |
| 25.85530400 | 350.61342700 | 0.00000000 | CLA |
| 12.96238300 | 352.78667200 | 0.00000000 | CLA |

An overall reflectivity of the projection optical unit 26 is approximately 8.49%.

The image field 8 has an x-extent of two-times 13 mm and a y-extent of 1 mm. The projection optical unit 26 is optimized for an operating wavelength of the illumination light 3 of 13.5 nm.

The stop AS of the projection optical unit 26 is once again arranged spatially between the penultimate mirror M9 in the beam path and the last mirror M10 in the beam path and delimits the system pupil fully circumferentially in the region of the imaging light partial beam $3_{M9M10}$. The stop AS is the sole stop for predefining the outer pupil marginal contour. The stop AS is embodied in a plane fashion in its entirety and lies in the stop plane $E_{AS}$ (cf. FIG. 14). The stop plane $E_{AS}$ forms an angle of approximately 55° with the image plane 9. An intersection line SL between the stop plane $E_{AS}$ and the image plane 9 runs in the region of the image field 8. The stop AS of the projection optical unit 26 also has a web section S between the imaging light partial beams $3_{M9M10}$ and $3_{M10W}$, which likewise lies in the plane $E_{AS}$ according to FIG. 14.

A further embodiment of a projection optical unit 27, which can be used in the projection exposure apparatus 1 according to FIG. 1 instead of the projection optical unit 7, is explained in the following text on the basis of FIGS. 16 to 20. Components and functions which have already been explained above in the context of FIGS. 1 to 15 are denoted, where applicable, by the same reference signs and are not discussed again in detail.

The mirrors M1 to M10 are once again configured as free-form surfaces for which the free-form surface equation (1) indicated above holds true.

The two tables below summarize the parameters "Maximum angle of incidence", "Extent of the reflection surface in the x-direction", "Extent of the reflection surface in the y-direction" and "Maximum mirror diameter" for the mirrors M1 to M10 of the projection optical unit 27.

|  | M1 | M2 | M3 | M4 | M5 |
|---|---|---|---|---|---|
| Maximum angle of incidence [°] | 13.2 | 81.1 | 78.2 | 82.5 | 82.1 |
| Extent of the reflection surface in the x-direction [mm] | 626.4 | 459.1 | 411.9 | 375.1 | 422.4 |
| Extent of the reflection surface in the y-direction [mm] | 258.8 | 310.4 | 381.0 | 315.7 | 304.6 |
| Maximum mirror diameter [mm] | 626.5 | 459.6 | 464.1 | 414.1 | 423.5 |

|  | M6 | M7 | M8 | M9 | M10 |
|---|---|---|---|---|---|
| Maximum angle of incidence [°] | 82.1 | 80.1 | 78.6 | 22.0 | 15.8 |
| Extent of the reflection surface in the x-direction [mm] | 439.4 | 420.9 | 365.3 | 389.8 | 699.5 |
| Extent of the reflection surface in the y-direction [mm] | 201.0 | 93.9 | 174.2 | 205.1 | 689.9 |
| Maximum mirror diameter [mm] | 439.4 | 420.9 | 365.3 | 389.9 | 700.6 |

The mirror M10 that predefines the image-side numerical aperture has the largest maximum mirror diameter, with a diameter of 700.6 mm. None of the other mirrors M1 to M9 has a maximum diameter that is greater than 630 mm. Eight of the ten mirrors, namely the mirrors M2 to M9, have a maximum mirror diameter that is less than 470 mm. Two of the ten mirrors, namely the mirrors M8 and M9, have a maximum mirror diameter that is less than 400 mm.

The optical design data of the projection optical unit 27 can be gathered from the following tables.

Table 1 additionally indicates the two imaging scales $\beta_x$, $\beta_y$ of the projection optical unit 27 in the xz-plane and in the yz-plane. The sign of the respective imaging scale $\beta$ indicates whether an image inversion takes place (negative sign) or not (positive sign). Table 1 for the embodiment according to FIG. 16 additionally indicates a maximum wavefront aberration rms over the image field of 6.5 mλ.

Figure 14:
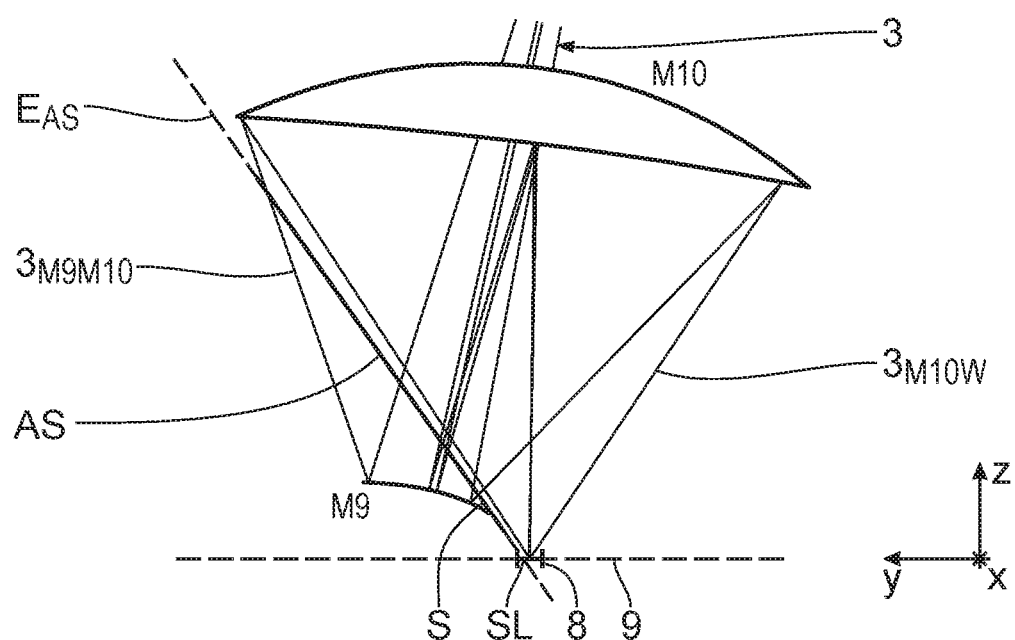
Figure 15:
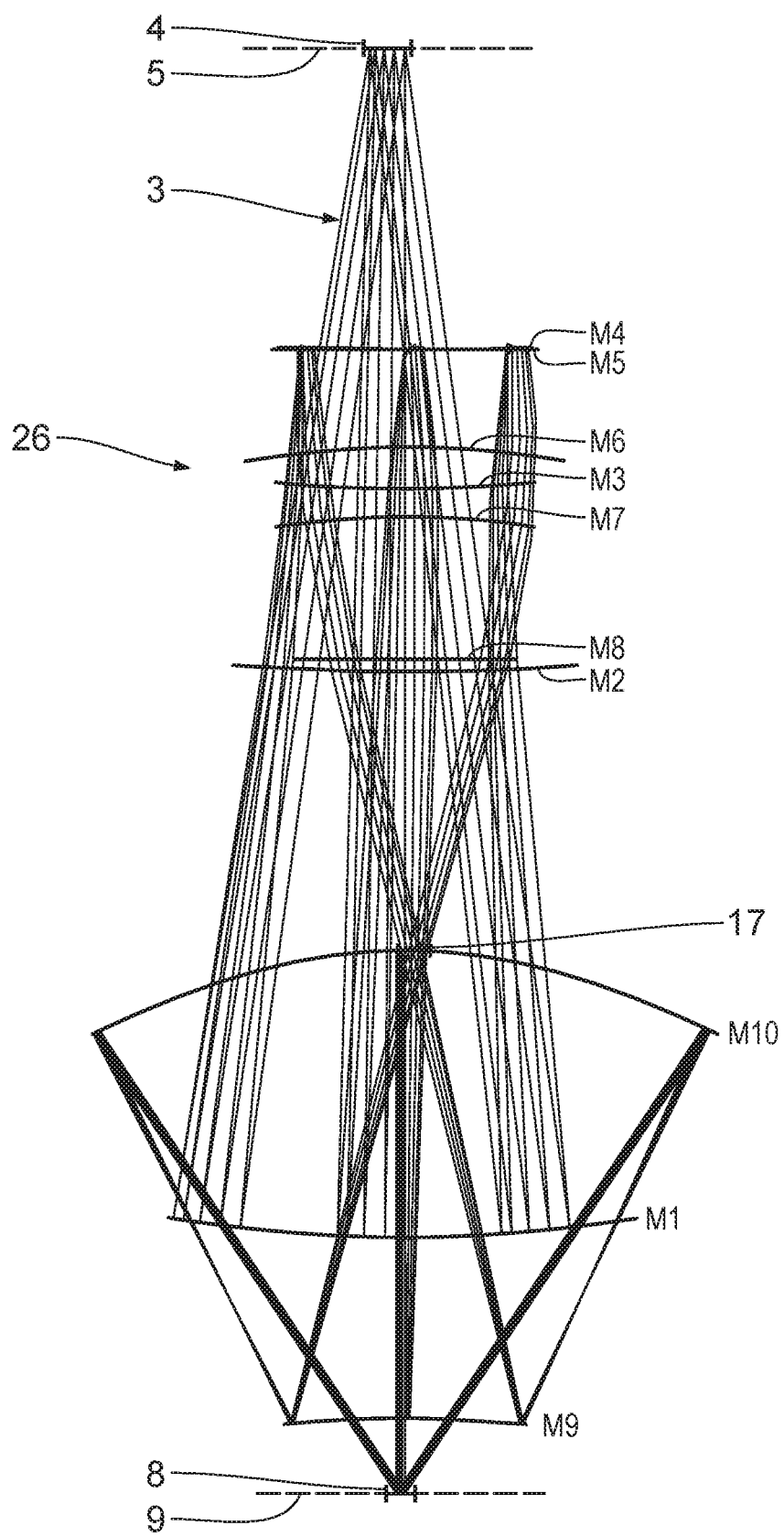

In a manner similar to that in the case of the embodiment according to FIGS. 13 to 15, the imaging optical unit 27 also has a stop AS that is arranged spatially between the penultimate mirror M9 in the imaging light beam path and the last mirror M10 in the imaging light beam path. The stop AS simultaneously serves as an aperture stop and as an obscuration stop. The stop AS shades the imaging light 3 during the effect as an aperture stop in the partial beam path $3_{M9M10}$. During the effect as an obscuration stop, the stop AS shades the imaging light 3 in an upstream partial beam path $3_{M8M9}$, that is to say the partial beam path between the antepenultimate or third from last mirror M8 and the penultimate mirror M9 of the imaging optical unit 27. Depending on whether the stop AS acts as an aperture stop or as an obscuration stop, the stop AS thus shades a different partial beam path of the imaging light 3.

The sixth table indicates a boundary of the stop AS as a polygon progression in local coordinates xyz, with indication of, on the one hand (type "CLA"), an outer aperture stop boundary and, on the other hand (type "OBS"), an inner obscuration stop boundary.

Figure 16:
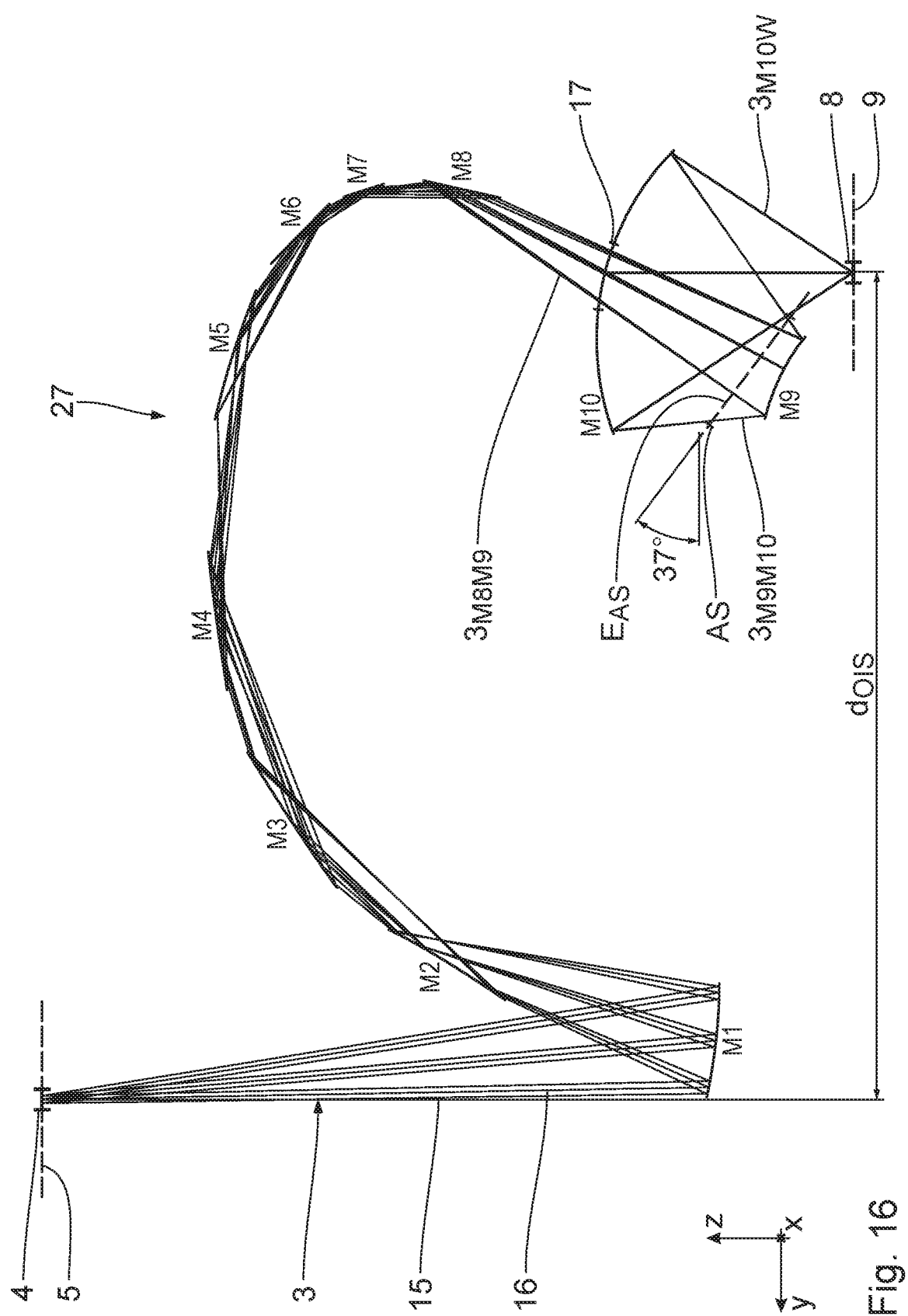
FIGS. 16 and 17 show illustrations similar to FIGS. 2 and 5 of a further embodiment of an imaging optical unit, usable as a projection lens in the projection exposure apparatus according to FIG. 1.
Figure 17:
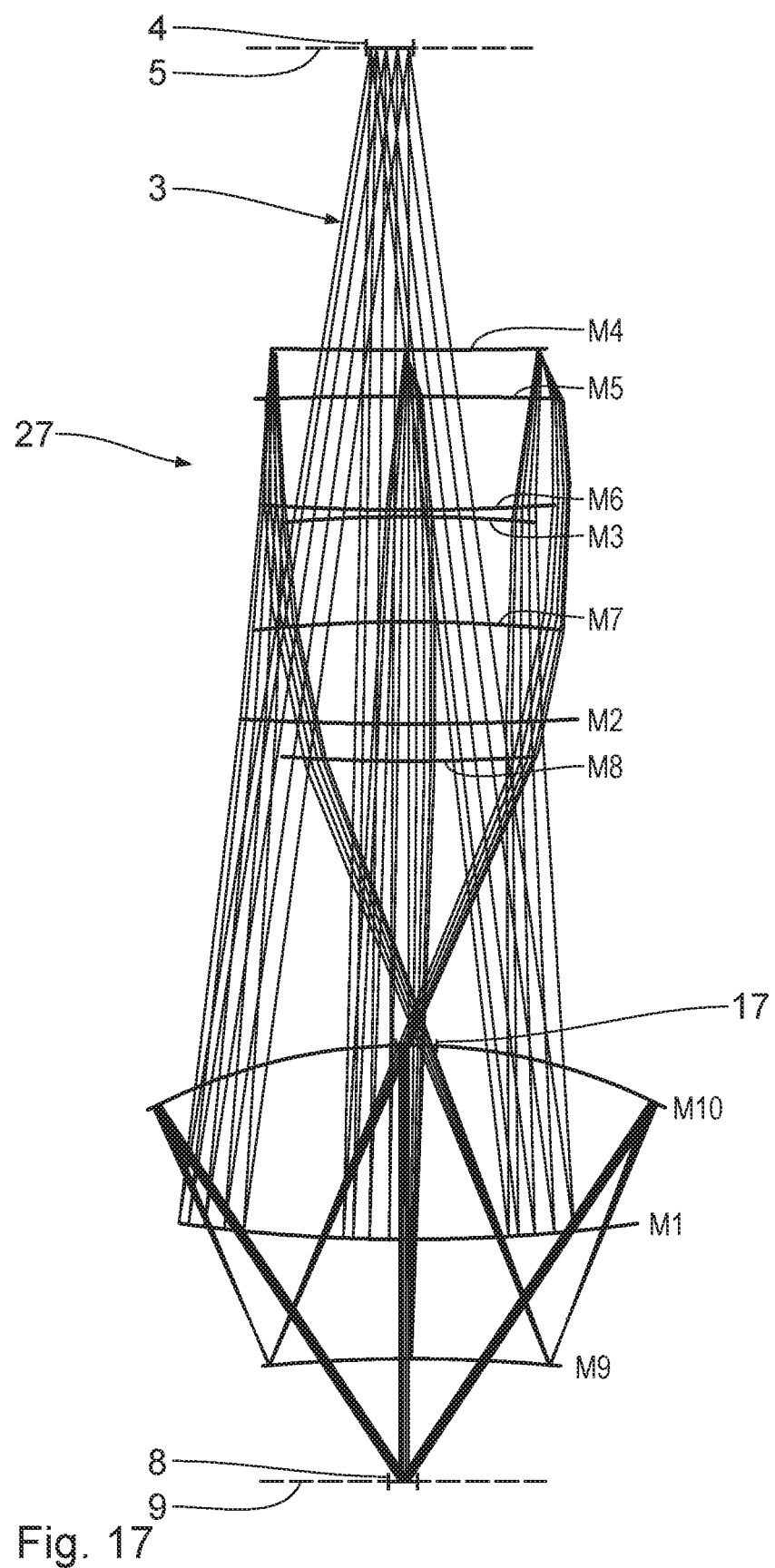
Figure 18:
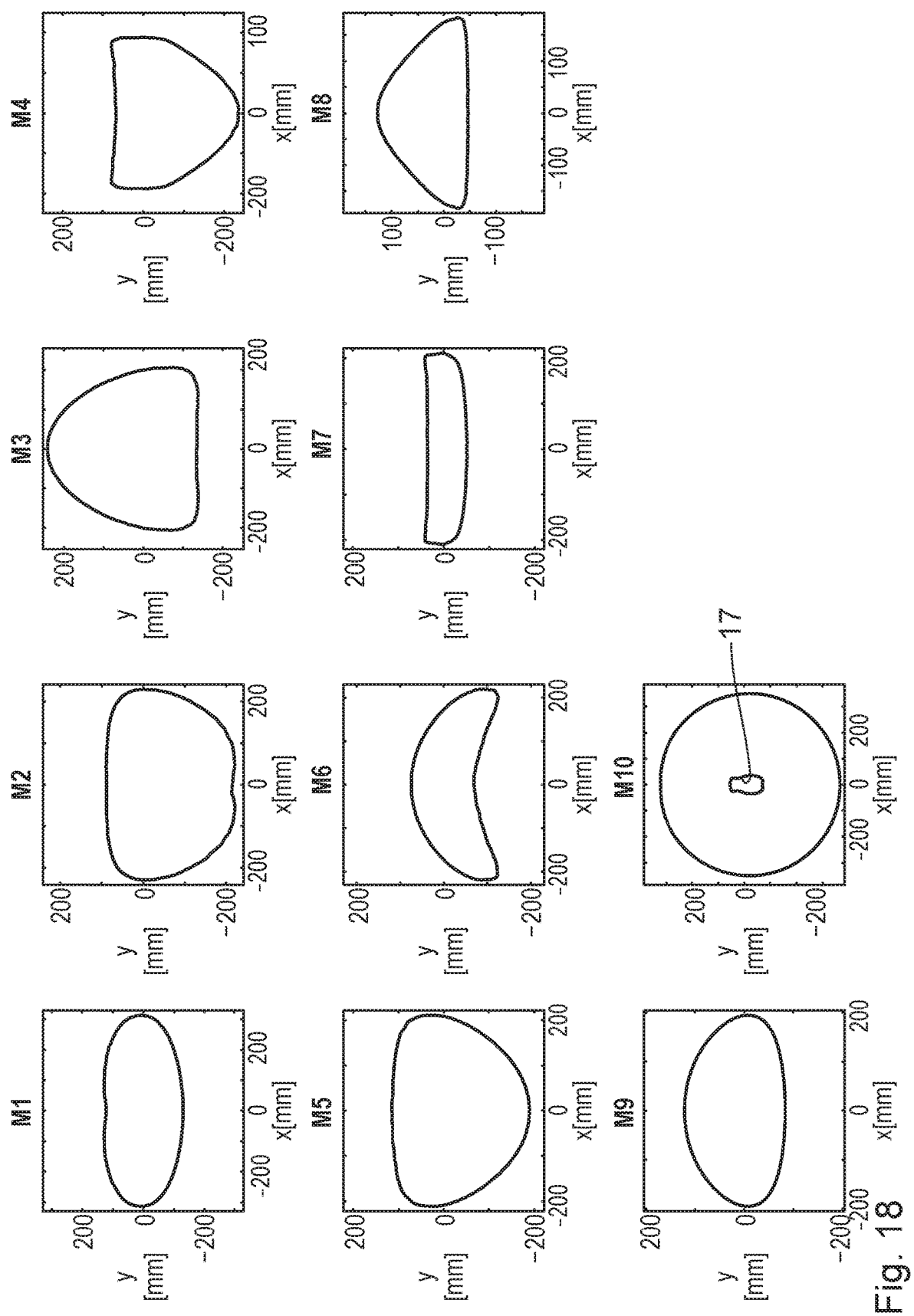
FIG. 18 shows in a plan view marginal contours of reflection surfaces impinged on in each case by the imaging light on the mirrors of the imaging optical unit according to FIGS. 16 and 17.

TABLE 1 for FIG. 16

| Exemplary embodiment | FIG. 16 |
|---|---|
| NA | 0.55 |
| Wavelength | 13.5 nm |
| marginal position x | 4.0 |
| marginal position y | −8.0 |
| Field dimension x | 26.0 mm |
| Field dimension y | 1.2 mm |
| Field curvature | −0.012345 1/mm |
| Rms | 6.5 ml |
| Stop | AS |

TABLE 2 for FIG. 16

| Surface | Radius_x[mm] | Power_x[1/mm] | Radius_y[mm] | Power_y[1/mm] | Operating |
|---|---|---|---|---|---|
| M10 | −734.4004894 | 0.0026410 | −657.0202697 | 0.0031390 | REFL |
| M9 | −12562.3978818 | 0.0001592 | 460.9714044 | −0.0043387 | REFL |
| M8 | −575.3229751 | 0.0009298 | 5791.7291983 | −0.0012911 | REFL |
| M7 | −606.8691199 | 0.0008524 | −3174.1309526 | 0.0024362 | REFL |
| M6 | −1436.3061494 | 0.0003090 | −11822.7733555 | 0.0007623 | REFL |
| M5 | −9362.1535679 | 0.0000472 | −1971.1259111 | 0.0045943 | REFL |
| M4 | 6861.0562164 | −0.0000649 | −3555.8466750 | 0.0025276 | REFL |
| M3 | 2563.4374143 | −0.0001911 | −4556.7426213 | 0.0017916 | REFL |
| M2 | 2144.5772392 | −0.0001956 | 1778.2511025 | −0.0053634 | REFL |
| M1 | −2250.8223229 | 0.0008710 | −1234.0328093 | 0.0016534 | REFL |

TABLE 3a for FIG. 16

| Coeffi- | M10 | M9 | M8 |
|---|---|---|---|
| KY | 0.00000000 | 0.00000000 | 0.00000000 |
| KX | 0.00000000 | 0.00000000 | 0.00000000 |
| RX | −734.40048940 | −12562.39788000 | −575.32297510 |
| C7 | 3.69063959e−08 | −1.24154160e−06 | 8.08885419e−07 |
| C9 | 2.66875657e−08 | 4.96623107e−07 | 6.65643923e−07 |
| C10 | 2.9547202e−11 | 7.16764893e−10 | 3.26524288e−10 |
| C12 | −1.23835916e−10 | 2.80108561e−10 | 5.2511967e−11 |
| C14 | −4.04124392e−11 | 8.30415899e−10 | 3.45807814e−09 |
| C16 | −4.94171988e−14 | 5.31867408e−13 | 1.86022203e−12 |
| C18 | 1.00169592e−13 | −1.86998622e−13 | 5.65074321e−12 |
| C20 | 6.59876526e−14 | 1.75493769e−11 | 2.90258207e−11 |
| C21 | −2.64924221e−17 | 7.39160615e−16 | 5.30674539e−16 |
| C23 | −2.87951218e−16 | 4.52997751e−15 | 2.2356219e−15 |
| C25 | −4.07410513e−16 | −2.93129363e−14 | 3.3142465e−14 |
| C27 | −9.34250924e−17 | 3.65825069e−14 | 2.51601087e−13 |
| C29 | −1.22857674e−19 | −1.03235642e−17 | 9.32984402e−18 |
| C31 | 9.80843812e−20 | 2.34402809e−17 | 5.36488954e−17 |
| C33 | 3.62733816e−19 | −7.87362284e−17 | 4.59915021e−16 |

TABLE 3a-continued for FIG. 16

| Coeffi- | M10 | M9 | M8 |
|---|---|---|---|
| C35 | 1.66523364e-19 | 1.74531656e-16 | 2.18402354e-15 |
| C36 | -2.16918403e-22 | 2.33698767e-22 | 6.89496337e-21 |
| C38 | -7.61751871e-22 | -5.69813915e-20 | -9.46720654e-21 |
| C40 | -1.64583614e-21 | 5.46056869e-20 | 4.20382245e-19 |
| C42 | -1.13822065e-21 | -3.30030364e-19 | 4.64308428e-18 |
| C44 | -2.34451904e-22 | 2.33237083e-18 | 1.85298325e-17 |
| C46 | 8.75776859e-26 | 5.70493913e-23 | -7.61314101e-23 |
| C48 | -4.00067035e-26 | -1.46948197e-22 | 5.19316088e-22 |
| C50 | 1.09288997e-24 | 1.03336009e-22 | 3.88873449e-21 |
| C52 | 1.1330853e-24 | -1.09551134e-20 | 3.16378948e-20 |
| C54 | 3.03020173e-25 | 1.25291997e-21 | 1.29630949e-19 |
| C55 | -3.58358372e-29 | 7.31506816e-26 | -3.09744226e-26 |
| C57 | -2.21538575e-27 | 7.81233903e-25 | 7.350488e-25 |
| C59 | -4.70796873e-27 | 4.91236495e-25 | 6.62741382e-24 |
| C61 | -5.96335162e-27 | 2.4312637e-23 | 2.49868147e-23 |
| C63 | -3.50703353e-27 | -1.43128106e-23 | 2.87275346e-22 |
| C65 | -6.99450709e-28 | -1.80452447e-23 | 6.5185382e-22 |
| C67 | -1.61117994e-30 | -1.84677697e-28 | 2.64420679e-27 |
| C69 | -1.16473081e-30 | 2.19286675e-27 | -7.15898772e-27 |
| C71 | -2.37008454e-31 | -3.33316033e-26 | 5.03624411e-26 |
| C73 | 3.00335849e-30 | 3.92884481e-26 | 9.04008197e-25 |
| C75 | 3.19629075e-30 | 2.1801091e-25 | 6.23218519e-24 |
| C77 | 7.65128241e-31 | 3.76183171e-25 | 2.7940315e-24 |
| C78 | -1.91587489e-33 | -6.53917767e-31 | -5.1401291e-31 |
| C80 | -6.3352757e-33 | -7.70691096e-30 | -1.30087901e-29 |
| C82 | -2.68605738e-32 | 2.72123325e-29 | 2.86409772e-29 |
| C84 | -4.03473776e-32 | -5.09790538e-29 | 1.12849703e-27 |
| C86 | -2.81045215e-32 | -6.57928887e-28 | 2.04737375e-26 |
| C88 | -8.65461633e-33 | -7.35194127e-28 | 8.31543064e-26 |
| C90 | -1.49793169e-33 | 1.85196124e-27 | 1.58129737e-26 |
| C92 | 4.53012982e-36 | -1.02285876e-33 | -4.93314114e-32 |
| C94 | 2.54612905e-36 | -3.6722778e-32 | 1.14717524e-31 |
| C96 | 1.70326511e-35 | 9.50345059e-32 | 2.57037531e-30 |
| C98 | 2.30381702e-35 | 1.08039148e-30 | 1.52877695e-29 |
| C100 | 1.27582326e-35 | -9.29374103e-32 | 1.79359716e-28 |
| C102 | -1.61856789e-36 | -8.25859184e-30 | 5.11599223e-28 |
| C104 | -7.47484269e-37 | -1.66224976e-30 | 7.80016027e-29 |
| C105 | 1.74529262e-39 | 3.09714859e-36 | 2.53274907e-35 |
| C107 | 5.88732768e-39 | 4.80419849e-35 | 3.82070681e-34 |
| C109 | 5.70551644e-38 | -2.17962248e-35 | -5.26183475e-34 |
| C111 | 9.34482358e-38 | -1.11472973e-33 | 1.87948261e-32 |
| C113 | 4.17320032e-38 | -4.45403337e-34 | 5.17877418e-32 |
| C115 | -4.20494195e-38 | 7.28326516e-33 | 5.42189824e-31 |
| C117 | -4.24589053e-38 | -1.29581947e-32 | 1.18221722e-30 |
| C119 | -4.39618163e-39 | -1.46429864e-32 | 1.65226721e-31 |
| C121 | -1.26480599e-41 | 0 | 0 |
| C123 | -2.83350034e-41 | 0 | 0 |
| C125 | -7.90818614e-41 | 0 | 0 |
| C127 | -7.59247942e-41 | 0 | 0 |
| C129 | 3.20227297e-41 | 0 | 0 |
| C131 | 1.13904543e-40 | 0 | 0 |
| C133 | 7.84876975e-41 | 0 | 0 |
| C135 | 1.6589155e-41 | 0 | 0 |
| C136 | -1.01570835e-44 | 0 | 0 |
| C138 | -1.10607557e-43 | 0 | 0 |
| C140 | -5.34690554e-43 | 0 | 0 |
| C142 | -1.25422813e-42 | 0 | 0 |
| C144 | -1.76071049e-42 | 0 | 0 |
| C146 | -1.35061054e-42 | 0 | 0 |
| C148 | -5.21059182e-43 | 0 | 0 |
| C150 | -7.02519947e-44 | 0 | 0 |
| C152 | -7.91158758e-45 | 0 | 0 |

TABLE 3b for FIG. 16

| Coeffi- | M7 | M6 | M5 |
|---|---|---|---|
| KY | 0.00000000 | 0.00000000 | 0.00000000 |
| KX | 0.00000000 | 0.00000000 | 0.00000000 |
| RX | -606.86911990 | -1436.30614900 | -9362.15356800 |
| C7 | 1.99960334e-07 | 1.57128053e-07 | -6.04832777e-08 |

TABLE 3b-continued for FIG. 16

| Coeffi- | M7 | M6 | M5 |
|---|---|---|---|
| C9 | 4.27141747e-07 | -3.34981946e-09 | -8.66725882e-08 |
| C10 | -4.96508598e-11 | -5.60920252e-10 | -5.19419734e-10 |
| C12 | -3.38689422e-10 | 9.43006288e-11 | 2.92728662e-10 |
| C14 | -1.80994732e-09 | -3.39581207e-10 | 9.5562028e-11 |
| C16 | 8.88853426e-13 | -8.74520619e-13 | -4.55344074e-13 |
| C18 | 5.45383685e-13 | 8.9652743e-13 | -5.63011302e-13 |
| C20 | 1.01953855e-11 | 2.52232581e-13 | 1.68302363e-13 |
| C21 | 2.2753959e-16 | 6.47555202e-16 | -6.64814497e-16 |
| C23 | -7.13626682e-16 | -1.32836218e-16 | -9.16606761e-16 |
| C25 | -1.87578681e-14 | 1.18754896e-15 | 2.23227763e-15 |
| C27 | -4.34450496e-14 | -1.10389387e-14 | 2.23964772e-15 |
| C29 | 5.19911313e-18 | 7.75824639e-19 | -5.59817103e-19 |
| C31 | 1.2379654e-17 | -1.94031366e-17 | -5.93474728e-18 |
| C33 | -6.38224202e-17 | 4.26085874e-17 | -1.41084199e-17 |
| C35 | 7.32954226e-16 | 5.92235543e-17 | -1.2803738e-17 |
| C36 | -1.69523033e-21 | -2.63128096e-21 | 1.48907853e-20 |
| C38 | -2.35620799e-20 | 5.31525209e-20 | 4.9858925e-21 |
| C40 | 1.73539713e-19 | -5.4304615e-20 | 1.61264378e-20 |
| C42 | -9.99259336e-19 | -1.5835119e-19 | 5.95552526e-20 |
| C44 | -7.42793604e-18 | -2.40811179e-19 | 4.03029095e-20 |
| C46 | -4.78484276e-24 | -9.252226e-23 | 1.9680316e-23 |
| C48 | 1.05986029e-22 | 1.97027352e-22 | -1.00547236e-23 |
| C50 | 6.79849158e-21 | 3.51758796e-22 | -1.91267262e-22 |
| C52 | -1.58604135e-22 | -1.34212548e-21 | -2.39856755e-22 |
| C54 | -2.88945615e-19 | -7.34510578e-21 | -4.65208006e-24 |
| C55 | 3.56030953e-26 | 5.34769718e-26 | -1.24196789e-25 |
| C57 | 1.44299981e-25 | -1.46733898e-25 | -1.39131389e-26 |
| C59 | -1.25039871e-24 | 8.94977481e-25 | 1.87925685e-25 |
| C61 | 3.79170632e-23 | 8.34824517e-24 | -4.61534248e-26 |
| C63 | -2.28394342e-22 | 3.96940469e-23 | -7.19198667e-25 |
| C65 | 7.9281819e-21 | 1.71260448e-23 | -9.4740782e-25 |
| C67 | -1.3085233e-28 | 1.25830166e-28 | -3.89993279e-28 |
| C69 | -2.38761271e-27 | -1.17222643e-26 | -7.7510706e-28 |
| C71 | -1.72469753e-25 | -8.06944964e-26 | 1.58629087e-28 |
| C73 | -9.96853074e-25 | -1.777645e-25 | 2.67086221e-27 |
| C75 | 4.0486111e-24 | 3.51749177e-25 | 3.02506968e-27 |
| C77 | 1.05436189e-22 | 8.60396189e-25 | -1.05267475e-27 |
| C78 | -3.33000529e-31 | 3.39100031e-31 | 6.99474964e-31 |
| C80 | -9.05678997e-31 | 1.36090632e-29 | -1.11788544e-30 |
| C82 | -1.68879173e-29 | 2.20044136e-28 | -5.43878014e-30 |
| C84 | -2.18032628e-27 | 1.03960723e-27 | 1.23660546e-29 |
| C86 | -4.36181405e-28 | -2.39900221e-28 | 5.48029981e-29 |
| C88 | -6.73559091e-26 | -7.22531169e-27 | 1.09865111e-28 |
| C90 | -3.69111464e-24 | -9.40283051e-27 | 5.64640637e-29 |
| C92 | 2.85489276e-33 | -4.0464514e-33 | 4.14302887e-33 |
| C94 | 1.88972554e-32 | -1.29123817e-31 | 8.05699222e-33 |
| C96 | 1.50455069e-30 | -1.69956303e-30 | -1.38058454e-32 |
| C98 | 2.25705081e-29 | -3.60111295e-30 | -1.61814701e-31 |
| C100 | 1.49931011e-28 | 8.18553152e-30 | -5.63634809e-31 |
| C102 | -3.16012215e-27 | 4.04642225e-29 | -7.51287066e-31 |
| C104 | 9.51596316e-27 | 3.61186108e-29 | -2.69646399e-31 |
| C105 | -1.29510753e-36 | -3.9496471e-36 | 6.76545884e-37 |
| C107 | -9.63058299e-37 | 5.41859042e-36 | 1.71209639e-35 |
| C109 | -9.48011591e-35 | 5.41090443e-34 | 8.84555232e-35 |
| C111 | 3.58236003e-32 | 3.85862042e-33 | 1.48083159e-34 |
| C113 | -2.64292004e-32 | 2.33823444e-33 | 6.79453681e-34 |
| C115 | 2.88402028e-30 | -2.47168085e-32 | 1.29842501e-33 |
| C117 | 3.81171481e-29 | -7.40994837e-32 | 1.39664061e-33 |
| C119 | 2.0730927e-28 | -4.85802094e-32 | 4.18556612e-34 |

TABLE 3c for FIG. 16

| Coeffi- | M4 | M3 | M2 |
|---|---|---|---|
| KY | 0.00000000 | 0.00000000 | 0.00000000 |
| KX | 0.00000000 | 0.00000000 | 0.00000000 |
| RX | 6861.05621600 | 2563.43741400 | 2144.57723900 |
| C7 | 1.47174165e-07 | -1.54543937e-08 | -2.02349511e-07 |
| C9 | 9.71264337e-08 | -1.3262412e-07 | -6.85116155e-07 |
| C10 | -4.29421164e-10 | 2.59981694e-10 | 1.08486268e-10 |
| C12 | -3.22000121e-12 | 1.26264564e-10 | 2.19370571e-10 |

TABLE 3c-continued for FIG. 16

| Coeffi- | M4 | M3 | M2 |
|---|---|---|---|
| C14 | 1.61657252e−11 | −3.08175659e−10 | 2.39600029e−09 |
| C16 | −9.11518252e−14 | −6.19660886e−13 | −1.93335656e−13 |
| C18 | −1.97539527e−13 | 3.79403726e−13 | 3.50480797e−13 |
| C20 | −3.10246067e−14 | −6.91098785e−13 | −8.84706639e−12 |
| C21 | −7.73697664e−16 | 1.20632123e−18 | 1.59763018e−16 |
| C23 | 2.62452743e−16 | 5.37789494e−16 | 2.23737227e−16 |
| C25 | −7.65808804e−18 | 8.58775544e−16 | −1.91043224e−15 |
| C27 | 1.0729483e−16 | −2.17568078e−15 | 3.41011771e−14 |
| C29 | 1.29228359e−19 | −5.15438214e−17 | −1.5173488e−18 |
| C31 | −1.56954396e−18 | −2.20721288e−18 | −1.81450703e−18 |
| C33 | −1.88777908e−19 | 2.70328561e−18 | 1.34327987e−17 |
| C35 | 1.09375115e−18 | −5.82231391e−18 | −1.35927823e−16 |
| C36 | 1.81284194e−20 | 3.29151135e−21 | −1.18313413e−21 |
| C38 | −1.31941357e−21 | 9.99987503e−22 | 1.21847818e−20 |
| C40 | 1.74075218e−21 | −1.20404474e−21 | 1.52570279e−20 |
| C42 | 5.21546896e−22 | 8.70959764e−21 | −1.07126011e−19 |
| C44 | −5.35455563e−21 | −1.7557778e−20 | 5.55501799e−19 |
| C46 | −1.62256468e−23 | −3.84578437e−24 | 3.0366606e−24 |
| C48 | −5.6305645e−24 | 4.55124425e−24 | −4.8303596e−23 |
| C50 | −3.24732012e−23 | −7.24135312e−24 | −8.75469222e−23 |
| C52 | −3.1476626e−23 | 3.61120405e−23 | 6.66706205e−22 |
| C54 | −8.25712315e−23 | −4.58224601e−23 | −2.83924503e−21 |
| C55 | −1.22035422e−25 | −3.61523663e−26 | 1.53678664e−26 |
| C57 | 2.1979079e−26 | 1.43276371e−26 | −1.45270248e−26 |
| C59 | −2.21460597e−25 | 3.97624231e−26 | 1.93243765e−25 |
| C61 | 1.40360697e−25 | 3.93632804e−26 | 6.56765218e−25 |
| C63 | 6.63180659e−26 | 1.60710475e−25 | −1.42738574e−24 |
| C65 | 1.16293011e−24 | −1.5094228e−25 | 1.86196799e−23 |
| C67 | 2.39452189e−28 | −5.95221041e−29 | 4.99747994e−30 |
| C69 | 2.11360977e−28 | 4.63199416e−29 | 3.8415391e−28 |
| C71 | 1.53493255e−27 | 2.12042836e−28 | −6.9991556e−28 |
| C73 | 1.73258825e−27 | −8.82768575e−29 | −6.92676904e−27 |
| C75 | 1.89943748e−27 | 2.05635818e−28 | −1.20583672e−26 |
| C77 | −6.78409159e−27 | −7.68900425e−28 | −1.03657365e−25 |
| C78 | −8.31622879e−31 | 4.38762936e−31 | −1.50485978e−31 |
| C80 | −4.12396608e−31 | 1.09189223e−31 | −6.7274722e−31 |
| C82 | 5.98730083e−30 | −1.2942667e−30 | −2.09103814e−30 |
| C84 | −3.91382918e−30 | −1.73477097e−30 | 4.71768609e−30 |
| C86 | −1.96586366e−29 | −2.08448538e−30 | 4.63042169e−29 |
| C88 | −1.26298975e−29 | 5.40127174e−31 | 1.00368421e−28 |
| C90 | 2.15725037e−29 | −2.97171076e−30 | 3.73712248e−28 |
| C92 | −7.71587297e−34 | 8.3168184e−34 | −1.65391189e−34 |
| C94 | −8.18026324e−34 | 6.44354839e−35 | −3.71718537e−33 |
| C96 | −2.23668044e−32 | −3.05694518e−33 | −1.10594865e−32 |
| C98 | −3.93915728e−32 | −1.65211987e−33 | −2.96793072e−32 |
| C100 | 5.00804831e−32 | −2.54387617e−33 | −1.51653474e−31 |
| C102 | 2.64483916e−32 | 8.11204174e−33 | −2.90810312e−31 |
| C104 | −3.59102851e−32 | −6.83029173e−33 | −7.51639723e−31 |
| C105 | 1.5481755e−35 | −3.17144487e−36 | 8.04711407e−37 |
| C107 | 3.7039998e−36 | −4.20690395e−36 | 8.17820926e−36 |
| C109 | −5.90401086e−35 | 8.72773964e−36 | 3.28218214e−35 |
| C111 | 9.78370689e−35 | 2.19860758e−35 | 5.9280879e−35 |
| C113 | 2.25712946e−34 | 2.25057433e−35 | 6.28444259e−35 |
| C115 | −1.78901202e−35 | 1.48798494e−35 | 1.91142178e−34 |
| C117 | −1.50146406e−35 | 1.98990075e−35 | 3.09789778e−34 |
| C119 | 2.41265654e−35 | −8.37356178e−36 | 6.40868585e−34 |

TABLE 3d for FIG. 16

| Coefficient | M1 |
|---|---|
| KY | 0.00000000 |
| KX | 0.00000000 |
| RX | −2250.82232300 |
| C7 | −4.47155696e−08 |
| C9 | −8.34709137e−08 |
| C10 | −9.51355472e−12 |
| C12 | 1.84572916e−11 |
| C14 | 6.91893219e−11 |
| C16 | −1.01331703e−14 |
| C18 | −5.03659529e−14 |

TABLE 3d-continued for FIG. 16

| Coefficient | M1 |
|---|---|
| C20 | 6.81027324e−13 |
| C21 | −4.12139115e−18 |
| C23 | −5.96632077e−19 |
| C25 | −1.67854518e−16 |
| C27 | −3.26198923e−15 |
| C29 | −1.23539866e−20 |
| C31 | −1.01642369e−19 |
| C33 | 2.08707523e−18 |
| C35 | 1.35676632e−17 |
| C36 | 5.2487886e−24 |
| C38 | −2.59100948e−23 |
| C40 | 1.50895827e−21 |
| C42 | −2.04328939e−21 |
| C44 | −8.18228919e−21 |
| C46 | 1.9037731e−26 |
| C48 | 1.81860592e−24 |
| C50 | 3.86233996e−24 |
| C52 | 2.94340802e−23 |
| C54 | −2.45607103e−22 |
| C55 | −6.02718749e−29 |
| C57 | −1.58630158e−28 |
| C59 | −1.13966571e−26 |
| C61 | −3.93947663e−26 |
| C63 | 3.90241817e−26 |
| C65 | 1.32487977e−24 |
| C67 | 1.93153235e−32 |
| C69 | −1.324697e−29 |
| C71 | −6.67848073e−29 |
| C73 | −2.28671694e−28 |
| C75 | −1.06954529e−27 |
| C77 | 4.01723503e−27 |
| C78 | 3.44314733e−34 |
| C80 | 4.61934621e−33 |
| C82 | 9.7553163e−32 |
| C84 | 7.08087843e−31 |
| C86 | 3.48735757e−30 |
| C88 | 3.05193351e−30 |
| C90 | −3.77785192e−29 |
| C92 | −3.87662297e−37 |
| C94 | 4.38344066e−35 |
| C96 | 4.33488416e−34 |
| C98 | 1.30804231e−33 |
| C100 | 4.57893447e−33 |
| C102 | 2.45658352e−32 |
| C104 | −3.68415437e−34 |
| C105 | −9.00084302e−40 |
| C107 | −2.62614251e−38 |
| C109 | −3.8585807e−37 |
| C111 | −3.27892795e−36 |
| C113 | −1.32806263e−35 |
| C115 | −7.94200305e−35 |
| C117 | −8.71651492e−35 |
| C119 | 3.41812727e−34 |

TABLE 4a for FIG. 16

| Surface | DCX | DCY | DCZ |
|---|---|---|---|
| Image | 0.00000000 | 0.00000000 | 0.00000000 |
| M10 | 0.00000000 | 0.00000000 | 598.57071024 |
| AS | 0.00000000 | 202.29481132 | 222.08172673 |
| M9 | 0.00000000 | 231.66148179 | 167.42769065 |
| M8 | −0.00000000 | −207.63742504 | 984.08231388 |
| M7 | −0.00000000 | −198.51055106 | 1174.06780570 |
| M6 | −0.00000000 | −106.26479039 | 1317.59235964 |
| M5 | −0.00000000 | 160.17552127 | 1481.68299334 |
| M4 | −0.00000000 | 753.93262524 | 1545.23844995 |
| M3 | −0.00000000 | 1366.71155383 | 1326.97530031 |
| M2 | 0.00000000 | 1630.05529066 | 1034.85014372 |

TABLE 4a-continued for FIG. 16

| Surface | DCX | DCY | DCZ |
|---|---|---|---|
| M1 | 0.00000000 | 1856.46963860 | 330.67373023 |
| Object | −0.00000000 | 1998.82967814 | 1957.85225693 |

TABLE 4b for FIG. 16

| Surface | TLA[deg] | TLB[deg] | TLC[deg] |
|---|---|---|---|
| Image | −0.00000000 | 0.00000000 | −0.00000000 |
| M10 | 14.12499901 | 0.00000000 | −0.00000000 |
| AS | 36.95215262 | 180.00000000 | 0.00000000 |
| M9 | 208.26345756 | 0.00000000 | −0.00000000 |
| M8 | 102.76327555 | 0.00000000 | 0.00000000 |
| M7 | 72.26003214 | −0.00000000 | −0.00000000 |
| M6 | 44.44889698 | −0.00000000 | −0.00000000 |
| M5 | 18.86850591 | −0.00000000 | −0.00000000 |
| M4 | −6.74776434 | −0.00000000 | −0.00000000 |
| M3 | −33.78564218 | −0.00000000 | −0.00000000 |
| M2 | −60.07095714 | 0.00000000 | −0.00000000 |
| M1 | 186.41209027 | 0.00000000 | −0.00000000 |
| Object | −0.00001275 | −0.00000000 | −0.00000000 |

TABLE 5 for FIG. 16

| Surface | Angle of incidence[deg] | Reflectivity |
|---|---|---|
| M10 | 14.12499901 | 0.64240969 |
| M9 | 0.01345953 | 0.66565923 |
| M8 | 74.48635845 | 0.79498205 |
| M7 | 75.01039813 | 0.80405884 |
| M6 | 77.17846671 | 0.83874066 |
| M5 | 77.24114222 | 0.83968118 |
| M4 | 77.14258753 | 0.83820081 |
| M3 | 75.81953462 | 0.81751767 |
| M2 | 77.89515042 | 0.84931075 |
| M1 | 11.41210302 | 0.65108552 |
| Overall transmis- | | 0.0729 |

TABLE 6 for FIG. 16: Stop polygon AS in the imaging beam path between M9 and M10

| X[mm] | Y[mm] | Z[mm] | Type |
|---|---|---|---|
| 0.000000 | 195.347128 | 0.000000 | CLA |
| −42.137103 | 191.039534 | 0.000000 | CLA |
| −82.205613 | 178.570519 | 0.000000 | CLA |
| −118.439996 | 159.196693 | 0.000000 | CLA |
| −149.574372 | 134.707339 | 0.000000 | CLA |
| −174.881008 | 107.089977 | 0.000000 | CLA |
| −194.075160 | 78.230577 | 0.000000 | CLA |
| −207.161234 | 49.709932 | 0.000000 | CLA |
| −214.296520 | 22.713209 | 0.000000 | CLA |
| −215.716174 | −1.969968 | 0.000000 | CLA |
| −211.722455 | −23.895460 | 0.000000 | CLA |
| −202.711588 | −42.897786 | 0.000000 | CLA |
| −189.203024 | −59.021423 | 0.000000 | CLA |
| −171.843764 | −72.451749 | 0.000000 | CLA |
| −151.375243 | −83.447357 | 0.000000 | CLA |
| −128.567630 | −92.281415 | 0.000000 | CLA |
| −104.141000 | −99.200076 | 0.000000 | CLA |
| −78.697779 | −104.400439 | 0.000000 | CLA |
| −52.685218 | −108.024919 | 0.000000 | CLA |
| −26.395569 | −110.165919 | 0.000000 | CLA |
| 0.000000 | −110.874228 | 0.000000 | CLA |
| 26.395569 | −110.165919 | 0.000000 | CLA |
| 52.685218 | −108.024919 | 0.000000 | CLA |
| 78.697779 | −104.400439 | 0.000000 | CLA |
| 104.141000 | −99.200076 | 0.000000 | CLA |
| 128.567630 | −92.281415 | 0.000000 | CLA |
| 151.375243 | −83.447357 | 0.000000 | CLA |
| 171.843764 | −72.451749 | 0.000000 | CLA |
| 189.203024 | −59.021423 | 0.000000 | CLA |
| 202.711588 | −42.897786 | 0.000000 | CLA |
| 211.722455 | −23.895460 | 0.000000 | CLA |
| 215.716174 | −1.969968 | 0.000000 | CLA |
| 214.296520 | 22.713209 | 0.000000 | CLA |
| 207.161234 | 49.709932 | 0.000000 | CLA |
| 194.075160 | 78.230577 | 0.000000 | CLA |
| 174.881008 | 107.089977 | 0.000000 | CLA |
| 149.574372 | 134.707339 | 0.000000 | CLA |
| 118.439996 | 159.196693 | 0.000000 | CLA |
| 82.205613 | 178.570519 | 0.000000 | CLA |
| 42.137103 | 191.039534 | 0.000000 | CLA |
| 0.000000 | 26.092784 | 0.000000 | OBS |
| −6.279154 | 25.735734 | 0.000000 | OBS |
| −12.386749 | 24.677462 | 0.000000 | OBS |
| −18.157185 | 22.955801 | 0.000000 | OBS |
| −23.436432 | 20.631201 | 0.000000 | OBS |
| −28.086992 | 17.783133 | 0.000000 | OBS |
| −31.991969 | 14.505604 | 0.000000 | OBS |
| −35.058106 | 10.902221 | 0.000000 | OBS |
| −37.217730 | 7.081254 | 0.000000 | OBS |
| −38.429615 | 3.151068 | 0.000000 | OBS |
| −38.678827 | −0.783773 | 0.000000 | OBS |
| −37.975684 | −4.625572 | 0.000000 | OBS |
| −36.353951 | −8.285669 | 0.000000 | OBS |
| −33.868462 | −11.685750 | 0.000000 | OBS |
| −30.592343 | −14.758415 | 0.000000 | OBS |
| −26.614036 | −17.447155 | 0.000000 | OBS |
| −22.034328 | −19.705924 | 0.000000 | OBS |
| −16.963532 | −21.498470 | 0.000000 | OBS |
| −11.518961 | −22.797594 | 0.000000 | OBS |
| −5.822745 | −23.584440 | 0.000000 | OBS |
| 0.000000 | −23.847938 | 0.000000 | OBS |
| 5.822745 | −23.584440 | 0.000000 | OBS |
| 11.518961 | −22.797594 | 0.000000 | OBS |
| 16.963532 | −21.498470 | 0.000000 | OBS |
| 22.034328 | −19.705924 | 0.000000 | OBS |
| 26.614036 | −17.447155 | 0.000000 | OBS |
| 30.592343 | −14.758415 | 0.000000 | OBS |
| 33.868462 | −11.685750 | 0.000000 | OBS |
| 36.353951 | −8.285669 | 0.000000 | OBS |
| 37.975684 | −4.625572 | 0.000000 | OBS |
| 38.678827 | −0.783773 | 0.000000 | OBS |
| 38.429615 | 3.151068 | 0.000000 | OBS |
| 37.217730 | 7.081254 | 0.000000 | OBS |
| 35.058106 | 10.902221 | 0.000000 | OBS |
| 31.991969 | 14.505604 | 0.000000 | OBS |
| 28.086992 | 17.783133 | 0.000000 | OBS |
| 23.436432 | 20.631201 | 0.000000 | OBS |
| 18.157185 | 22.955801 | 0.000000 | OBS |
| 12.386749 | 24.677462 | 0.000000 | OBS |
| 6.279154 | 25.735734 | 0.000000 | OBS |

An overall reflectivity of the projection optical unit 27 is approximately 7.29%.

The image field 8 has an x-extent of 2×13 mm and a y-extent of 1.2 mm. The projection optical unit 27 is optimized for an operating wavelength of the illumination light 3 of 13.5 nm.

The stop AS of the projection optical unit 27, with its aperture stop boundary 28 (cf. FIG. 20, for example), delimits fully circumferentially the system pupil of the projection optical unit 27 in the region of the imaging light partial beam $3_{M9M10}$. The stop AS is the sole stop for predefining the outer pupil marginal contour. The stop AS is embodied in a plane fashion in its entirety and lies in a stop plane $E_{AS}$ (cf. FIG. 16). The stop plane $E_{AS}$ forms an angle of approximately 37° with the image plane 9. The angle deviates only insignificantly from a tilting angle of the mirror M9 about the x-axis relative to the image plane 9.

Figure 19:
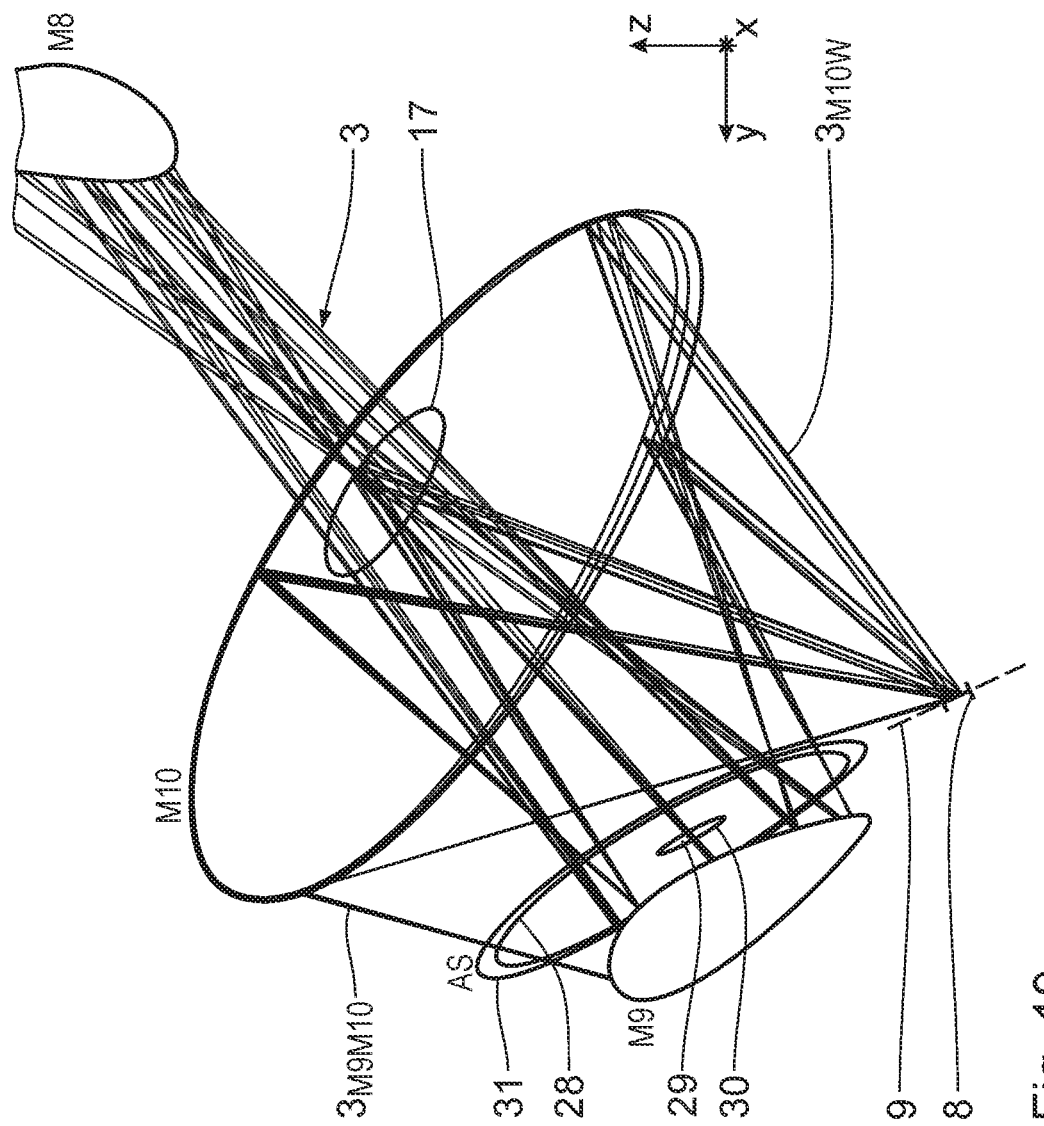
FIG. 19 shows in perspective view an excerpt from the imaging optical unit according to FIGS. 16 and 17 in the region of the last three image-side mirrors in an imaging light beam path.
Figure 20:
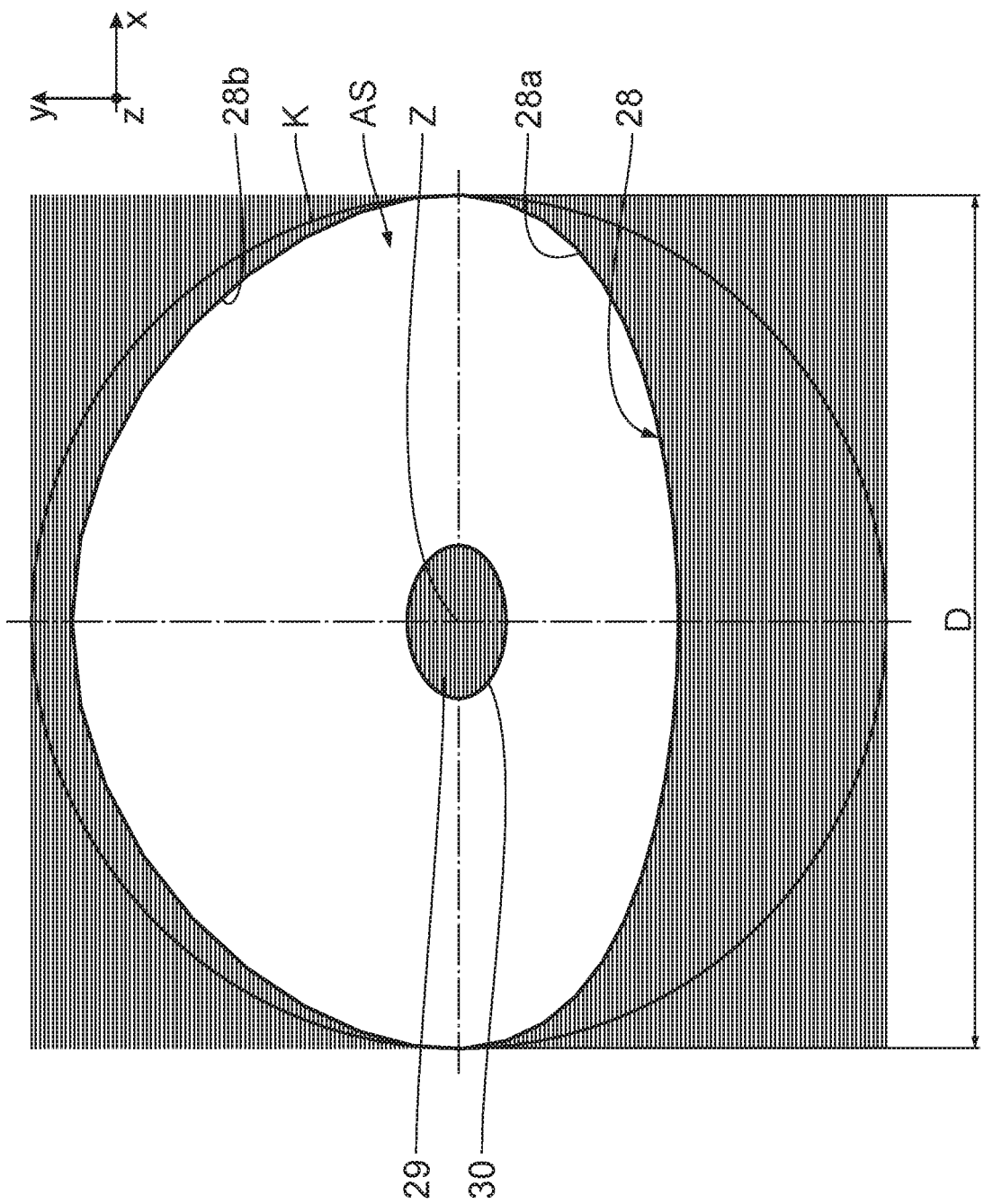
FIG. 20 shows an enlarged plan view of an aperture and obscuration stop of the imaging optical unit according to FIGS. 16, 17 and 19, which is arranged spatially between the penultimate mirror in the beam path and the last mirror in the beam path.

FIG. 19 illustrates a spatial arrangement of the stop AS between the mirrors M9 and M10. A central obscuration region 29 of the stop AS having the obscuration stop boundary 30 is carried by web or wire structures (not illustrated in the drawing) via an outer ring region 31 of the stop AS. Alternatively, the central obscuration region 29 can be carried by a holding structure (not illustrated in the drawing) that is supported on the adjacent mirror M9 and is carried by the latter. A corresponding holding structure proceeding from the mirror M9 can lie completely in the imaging light shadow of the central obscuration region 29, such that the holding structure does not shade the imaging light 3 in an undesired manner.

In accordance with an outer beam cross section of the imaging light partial beam $3_{M9M10}$, the aperture stop boundary is not embodied mirror-symmetrically in relation to the local xz-plane of the stop AS, but rather, where the stop AS is closest adjacent to the imaging light partial beam $3_{M10W}$, is embodied such that it is flatter in an aperture stop boundary section 28a than in an opposite aperture stop boundary section 28b. In the aperture stop boundary section 28b remote from the imaging light partial beam $3_{M10W}$, the aperture stop boundary 28 has an approximately circular profile. For clarification purposes, the aperture stop boundary 28 is inscribed in a circle K in FIG. 20. A midpoint of the circle K coincides with a center Z of the central obscuration region 29 of the stop AS. A maximum diameter D of the aperture stop boundary 28, the maximum diameter running in the x-direction, corresponds to the circle diameter.

An object-side chief ray angle is 5.1° in the case of the projection optical unit 27. A pupil obscuration of the projection optical unit 27 is 19% of the numerical aperture of the projection optical unit 27. Hence, a surface portion of $0.19^2$ of a pupil of the projection optical unit 27 is obscured. An object-image offset $d_{OIS}$ is approximately 2000 mm. The mirrors of the projection optical unit 27 can be accommodated in a parallelepiped having xyz-edge lengths of 699 mm×2275 mm×1434 mm.

The object plane 5 runs parallel to the image plane 9.

A working distance between the mirror M9 closest to the wafer and the image plane 9 is 121 mm.

The mirrors M1, M5, M6, M7 and M10 have negative radius values, that is to say in principle are concave mirrors. The mirror M2 has positive radius values, that is to say in principle is a convex mirror. The further mirrors M3, M4, M8 and M9 have different signs with regard to their x- and y-radius values, that is to say have a saddle surface basic shape.

A mirror sequence with regard to an angle of incidence classification (N:NI mirror; G:GI mirror) is NGGGGGGGNN in the case of the mirrors M1 to M10 of the projection optical unit 27. A sequence of deflecting effects for the imaging light chief ray of a central field point (L: Deflection effect in the clockwise direction; R: Deflection effect in the counterclockwise direction) is LRRRRRR-ROR in the case of the mirrors M1 to M10 of the projection optical unit 27. The GI mirrors M2 to M8 thus all have the same orientation of their deflecting effect.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

The invention claimed is:

1. An imaging optical unit having a pupil, the imaging optical unit comprising:
    a plurality of mirrors configured to image an object field in an object plane into an image field in an image plane with imaging light guided along a path from the object field to the image field; and
    a stop configured to for predefine a section of an outer marginal contour of a pupil of the imaging optical unit, wherein:
        the plurality of mirrors comprises a penultimate mirror in the path and a last mirror in the path;
        the penultimate mirror is without an opening to pass the imaging light;
        the stop is in the path between the penultimate mirror and the last mirror; and
        the stop is configured to delimit an outer marginal contour of the pupil in more than one plane.

2. The imaging optical unit of claim 1, wherein the last mirror has an opening to pass the imaging light.

3. The imaging optical unit of claim 2, wherein the stop is configured to cover the outer marginal contour of the pupil in an azimuth range around a center of the pupil that is greater than 180°.

4. The imaging optical unit of claim 3, wherein the imaging optical unit comprises exactly one stop configured to predefine the complete outer marginal contour of the pupil.

5. The imaging optical unit of claim 4, wherein at least sections of the stop are planar.

6. The imaging optical unit of claim 5, wherein a marginal contour of the stop has a three-dimensional profile.

7. The imaging optical unit of claim 6, wherein the stop has a bent topography.

8. The imaging optical unit of claim 1, wherein the stop is configured to cover the outer marginal contour of the pupil in an azimuth range around a center of the pupil that is greater than 180°.

9. The imaging optical unit of claim 1, wherein the imaging optical unit comprises exactly one stop configured to predefine the complete outer marginal contour of the pupil.

10. The imaging optical unit of claim 1, wherein at least sections of the stop are planar.

11. The imaging optical unit of claim 1, wherein a marginal contour of the stop has a three-dimensional profile.

12. The imaging optical unit of claim 1, wherein the stop has a bent topography.

13. An optical system, comprising:
    an imaging optical unit according to claim 1; and
    an illumination optical unit configured to illuminate the object field with the imaging light.

14. An optical system, comprising:
    an imaging optical unit according to claim 1; and
    a wafer holder configured to displace a wafer along a first direction,
    wherein, in a second direction perpendicular to the first direction, the stop delimits both extreme marginal positions of the outer marginal contour of the pupil.

15. An apparatus, comprising:
an EUV light source;
an imaging optical unit according to claim 1; and
an illumination optical unit configured to illuminate the object field with the imaging light.

16. An apparatus, comprising:
an EUV light source;
an imaging optical unit according to claim 1; and
a wafer holder configured to displace a wafer along a first direction,
wherein, in a second direction perpendicular to the first direction, the stop delimits both extreme marginal positions of the outer marginal contour of the pupil.

17. A method, comprising:
illuminating a structure of a reticle with EUV light; and
using an imaging optical unit according to claim 1 to project the illuminated structure of the reticle onto a light-sensitive material.

18. An imaging optical unit having a pupil and an entrance pupil, the imaging optical unit comprising:
a plurality of mirrors configured to image an object field in an object plane into an image field in an image plane with imaging light guided along a path from the object field to the image field; and
a stop configured to predefine a section of an outer marginal contour of the pupil,
wherein:
the imaging optical unit comprises a penultimate mirror in the path and a last mirror in the path;
the penultimate mirror is without an opening to pass the imaging light;
the stop is in the path between the penultimate mirror and the last mirror; and
the entrance pupil is upstream of the object field.

19. An optical system, comprising:
an imaging optical unit according to claim 18; and
an illumination optical unit configured to illuminate the object field with the imaging light.

20. An optical system, comprising:
an imaging optical unit according to claim 18; and
a wafer holder configured to displace a wafer along a first direction,
wherein, in a second direction perpendicular to the first direction, the stop delimits both extreme marginal positions of the outer marginal contour of the pupil.

* * * * *

UNITED STATES PATENT AND TRADEMARK OFFICE
CERTIFICATE OF CORRECTION

PATENT NO. : 10,527,832 B2
APPLICATION NO. : 15/816325
DATED : January 7, 2020
INVENTOR(S) : Markus Schwab and Hans-Juergen Rostalski Page 1 of 1

It is certified that error appears in the above-identified patent and that said Letters Patent is hereby corrected as shown below:

In the Claims

Column 72, Line 16, Claim 1, after "to" delete "for".

Signed and Sealed this
Twelfth Day of May, 2020

Andrei Iancu
*Director of the United States Patent and Trademark Office*